(12) United States Patent
Han et al.

(10) Patent No.: US 11,974,426 B2
(45) Date of Patent: Apr. 30, 2024

(54) SEMICONDUCTOR DEVICE HAVING TRANSISTOR DEVICE OF THREE-DIMENSIONAL STRUCTURE

(71) Applicant: SK hynix Inc., Icheon-si (KR)

(72) Inventors: Jae Hyun Han, Icheon-si (KR); Dong Ik Suh, Icheon-si (KR); Jae Gil Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 215 days.

(21) Appl. No.: 17/200,057

(22) Filed: Mar. 12, 2021

(65) Prior Publication Data
US 2022/0122980 A1 Apr. 21, 2022

(30) Foreign Application Priority Data
Oct. 16, 2020 (KR) .................. 10-2020-0134536

(51) Int. Cl.
*H01L 29/78* (2006.01)
*H10B 12/00* (2023.01)

(52) U.S. Cl.
CPC ....... *H10B 12/315* (2023.02); *H10B 12/0335* (2023.02); *H10B 12/056* (2023.02); *H10B 12/482* (2023.02)

(58) Field of Classification Search
CPC .............. H10B 12/315; H10B 12/0335; H10B 12/056; H10B 12/482; H10B 12/05; H10B 12/01; H10B 12/03; H10B 12/30; H01L 29/78642; H01L 29/7827
See application file for complete search history.

(56) References Cited

U.S. PATENT DOCUMENTS

| | | | | |
|---|---|---|---|---|
| 6,882,556 B2 * | 4/2005 | Fuhrmann | ......... | H10B 12/0383 257/E21.655 |
| 7,321,146 B2 * | 1/2008 | Yun | ................... | H10B 12/0335 257/306 |
| 7,453,103 B2 | 11/2008 | Abbott et al. | | |
| 9,177,947 B2 * | 11/2015 | Fujimoto | ............. | H10B 12/395 |
| 2006/0022256 A1 * | 2/2006 | Lee | ......................... | H01L 28/91 257/E21.582 |
| 2020/0111800 A1 * | 4/2020 | Ramaswamy | ......... | H10B 53/30 |

FOREIGN PATENT DOCUMENTS

KR 20130075348 A 7/2013

* cited by examiner

*Primary Examiner* — Shouxiang Hu

(57) ABSTRACT

A semiconductor device includes a substrate, a bit line conductive layer disposed on the substrate and extending in a first lateral direction substantially parallel to a surface of the substrate, first and second channel structures disposed on the bit line conductive layer to be spaced apart from each other in the first lateral direction, first and second gate dielectric layers disposed on side surfaces of the first and second channel structures over the substrate, first and second gate line conductive layers disposed on the first and second gate dielectric layers, respectively, the first and second gate line conductive layers common to the first and second channel structures, respectively, and extending in a second lateral direction perpendicular to the first lateral direction and substantially parallel to the surface of the substrate, and first and second storage node electrode layers disposed over the first and second channel structures, respectively.

7 Claims, 54 Drawing Sheets

SEMICONDUCTOR DEVICE HAVING TRANSISTOR DEVICE OF THREE-DIMENSIONAL STRUCTURE

CROSS-REFERENCE TO RELATED APPLICATIONS

The present application claims priority under 35 U.S.C. § 119(a) to Korean Application No. 10-2020-0134536, filed on Oct. 16, 2020, which is incorporated herein by reference in its entirety.

BACKGROUND

1. Technical Field

The present disclosure generally relates to a semiconductor device and, more particularly, to a semiconductor device having a transistor device with a three-dimensional structure.

2. Related Art

Recently, a semiconductor device having a three-dimensional structure deviating from a planar structure has been studied. The semiconductor device having a three-dimensional structure can effectively respond to a demand from the industry for a decrease in design rules and an increase in integration degree. In particular, in the field of memory devices requiring high integration and high capacity, research on the three-dimensional structures has been actively conducted.

SUMMARY

A semiconductor device according to an aspect of the present disclosure may include a substrate; a bit line conductive layer disposed on the substrate and extending in a first lateral direction substantially parallel to a surface of the substrate; first and second channel structures disposed on the bit line conductive layer to be spaced apart from each other in the first lateral direction; first and second gate dielectric layers disposed on side surfaces of the first and second channel structures over the substrate; first and second gate line conductive layers disposed on the first and second gate dielectric layers, respectively, the first and second gate line conductive layers common to the first and second channel structures in the first lateral direction, respectively, and extending in a second lateral direction that is perpendicular to the first lateral direction and that is substantially parallel to the surface of the substrate; and first and second storage node electrode layers disposed over the first and second channel structures, respectively. The first and second storage node electrode layers are disposed to be spaced apart from each other in a third lateral direction that is non-parallel to each of the first and second lateral directions and that is substantially parallel to the surface of the substrate.

In a method of fabricating a semiconductor device according to an aspect of the present disclosure, a plurality of bit line structures extending on a substrate in a first lateral direction substantially parallel to a surface of the substrate and spaced apart from each other in a second lateral direction perpendicular to the first lateral direction and substantially parallel to the surface of the substrate may be formed. Each of the plurality of bit line structures may include a bit line pattern layer and a first insulation layer disposed on the bit line pattern layer. A second insulation layer filling spaces over the substrate and between the plurality of bit line structures may be formed. A plurality of insulation line structures extending in the second lateral direction and spaced apart from each other in the first lateral direction may be formed by patterning the first and second insulation layers along the second lateral direction. A plurality of channel structures may be formed on side surfaces of the plurality of insulation line structures. The plurality of channel structures may be disposed on the plurality of bit line conductive layers. A first dielectric material layer over the substrate that covers the plurality of channel structures and the plurality of insulation line structures may be formed. A plurality of first gate line pattern layers may be formed to extend along the second lateral direction over the first dielectric material layer common to both sides of each of the plurality of insulation line structures. The plurality of insulation line structures over the substrate may be etched to selectively expose the plurality of channel structures and the first dielectric material layer. A second dielectric material layer may be formed to cover the exposed plurality of channel structures and the first dielectric material layer over the substrate. A plurality of second gate line pattern layers may be formed to extend in the second lateral direction over the second dielectric material layer.

A semiconductor device according to yet another aspect of the present disclosure may include: a substrate; a bit line conductive layer extending in a lateral direction substantially parallel to a surface of the substrate; a first insulation line structure extending in a second direction that is perpendicular to the first lateral direction and that is substantially parallel to the surface of the substrate; first and second channel structures that are disposed to respectively contact first and second sides of the first insulation line structure, and partially overlapping with the bit line conductive layer; first and second gate dielectric layers respectively disposed over the substrate and on side surfaces of the first and second channel structures; and first and second gate line conductive layers extending in the second lateral direction over the substrate, and covering at least a portion of each of the first and second gate dielectric layers, respectively.

In a method of fabricating the semiconductor device according to yet another embodiment of the present disclosure, a plurality of bit line conductive layers extending on a substrate in a first lateral direction parallel to a surface of the substrate and disposed to be spaced apart from each other in a second lateral direction that is perpendicular to the first lateral direction and that is substantially parallel to the surface of the substrate may be formed. First and second insulation layers covering the plurality of bit line conductive layers over the substrate may be sequentially formed. The second insulation layer over the substrate may be selectively etched to form a plurality of first trench line patterns extending in the second lateral direction and spaced apart from each other in the first lateral direction, each of the plurality of first trench line patterns having a protruding pattern portion extending in a direction that is not parallel to the second lateral direction. A gate line conductive layer may be formed on side surfaces of the plurality of first trench line patterns. The first insulation layer inside the plurality of first trench line patterns over the substrate may be etched to form a plurality of second trench line patterns. A dielectric material layer may be formed on a surface of the gate line conductive layer and side surfaces of the plurality of second trench line patterns. A channel material layer is formed inside the plurality of first and second trench line patterns. The dielectric material layer and the channel material layer disposed inside the plurality of first and second trench line patterns may be selectively removed to form gate dielectric layers and channel structures in the protruding pattern portion.

BRIEF DESCRIPTION OF THE DRAWINGS

FIGS. 4A to 14A are plan views schematically illustrating a method of fabricating a semiconductor device according to an embodiment of the present disclosure, and FIGS. 4B to 14B are cross-sectional views taken along a line A-A' of the semiconductor device of FIGS. 4A to 14A, respectively.

FIGS. 18A to 24A are plan views schematically illustrating a method of fabricating a semiconductor device according to another embodiment of the present disclosure, and FIGS. 18B to 24B are cross-sectional views taken along a line B-B' of the semiconductor device of FIGS. 18A to 24A, respectively.

DETAILED DESCRIPTION

Figure 1A:
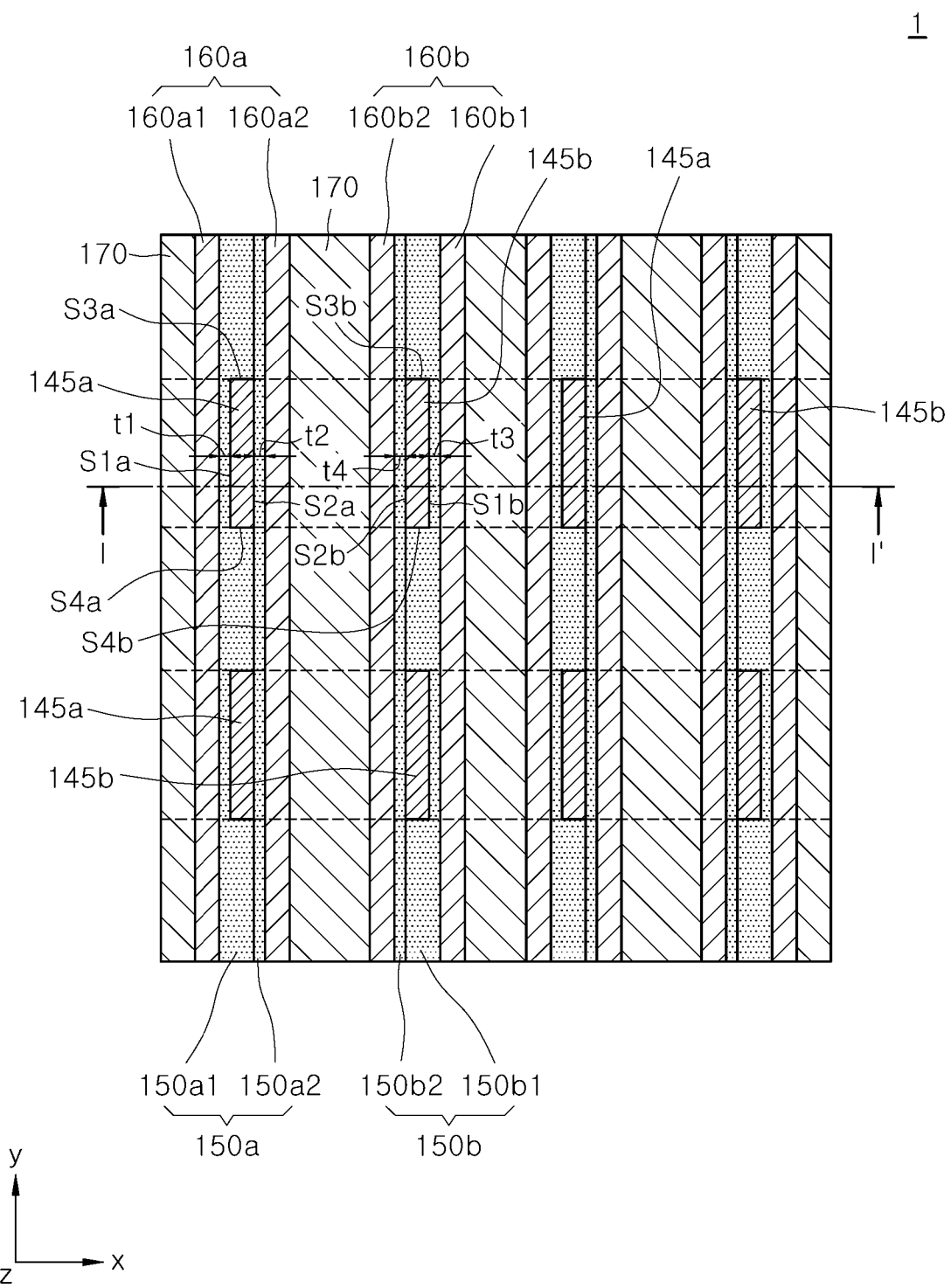
FIG. 1A is a plan view schematically illustrating a semiconductor device having a transistor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time, or may be performed in a different order. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. I.e., the x-direction may mean all of a direction in which an absolute value of the x-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Figure 1B:
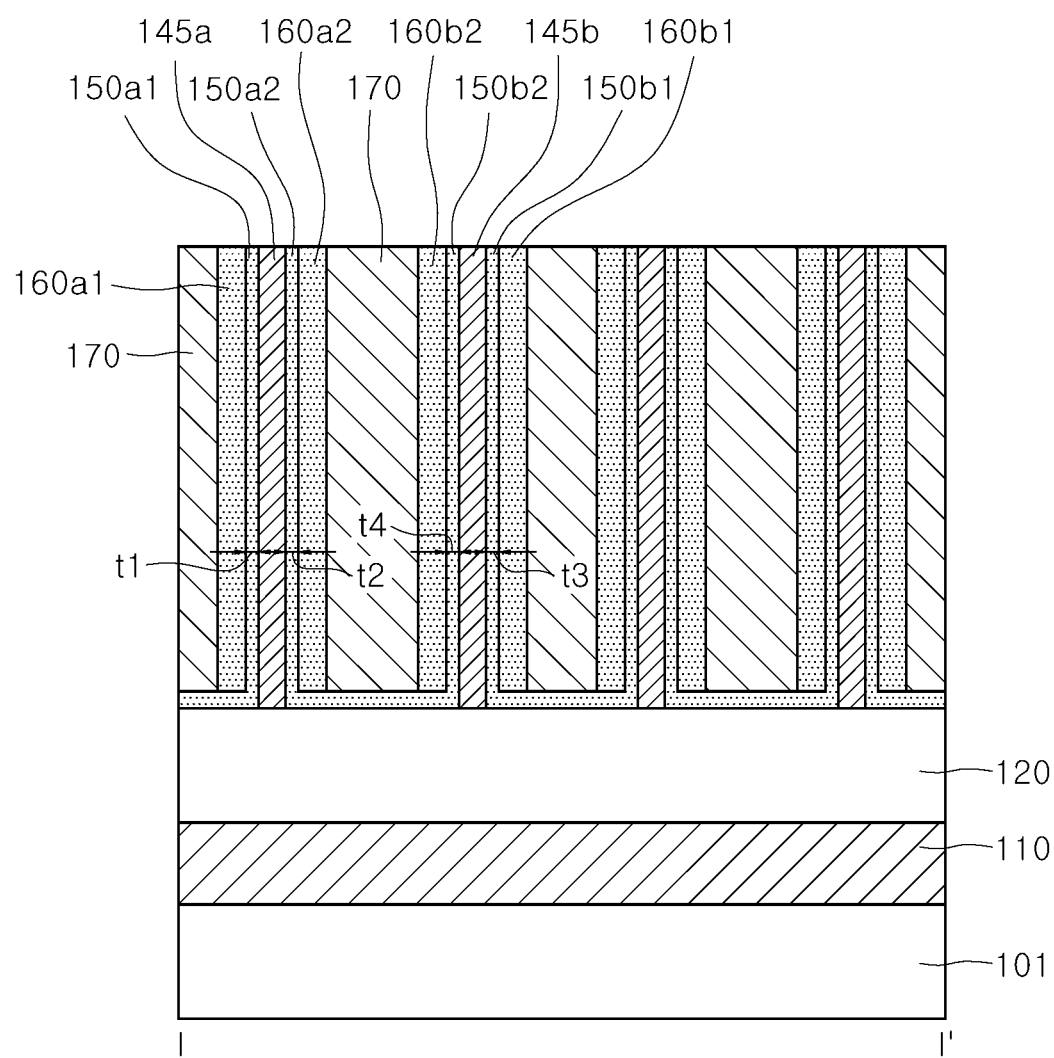
FIG. 1B is a cross-sectional view taken along a line I-I' of the semiconductor device of FIG. 1A.
Figure 2:
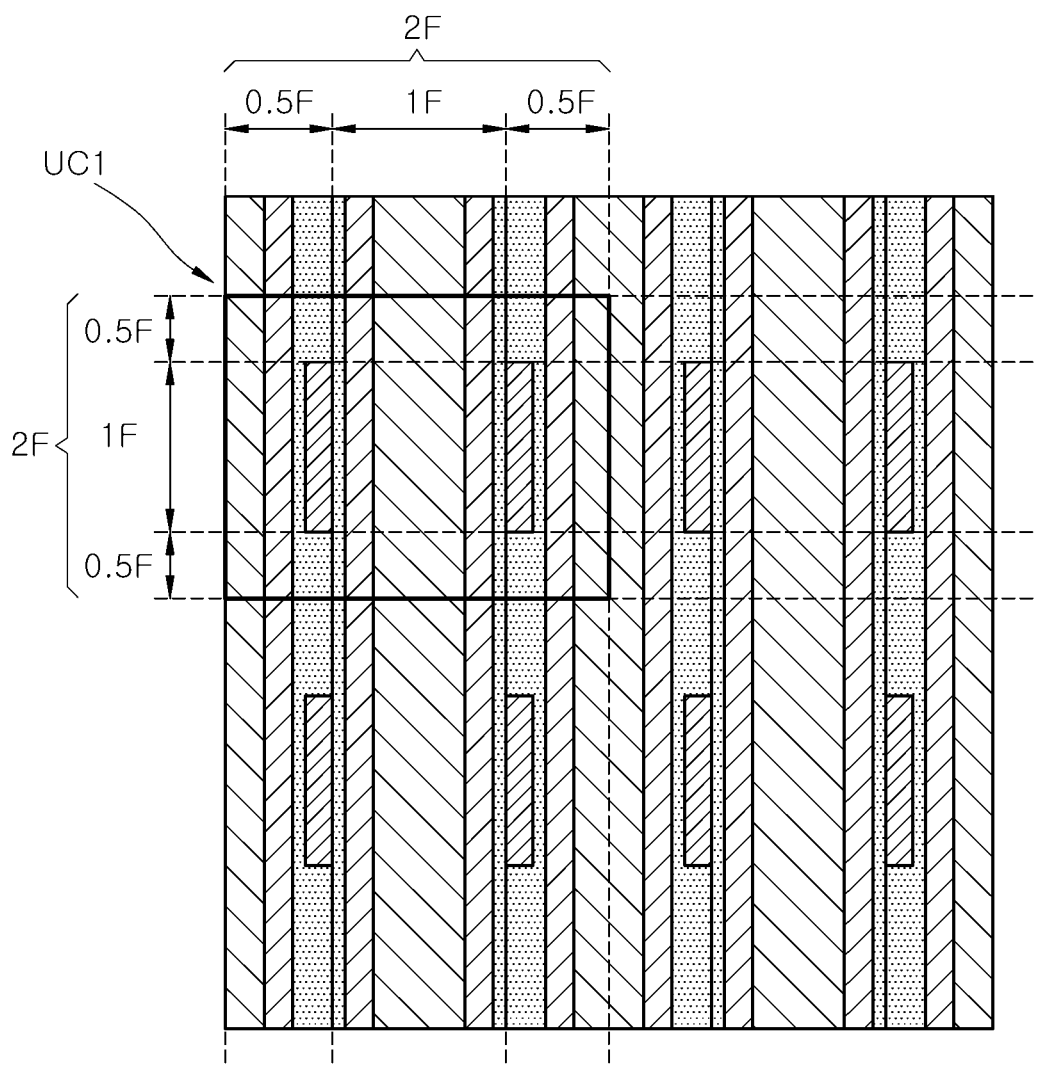
FIG. 2 is a view schematically illustrating a layout of the semiconductor device of FIG. 1A.
Figure 2:
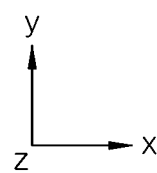
Figure 3A:
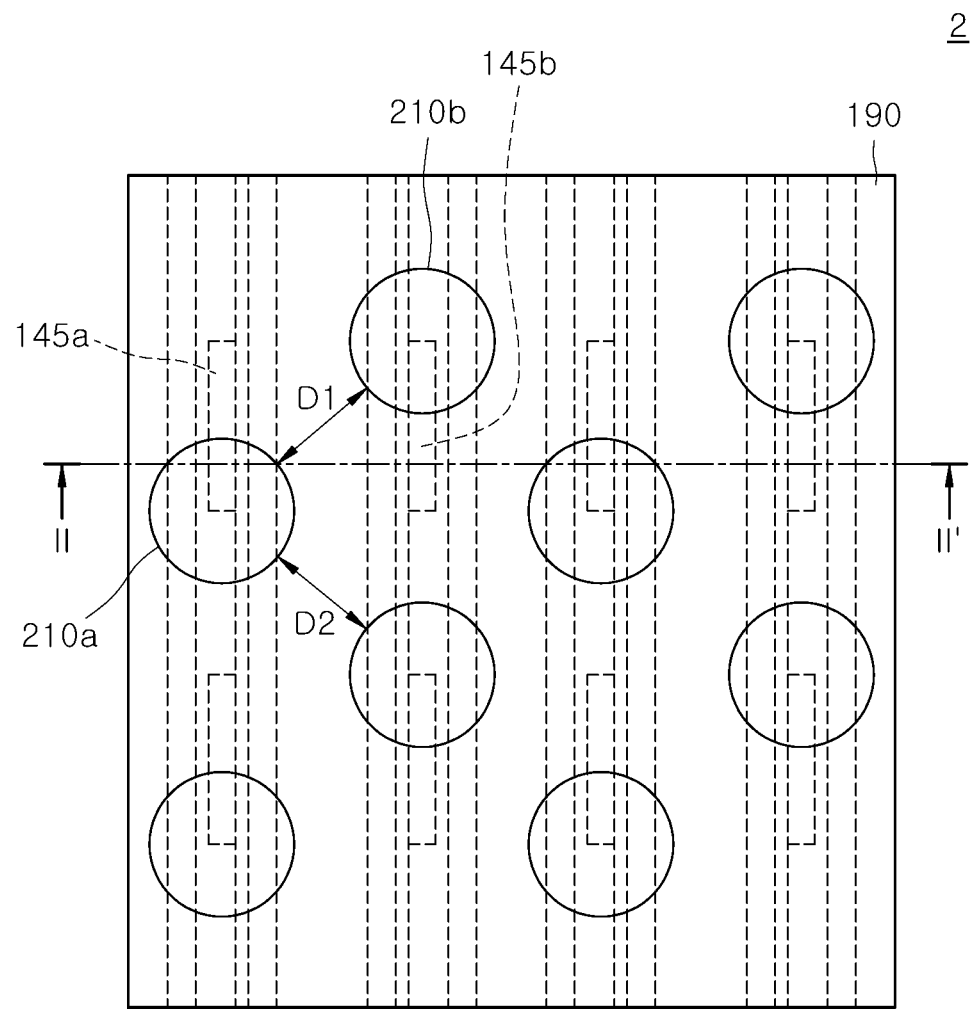
FIG. 3A is a plan view schematically illustrating a semiconductor device having a transistor device and a capacitor device according to an embodiment of the present disclosure.
Figure 3B:
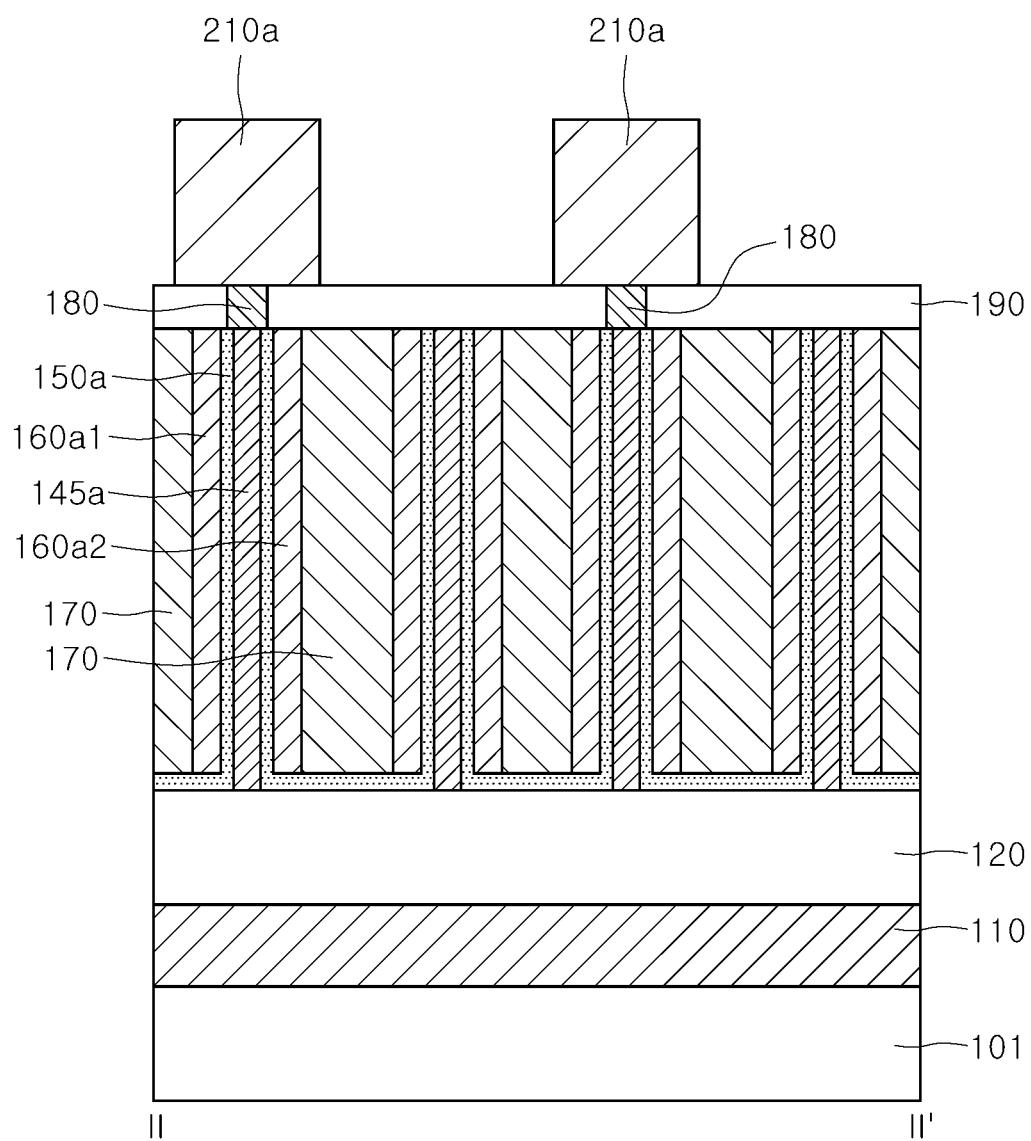
FIG. 3B is a cross-sectional view taken along a line II-II' of the semiconductor device of FIG. 3A.

FIG. 1A is a plan view schematically illustrating a semiconductor device having a transistor device according to an embodiment of the present disclosure. FIG. 1B is a cross-sectional view taken along a line I-I' of the semiconductor device of FIG. 1A. FIG. 2 is a schematic layout of the semiconductor device of FIG. 1A. FIG. 3A is a plan view schematically illustrating a semiconductor device having a transistor device and a capacitor device according to an embodiment of the present disclosure. FIG. 3B is a cross-sectional view taken along a line II-II' of the semiconductor device of FIG. 3A.

Referring to FIGS. 1A and 1B, a semiconductor device 1 may include a substrate 101, a bit line conductive layer 120, first and second channel structures 145a and 145b, first and second gate dielectric layers 150a and 150b, and first and second gate line conductive layers 160a and 160b. The first and second channel structures 145a and 145b may include conductive channels formed in channel inner regions adjacent to the first and second gate dielectric layers 150a and 150b, respectively, when the semiconductor device 1 is operated. The first and second gate line conductive layers 160a and 160b may control the forming of the conductive channels. The conductive channels are formed to extend in a direction (i.e., z-direction) perpendicular to a surface of the substrate 101, and electric charges can be conducted from the bit line conductive layer 120 in the z-direction through the conductive channel during operation of the semiconductor device 1.

The substrate 101 may be made of or include a semiconductor material. The semiconductor material may include, for example, silicon (Si), germanium (Ge), gallium arsenide (GaAs), molybdenum selenide (MoSe2), hafnium selenide (HfSe2), indium selenide (InSe), gallium selenide (GaSe), black phosphorus, indium-gallium-zinc oxide (IGZO), or a combination of two or more thereof. As an example, the semiconductor material may be doped with an n-type or p-type dopant. In some other embodiments, the substrate 101 may be an insulation substrate or a conductive substrate.

A base insulation layer 110 may be disposed on the substrate 101. The base insulation layer 110 may electrically insulate the bit line conductive layer 120 from the substrate 101. The base insulation layer 110 may be made of or include an insulation material. The insulation material may include, for example, oxide, nitride, oxynitride, or a combination of two or more thereof.

Although it is not illustrated, an integrated circuit may be disposed between the substrate 101 and the base insulation layer 110. The integrated circuit may include, for example, an active device such as a transistor, a passive device such as a resistor or a capacitor, or a combination thereof. The integrated circuit may include at least one circuit pattern layer and at least one insulation layer insulating the at least one circuit pattern layer.

The bit line conductive layer 120 may be disposed on the base insulation layer 110. The bit line conductive layer 120 may extend in a first lateral direction that is substantially parallel to a surface of the base insulation layer 110, i.e., the x-direction. The bit line conductive layers 120 may be disposed in plurality to be spaced apart from each other in a second lateral direction perpendicular to the first lateral direction (i.e., y-direction). The first and second lateral directions may be directions substantially parallel to the surface of the substrate 101. The bit line conductive layer 120 may be made of or include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 1A and 1B, first and second channel structures 145a and 145b may be disposed on the bit line conductive layer 120. Each of the first and second channel structures 145a and 145b may be a pillar-shaped structure. As illustrated, the first and second channel structures 145a and 145b may have a rectangular cross section having a width along the first lateral direction (i.e., the x-direction) and a length along the second lateral direction (i.e., the y-direction) on the bit line conductive layer 120. Each of the first and second channel structures 145a and 145b may have a height extending in a direction substantially perpendicular to the surface of the substrate 101 and from the bit line conductive layer 120, i.e., in the z-direction perpendicular to the first and second lateral directions.

Referring to FIG. 1A, the first channel structure 145a may have first channel first to fourth sides S1a, S2a, S3a, and S4a. The first channel first and second sides S1a and S2a are sides perpendicular to the first lateral direction (i.e., the x-direction), and the first channel third and fourth sides S3a and S4a are sides perpendicular to the second lateral direction (i.e., the y-direction). The second channel structure 145b may have second channel first to fourth sides S1b, S2b, S3b, and S4b. The second channel first and second sides S1b and S2b are sides perpendicular to the first lateral direction (i.e., the x-direction), and the second channel third and fourth sides S3b and S4b are sides perpendicular to the second lateral direction (i.e., the y-direction).

The first and second channel structures 145a and 145b may be alternately disposed along the first lateral direction (i.e., the x-direction). The first and second channel structures 145a and 145b may be spaced apart from each other in the first lateral direction (i.e., the x-direction).

In addition, the first channel structures 145a may be spaced apart from each other in a column along the second lateral direction (i.e., the y-direction), and the second channel structures 145b may be spaced apart from each other in another column in the second lateral direction (i.e., the y-direction).

Each of the first and second channel structures 145a and 145b may be made of or include a semiconductor material. The semiconductor material may include, for example, silicon (Si), germanium (Ge), gallium arsenide (GaAs), and the like. The semiconductor material may include, for example, a 2-dimensional (2D) semiconductor material. The 2D semiconductor material may include transition metal dichalcogenide (TMDC), black phosphorus, and the like. The transition metal dichalcogenide may include, for example, molybdenum selenide (MoSe2), hafnium selenide (HfSe2), indium selenide (InSe), gallium selenide (GaSe), and the like. The semiconductor material may include, for example, metal oxide such as indium-gallium-zinc oxide (IGZO).

The first and second gate dielectric layers 150a and 150b may be disposed on the base insulation layer 110 and the bit line conductive layer 120. The first and second gate dielectric layers 150a and 150b may be disposed to surround the first channel first to fourth sides S1a, S2a, S3a, and S4a of the first channel structure 145a, and the second channel first to fourth sides S1b, S2b, S3b, and S4b of the second channel structure 145b, respectively. Referring to FIGS. 1A and 1B, the first gate dielectric layer 150a may include a first portion 150a1 surrounding the first channel first side S1a, the first channel third side S3a, and the first channel fourth side S4a of the first channel structure 145a, and a second portion 150a2 surrounding the first channel second side S2a of the first channel structure 145a. The first portion 150a1 and the second portion 150a2 may be made of or include substantially the same material.

Similarly, the second gate dielectric layer 150b may include a first portion 150b1 surrounding the first side S1b, the third side S3b, and the fourth side S4b of the second channel structure 145b, and a second portion 150b2 surrounding the second side S2b of the second channel structure 145b. The first portion 150b1 and the second portion 150b2 may be made of or include substantially the same material.

Each of the first and second gate dielectric layers 150a and 150b may be made of or include a dielectric material. The dielectric material may include, for example, silicon oxide, silicon nitride, silicon oxynitride, aluminum oxide, tantalum oxide, titanium oxide, hafnium oxide, zirconium oxide, and the like.

The first and second gate line conductive layers 160a and 160b may be disposed common to the first and second channel structures 145a and 145b, respectively, on the adjacent first and second gate dielectric layers 150a and 150b. The first gate line conductive layer 160a may include a first gate first line pattern 160a1 and a first gate second line pattern 160a2. The first gate first line pattern 160a1 may be disposed common to the first channel first side S1a of the first channel structure 145a and extend in the second lateral direction (i.e., the y-direction). The first gate second line pattern 160a2 may be disposed common to the first channel second side S2a of the first channel structure 145a and extend in the second lateral direction (i.e., the y-direction).

The first gate first line pattern 160a1 and the first gate second line pattern 160a2 may be configured to have the same electric potential. During the operation of the semiconductor device 1, a gate voltage of substantially the same magnitude may be applied to the first gate first line pattern 160a1 and the first gate second line pattern 160a2. By the gate voltage applied to the first gate first line pattern 160a1 and the first gate second line pattern 160a2, a pair of conductive channels may be formed in inner regions of the first channel structure 145a, adjacent to the first channel first side S1a and the first channel second side S2a, respectively. The density of charges moving along the vertical channels of the transistor device in the semiconductor device 1 may increase as a result of the pair of conductive channels.

Similarly, the second gate line conductive layer 160b may include a second gate first line pattern 160b1 and a second gate second line pattern 160b2. The second gate first line pattern 160b1 may be disposed common to the second channel first side S1b of the second channel structure 145b, and extend in the second lateral direction (i.e., the y-direction). The second gate second line pattern 160b2 may be disposed common to the second channel second side S2b of the second channel structure 145b, and extend in the second lateral direction (i.e., the y-direction). The second gate first line pattern 160b1 and the second gate second line pattern 160b2 may be configured to have substantially the same electric potential. Gate voltage applied to the second gate first line pattern 160b1 and the second gate second line pattern 160b2 may result in a pair of conductive channels in inner regions of the second channel structure 145b, adjacent to the second channel first side S1b and the second channel second side S2b, respectively.

Each of the first and second gate line conductive layers 160a and 160b may be made of or include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 1A and 1B again, the first portion 150a1 of the first gate dielectric layer 150a may have a first thickness t1 between the first gate first line pattern 160a1 and the first channel first side S1a of the first channel structure 145a in the first lateral direction (i.e., the x-direction). The second portion 150a2 of the first gate dielectric layer 150a may have a second thickness t2 between the first gate second line pattern 160a2 and the first channel second side S2a of the first channel structure 145a in the first lateral direction (i.e., the x-direction). In an embodiment, the first thickness t1 and the second thickness t2 may be substantially the same.

Similarly, the first portion 150b1 of the second gate dielectric layer 150b may have a third thickness t3 between the second gate first line pattern 160b1 and the first side S1b of the second channel structure 145b in the first lateral direction (i.e., the x-direction). The second portion 150b2 of the second gate dielectric layer 150b may have a fourth thickness t4 between the second gate second line pattern 160b2 and the second side S2b of the second channel structure 145b in the first lateral direction (i.e., the x-direction). In an embodiment, the third thickness t3 and the fourth thickness t4 may be substantially the same.

Referring to FIGS. 1A and 1B, a filling insulation layer 170 may be disposed to fill spaces between the first and second gate line conductive layers 160a and 160b. The filling insulation layer 170 may be made of or include an insulation material. The insulation material may include, for example, oxide, nitride, oxynitride, or a combination of two or more thereof.

FIG. 2 is a view schematically illustrating a layout of the semiconductor device of FIG. 1A. Referring to FIGS. 1A and 2 together, a unit cell (UC1) of the semiconductor device 1 may have a $4F^2$ layout. In the unit cell UC1, a pair of channel structures 145a and 145b and a pair of gate line conductive layers 160a and 160b, which are electrically isolated from each other, may be disposed. As a result, a pair of independently driven transistor devices may be implemented in the unit cell UC1.

FIG. 3A is a plan view schematically illustrating a semiconductor device having a transistor device and a capacitor device according to an embodiment of the present disclosure. FIG. 3B is a cross-sectional view taken along a line II-II' of the semiconductor device 2 of FIG. 3A. A semiconductor device 2 of FIGS. 3A and 3B may have a structure in which a storage node electrode layer is disposed over the semiconductor device 1 of FIGS. 1A and 1B.

Referring to FIGS. 3A and 3B, first and second storage node electrode layers 210a and 210b may be disposed over first and second channel structures 145a and 145b, respectively. The first and second storage node electrode layers 210a and 210b may be electrically connected to the corresponding first and second channel structures 145a and 145b through contact plugs 180. Each of the contact plugs 180 and the storage node electrode layers 210a and 210b may be made of or include a conductive material. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. An interlayer insulation layer 190 may be disposed on the sides of the contact plugs 180.

As illustrated in FIG. 3A, the first and second storage node electrode layers 210a and 210b may be disposed to be spaced apart from each other in third directions (i.e., direction D1 and direction D2) that are not parallel to the first or second lateral directions. In FIG. 3A, the first and second storage node electrode layers 210a and 210b may be respectively disposed on edge portions opposite to each other in the second lateral direction (i.e., the y-direction) in the neighboring or adjacent first and second channel structures 145a and 145b.

Although not illustrated in FIGS. 3A and 3B, the semiconductor device 2 may further include capacitor dielectric layers disposed on the first and second storage node electrode layers 210a and 210b, and plate electrode layers disposed on the capacitor dielectric layers. As a structure substantially the same as the structure of the cross-sectional view of FIG. 14B to be described later, the capacitor dielectric layers may be disposed to cover the first and second storage node electrode layers 210a and 210b, respectively. The plate electrode layers may be disposed to cover the capacitor dielectric layers, and may function as a common electrode.

The first storage node electrode layer 210a, the capacitor dielectric layer, and the plate electrode layer electrically connected to the first channel structure 145a may configure a first capacitor device. The second storage node electrode layer 210b, the capacitor dielectric layer, and the plate electrode layer electrically connected to the second channel structure 145b may configure a second capacitor device. The first capacitor device and the second capacitor device may store signal information independent of each other.

As described above, embodiments of the present disclosure can provide a semiconductor device including a transistor device having a pair of channel structures. In addition, the embodiments of the present disclosure can provide a semiconductor device including a pair of capacitor devices electrically connected to the pair of channel structures, respectively. The semiconductor device includes a pair of transistor devices and a pair of capacitor devices that operate independently of each other in a $4F^2$ unit cell layout, such that device integration can be improved.

FIGS. 4A to 14A are plan views schematically illustrating a method of fabricating a semiconductor device according to an embodiment of the present disclosure. FIGS. 4B to 14B are cross-sectional views taken along a line A-A' of the semiconductor device of FIGS. 4A to 14A, respectively. FIGS. 4C and 5C are cross-sectional views taken along a line B-B' of the semiconductor device of FIGS. 4A and 5A, respectively. In an embodiment, a method of fabricating a semiconductor device to be described with reference to FIGS. 4A to 14A, FIGS. 4B to 14B and FIGS. 4C and 5C can be applied to a method of fabricating the semiconductor device 1 described above with reference to FIGS. 1A and 1B, or a method of fabricating the semiconductor device 2 described above with reference to FIGS. 3A and 3B.

Figure 4A:
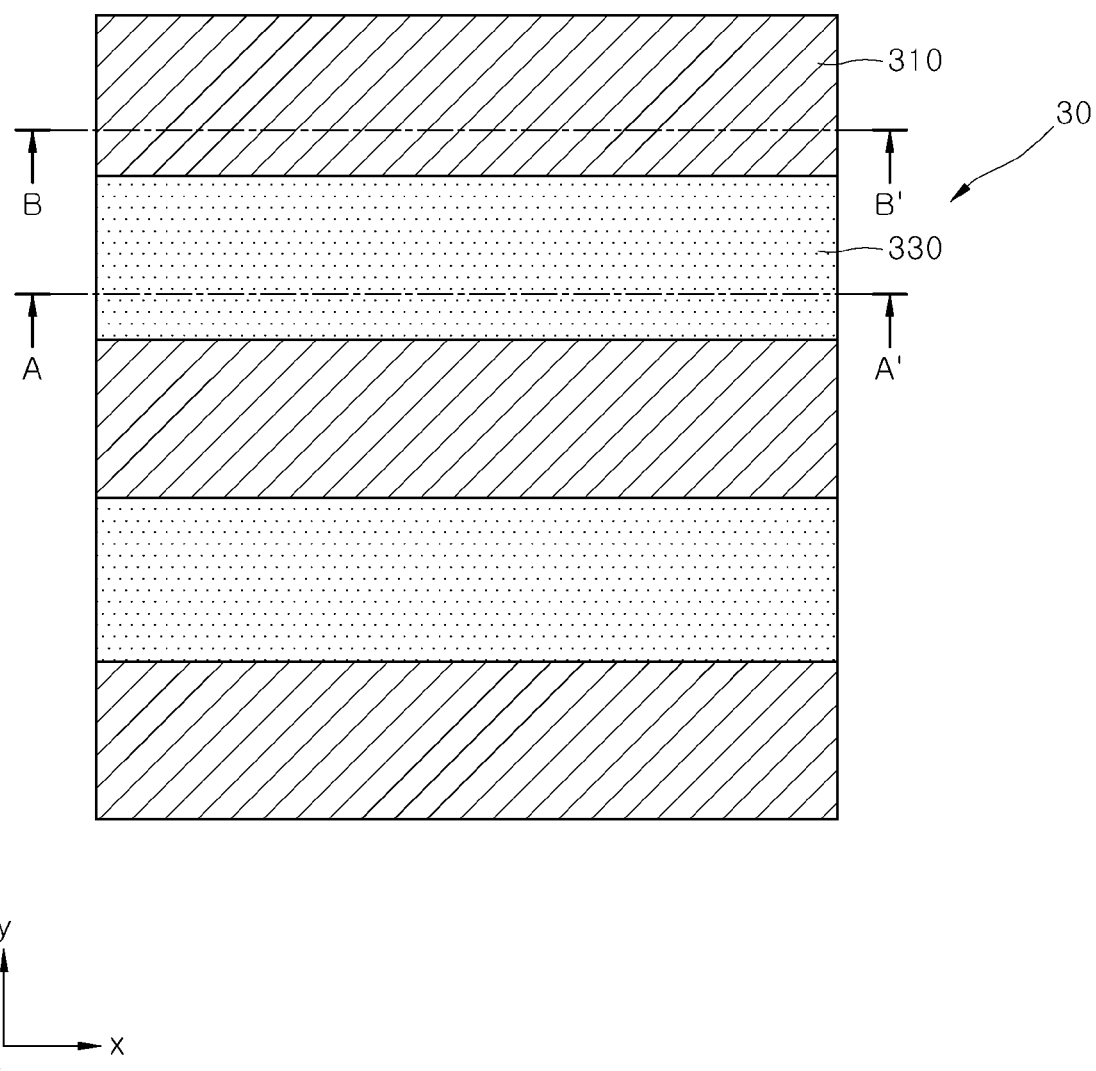
Figure 4B:
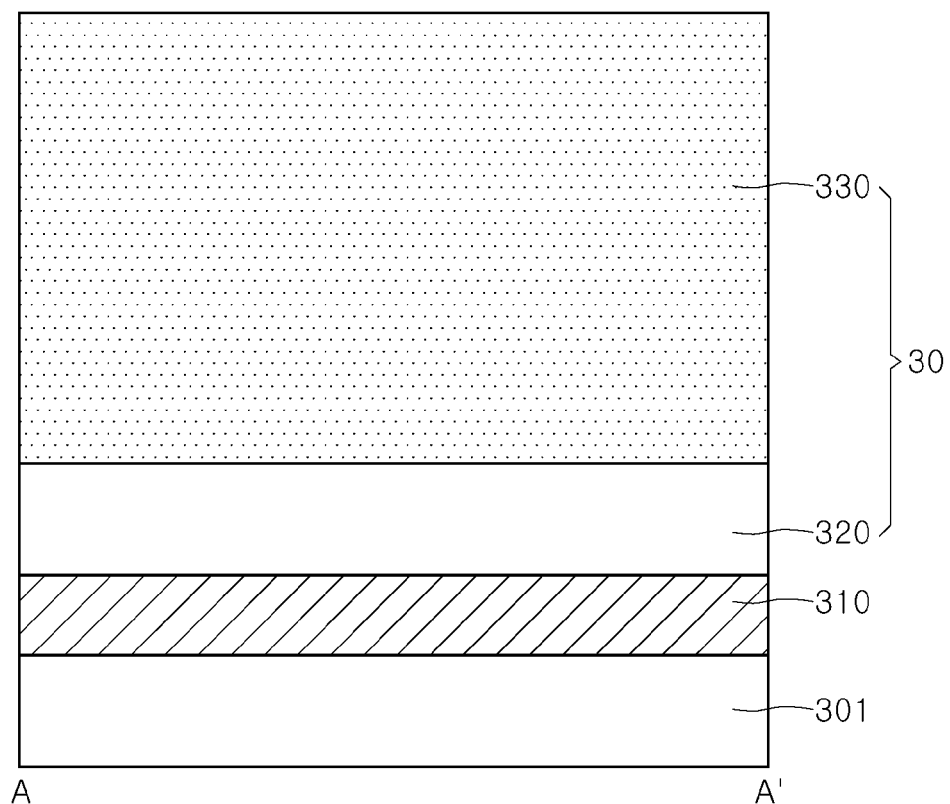
Figure 4C:
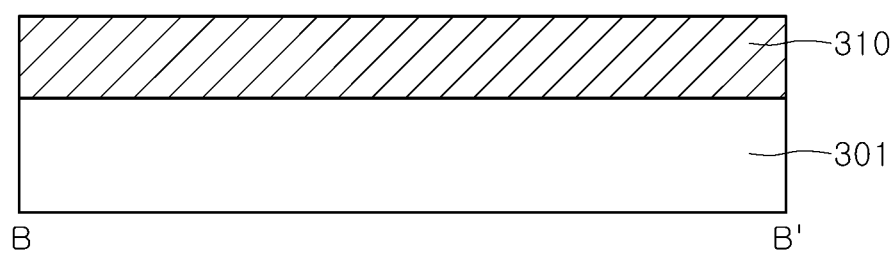
FIGS. 4C and 5C are cross-sectional views taken along a line B-B' of the semiconductor device of FIGS. 4A and 5A, respectively.

Referring to FIGS. 4A, 4B and 4C, a substrate 301 may be provided. The substrate 301 may be substantially the same as the substrate 101 described above with reference to FIGS. 1A and 1B.

A base insulation layer 310 may be formed on the substrate 301. The base insulation layer 310 may be made of or include an insulation material. The insulation material may include, for example, oxide, nitride, oxynitride, or a combination of two or more thereof.

Although not illustrated, an integrated circuit may be disposed between the substrate 301 and the base insulation layer 310. As an example, the integrated circuit may include an active device such as a transistor, a passive device such as a resistor and a capacitor, or a combination thereof. The integrated circuit may include at least one circuit pattern layer and at least one insulation layer insulating the at least one circuit pattern layer.

Sequentially, a conductive material layer and an insulation material layer may be sequentially formed on the base insulation layer 310, and the conductive material layer and the insulation material layer may be patterned. As a result, a plurality of bit line structures 30 may be formed on the base insulation layer 310. The plurality of bit line structures 30 may extend in a first lateral direction (i.e., the x-direction) substantially parallel to a surface of the base insulation layer 310, and may be disposed to be spaced apart from each other in a second lateral direction (i.e., the y-direction) perpendicular to the first lateral direction. The first and second lateral directions may be directions substantially parallel to a surface of the substrate 301. In addition, each of the plurality of bit line structures 30 may include a bit line pattern layer 320 disposed on the base insulation layer 310, and a first insulation layer 330 disposed on the bit line pattern layer 320.

The conductive material layer may be made of or include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The insulation material layer may be made of or include, for example, oxide, nitride, oxynitride, or a combination of two or more thereof. The insulation material layer may have an etching selectivity with respect to the base insulation layer 310.

Figure 5A:
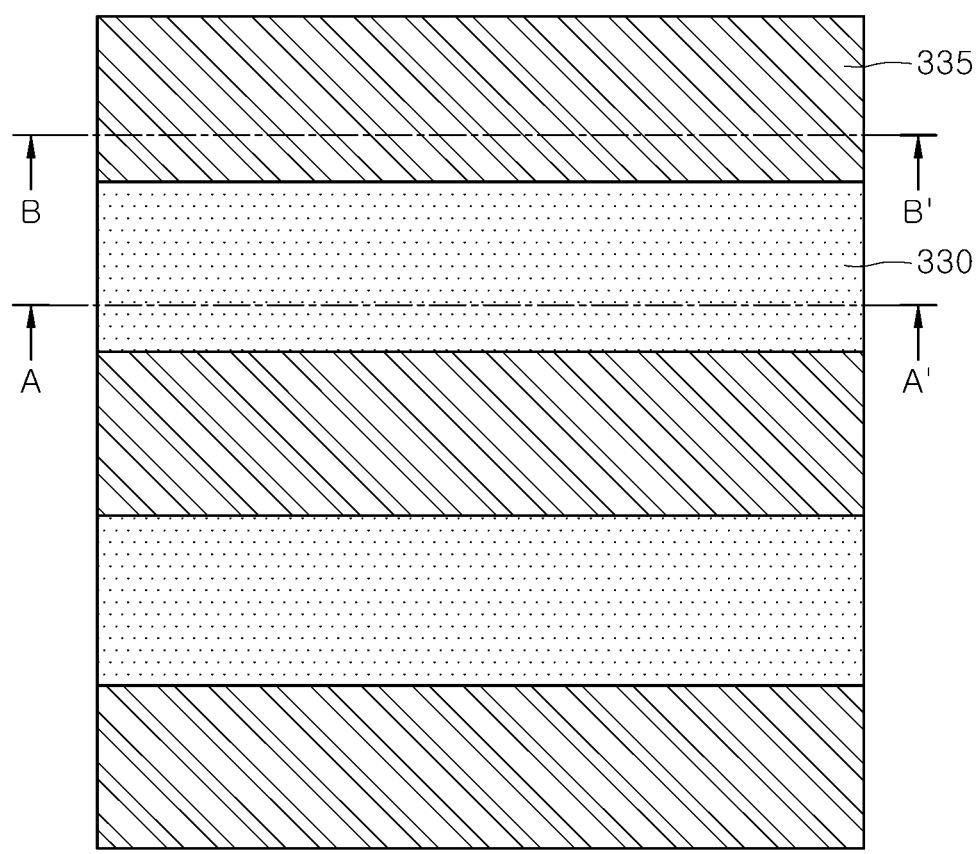
Figure 5B:
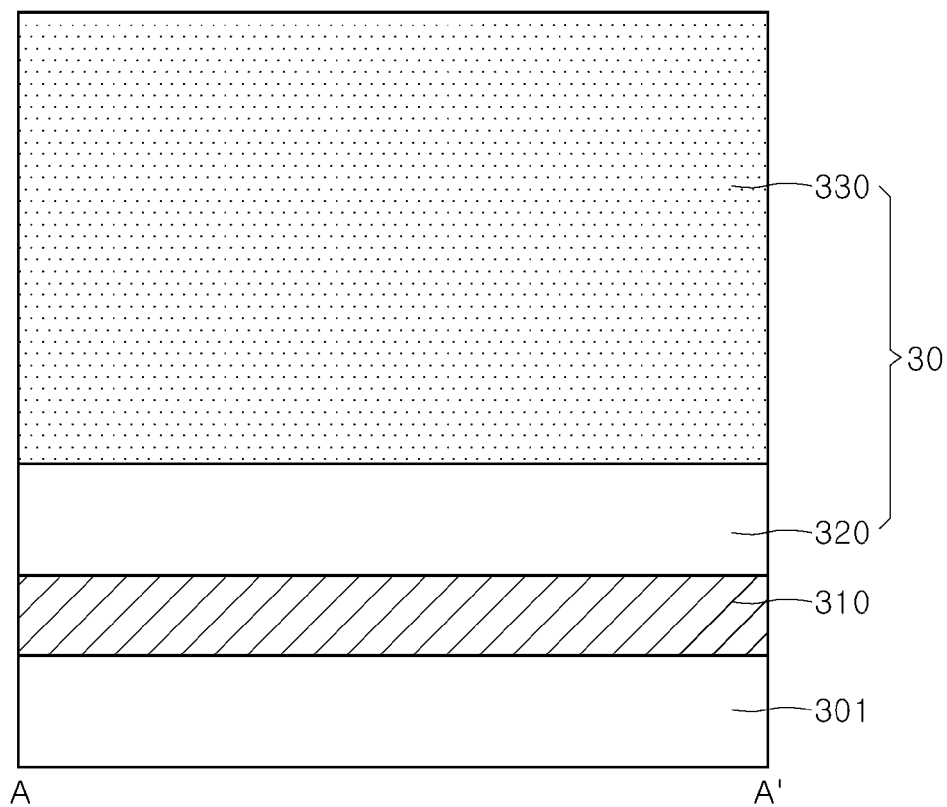
Figure 5C:
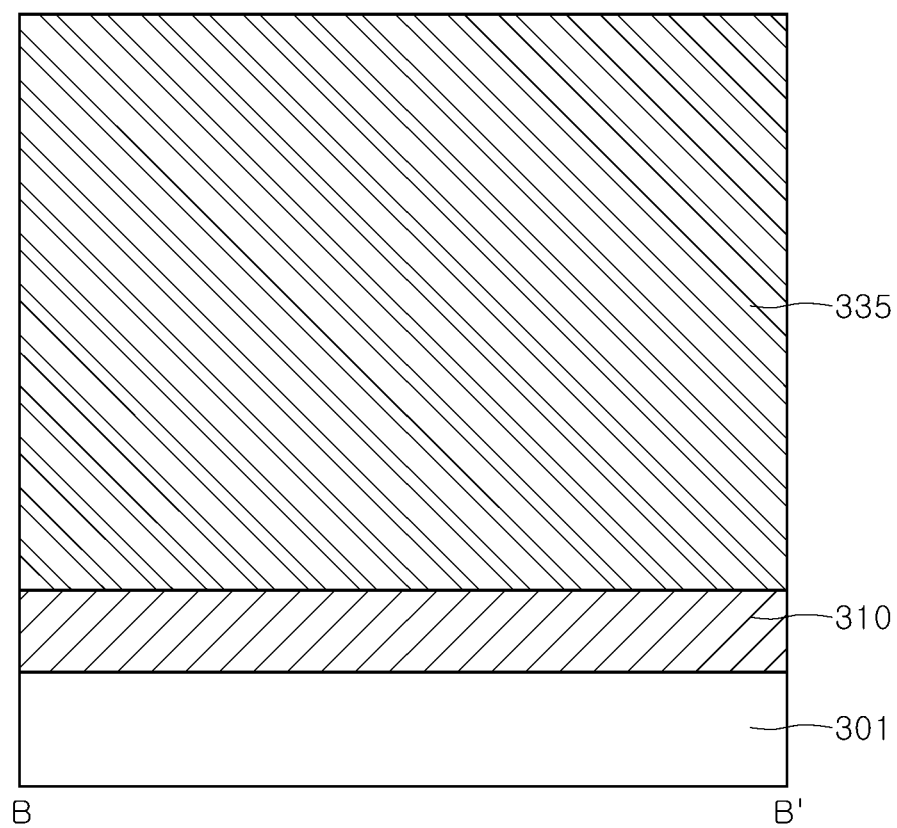

Referring to FIGS. 5A, 5B and 5C, a second insulation layer 335 may be formed on the base insulation layer 310 by filling areas between the plurality of bit line structures 30 with an insulation material. An upper surface of the second insulation layer 335 may be positioned at the same level as an upper surface of the first insulation layer 330. The insulation material may include, for example, oxide, nitride, oxynitride, or a combination of two or more thereof.

Figure 6A:
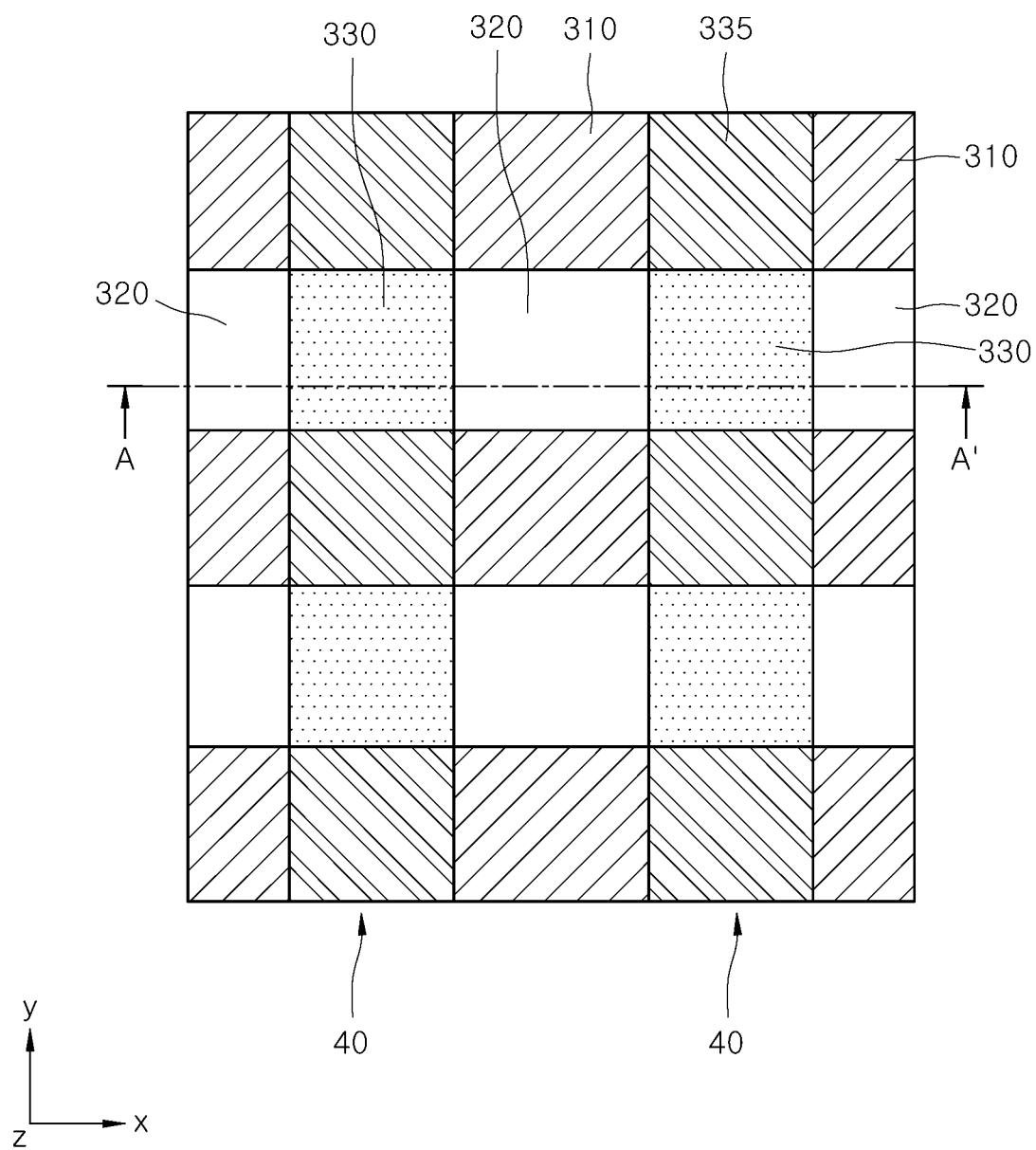
Figure 6B:
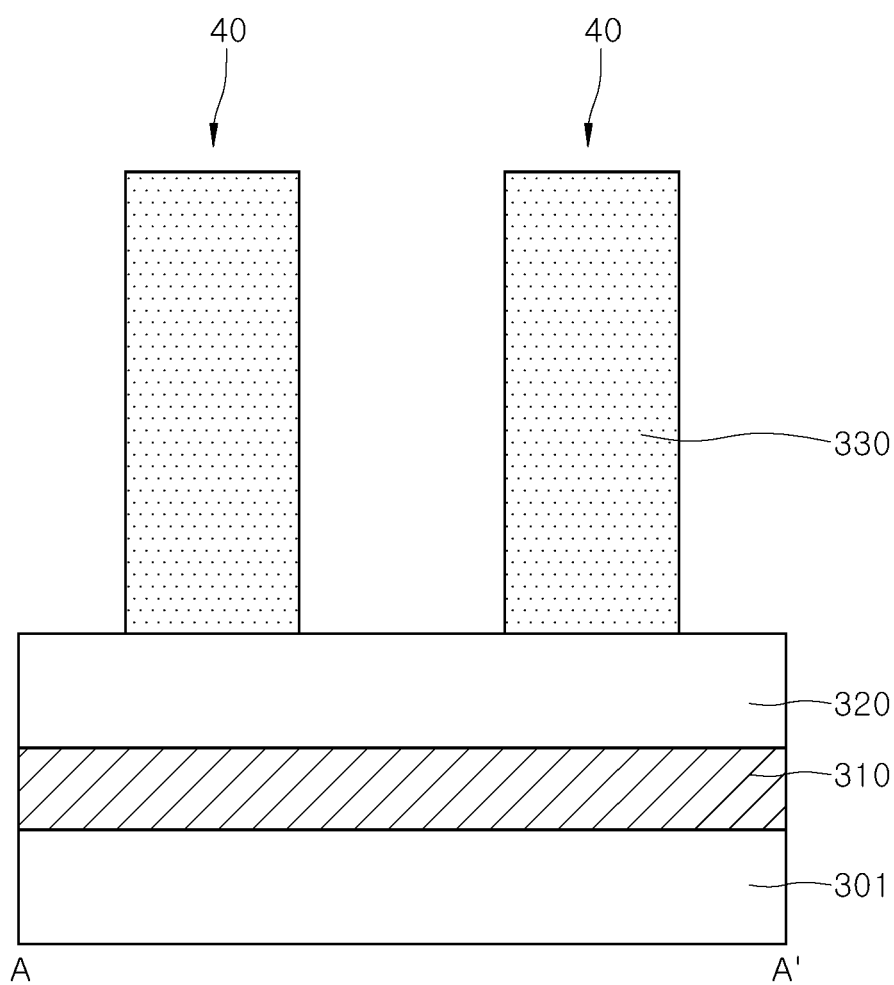

Referring to FIGS. 6A and 6B, the first insulation layer 330 on the bit line pattern layer 320 and the second insulation layer 335 on the base insulation layer 310 may be patterned along the second lateral direction (i.e., y-direction) to form a plurality of insulation line structures 40. The plurality of insulation line structures 40 may extend in the second lateral direction (i.e., y-direction) and may be spaced apart from each other in the first lateral direction (i.e., x-direction). Each of the plurality of insulation line structures 40 may include a portion of the first insulation layer 330 positioned directly on the bit line pattern layer 320 and a portion of the second insulation layer 335 positioned directly on the base insulation layer 310. In an embodiment, when the plurality of insulation line structures 40 are formed, the bit line pattern layer 320 and the base insulation layer 310 may be selectively exposed by the etching for the first insulation layer 330 and the second insulation layer 335.

Figure 7A:
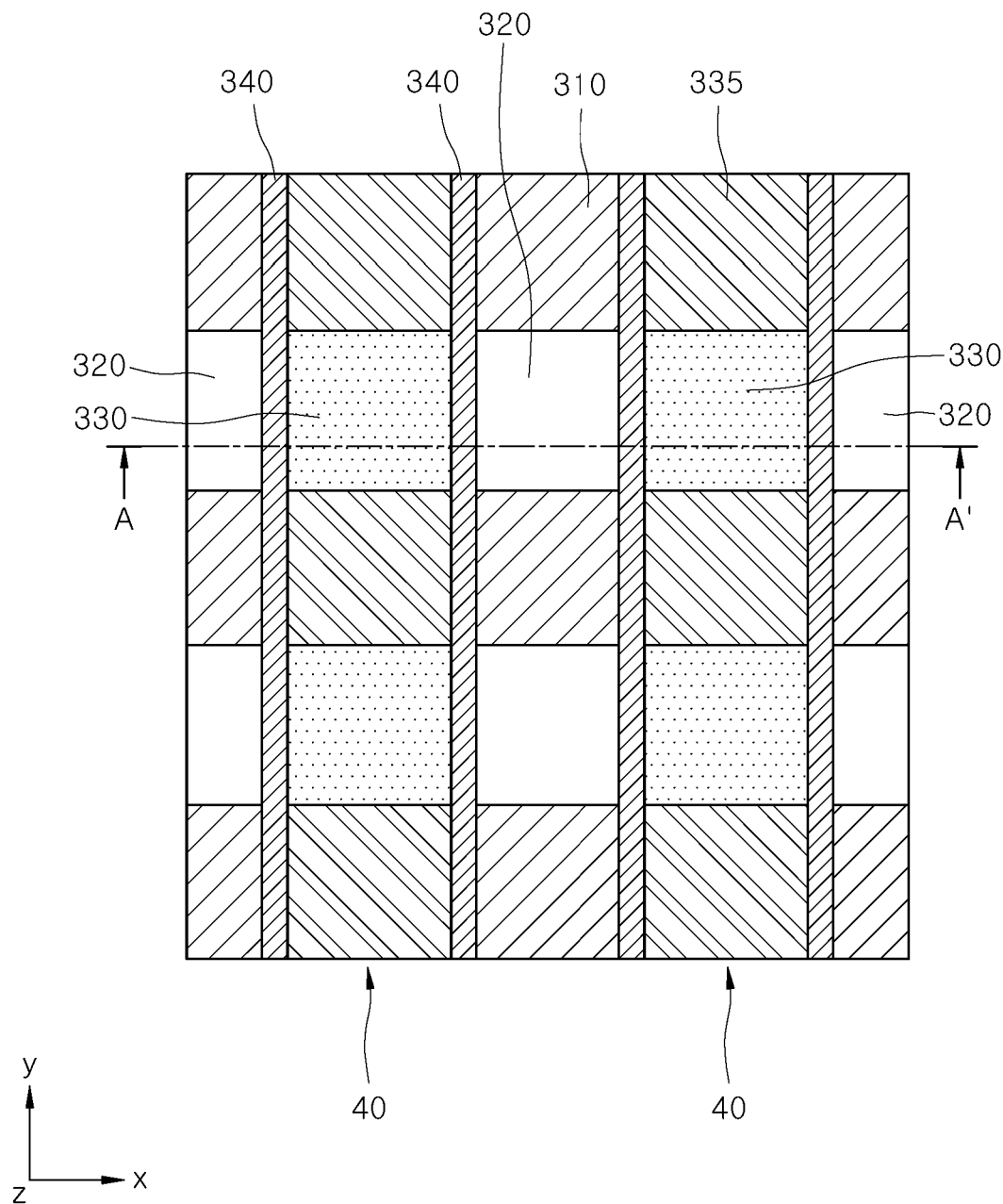
Figure 7B:
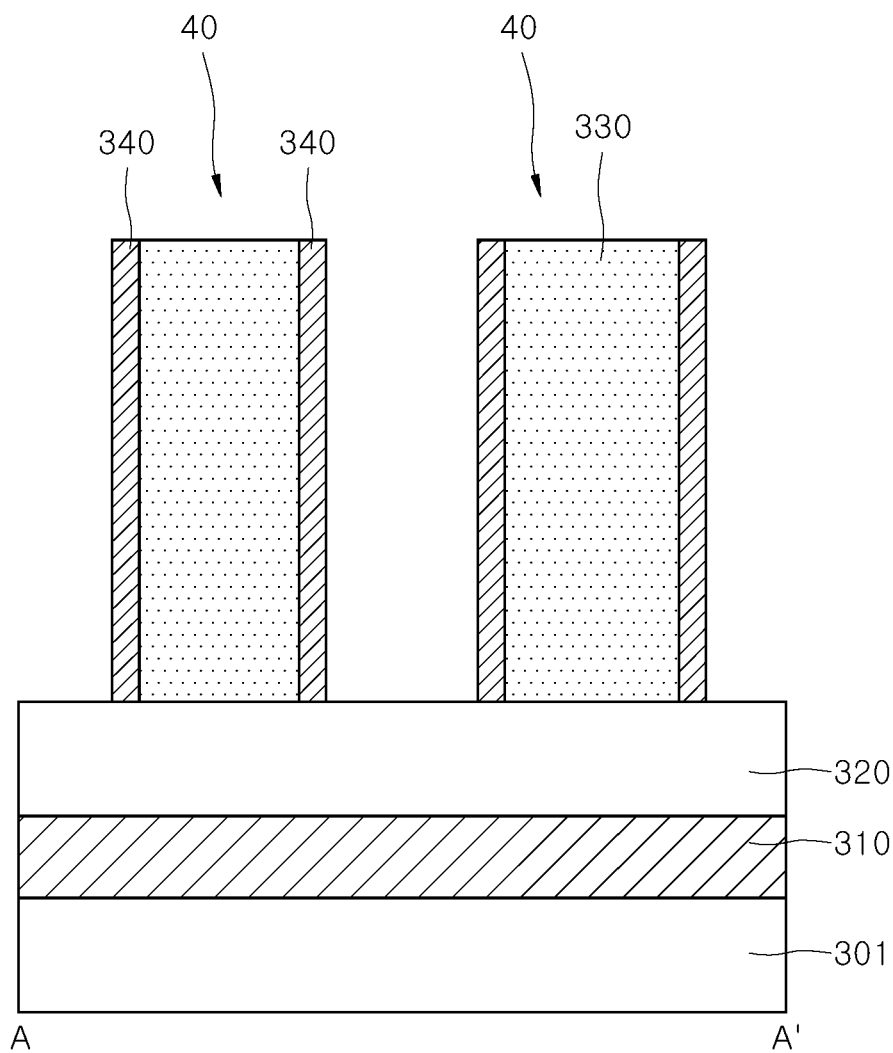

Referring to FIGS. 7A and 7B, a channel material layer 340 may be formed on both sides of each of the plurality of insulation line structures 40. The channel material layer 340 may include portions positioned directly on the base insulation layer 310 and portions positioned directly on the bit line pattern layer 320 along the second lateral direction (i.e., y-direction). Accordingly, the portions of the channel material layer 340 disposed directly on the bit line pattern layer 320 can be electrically connected to the bit line pattern layer 320. The channel material layer 340 may be made of substantially the same material as the first and second channel structures 145a and 145b of the semiconductor device 1 described above with respect to FIGS. 1A and 1B.

Figure 8A:
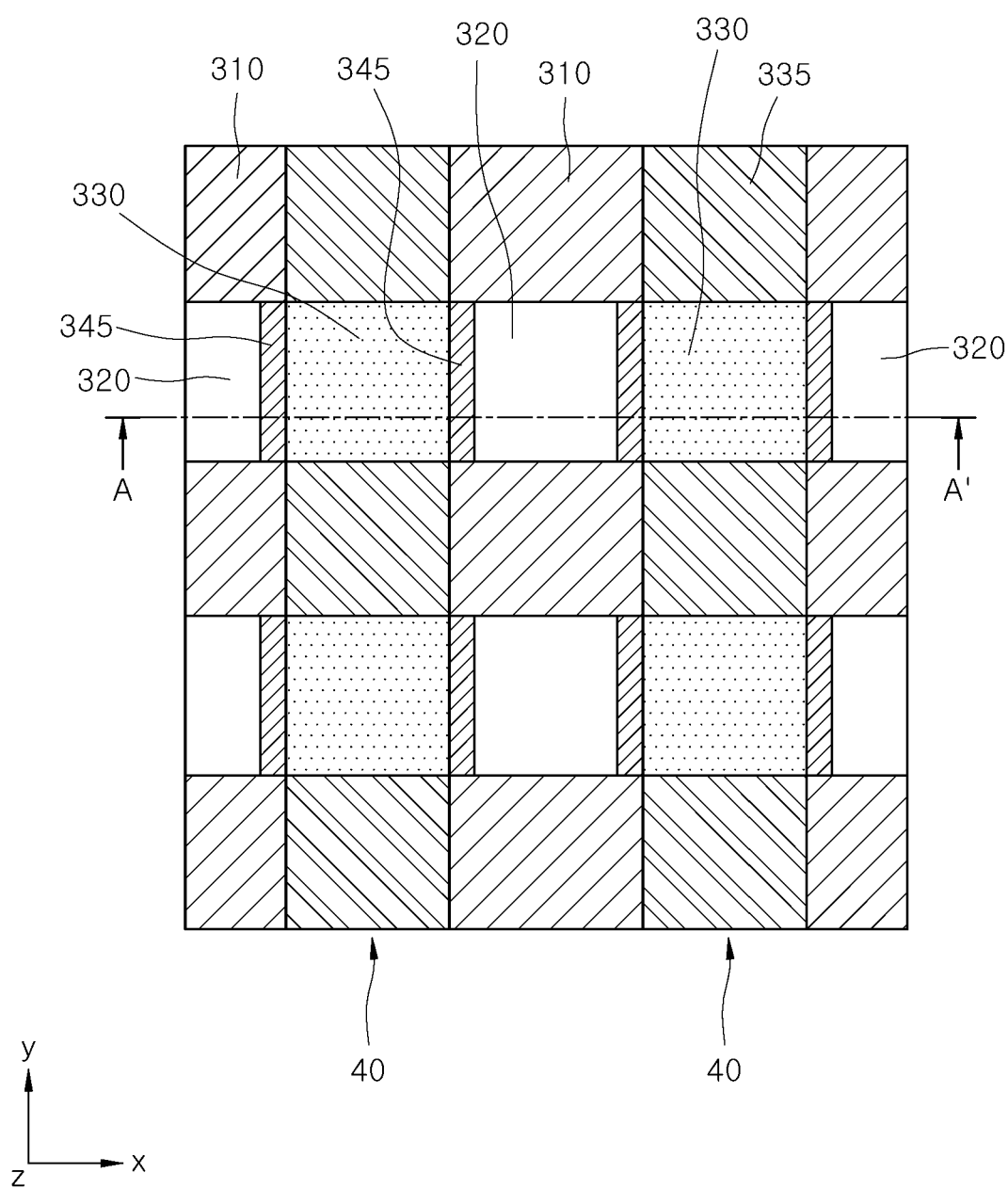
Figure 8B:
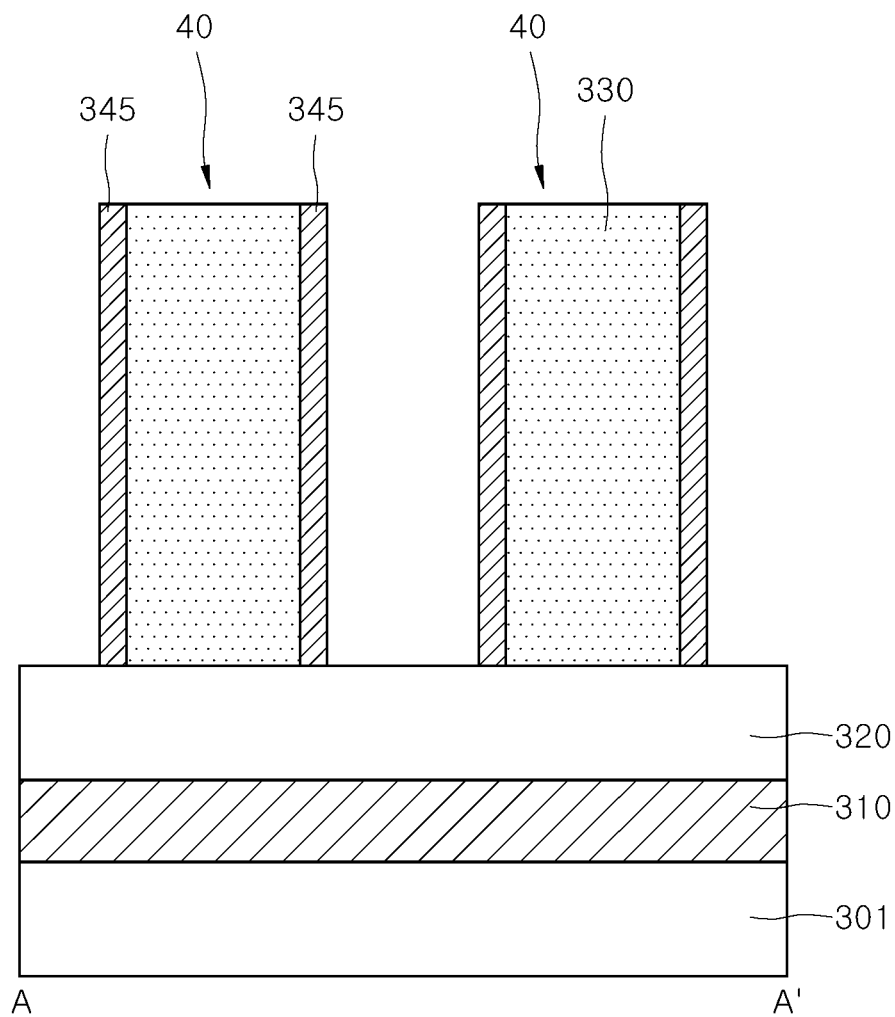

Referring to FIGS. 8A and 8B, the portions of the channel material layer 340, except for the portions disposed directly on the plurality of bit line pattern layers 320, may be etched to form a plurality of channel structures 345. As an example, when the plurality of channel structures 345 are formed, the portions of the channel material layer 340 disposed directly on the base insulation layer 310 may be removed. Accordingly, the plurality of channel structures 345 may be disposed over the plurality of bit line pattern layer 320. The plurality of channel structures 345 may be disposed to be spaced apart from each other in the first lateral direction (i.e., x-direction) and the second lateral direction (i.e., y-direction).

Figure 9A:
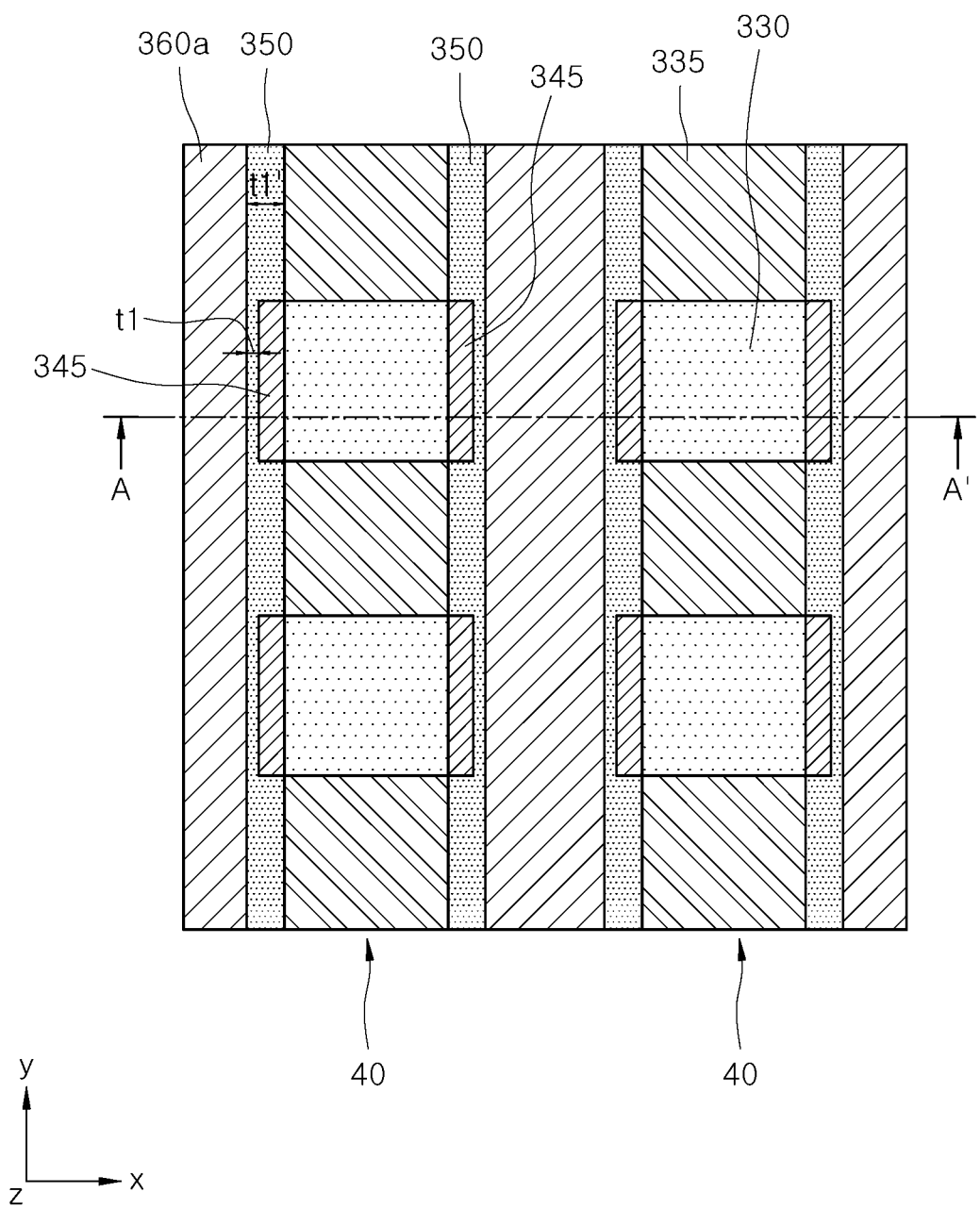
Figure 9B:
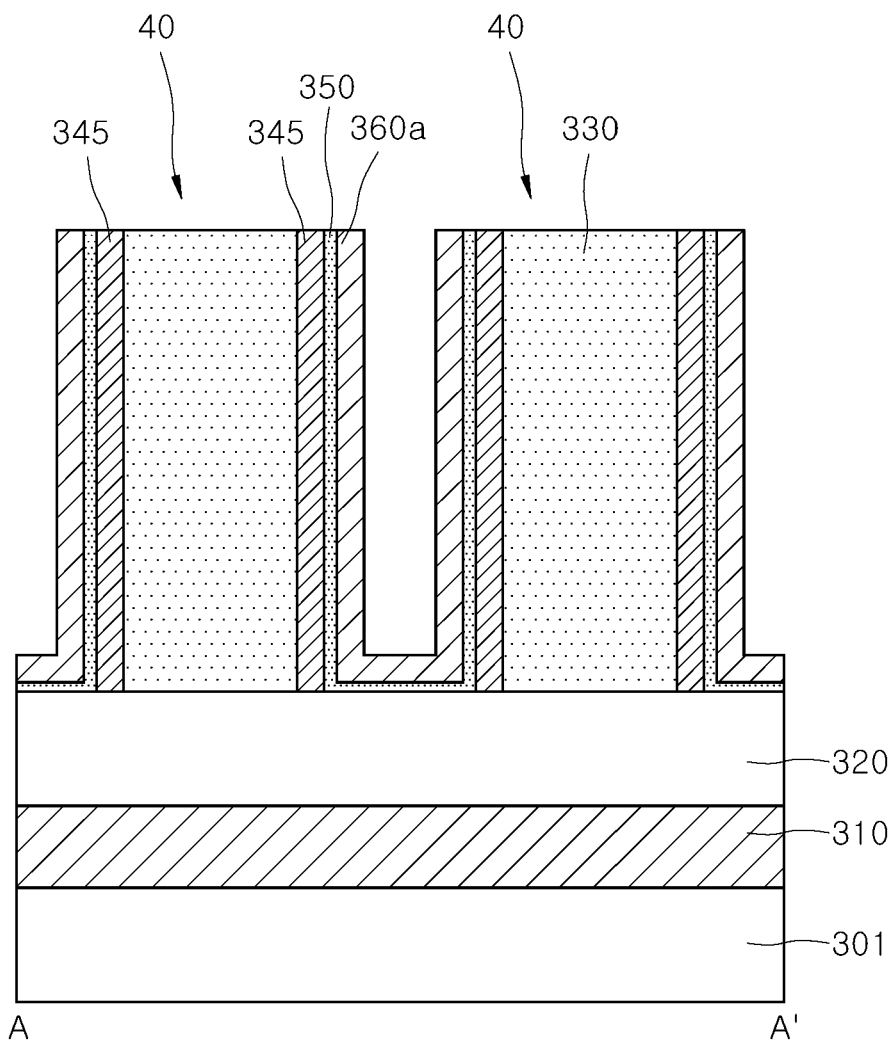

Referring to FIGS. 9A and 9B, a first dielectric material layer 350 may be formed to cover side surfaces of the plurality of channel structures 345, and to cover side surfaces of the plurality of insulation line structures 40, over the base insulation layer 310 and the bit line pattern layers 320. A thickness t1 of a portion of the first dielectric material layer 350 formed on the side surface of each of the plurality of channel structures 345 common to the bit line pattern layers 320 may be thinner than a thickness t1' of a portion formed on the side surface of each of the plurality of insulation line structures 40 common to the base insulation layer 310. The first dielectric material layer 350 may be made of substantially the same material as the first portions 150a1 and 150b1 of the first and second gate dielectric layers 150a and 150b of the semiconductor device 1 described above with respect to FIGS. 1A and 1B.

Next, a first gate conductive layer 360a may be formed on the first dielectric material layer 350. The first gate conductive layer 360a may be made of substantially the same material as the first gate first line pattern 160a1 and the second gate first line pattern 160b1 of the semiconductor device 1 described above with respect to FIGS. 1A and 1B.

Figure 10A:
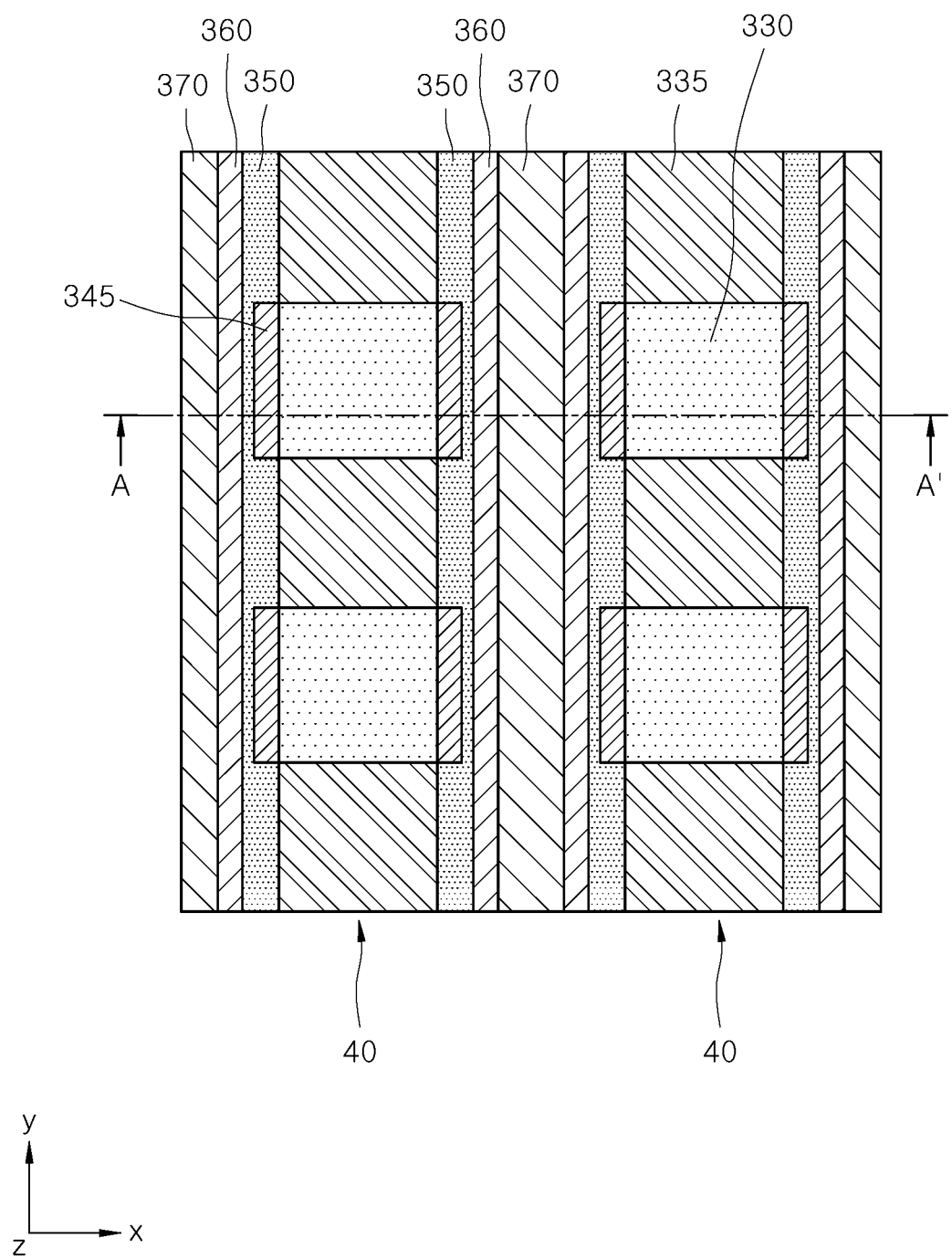
Figure 10B:
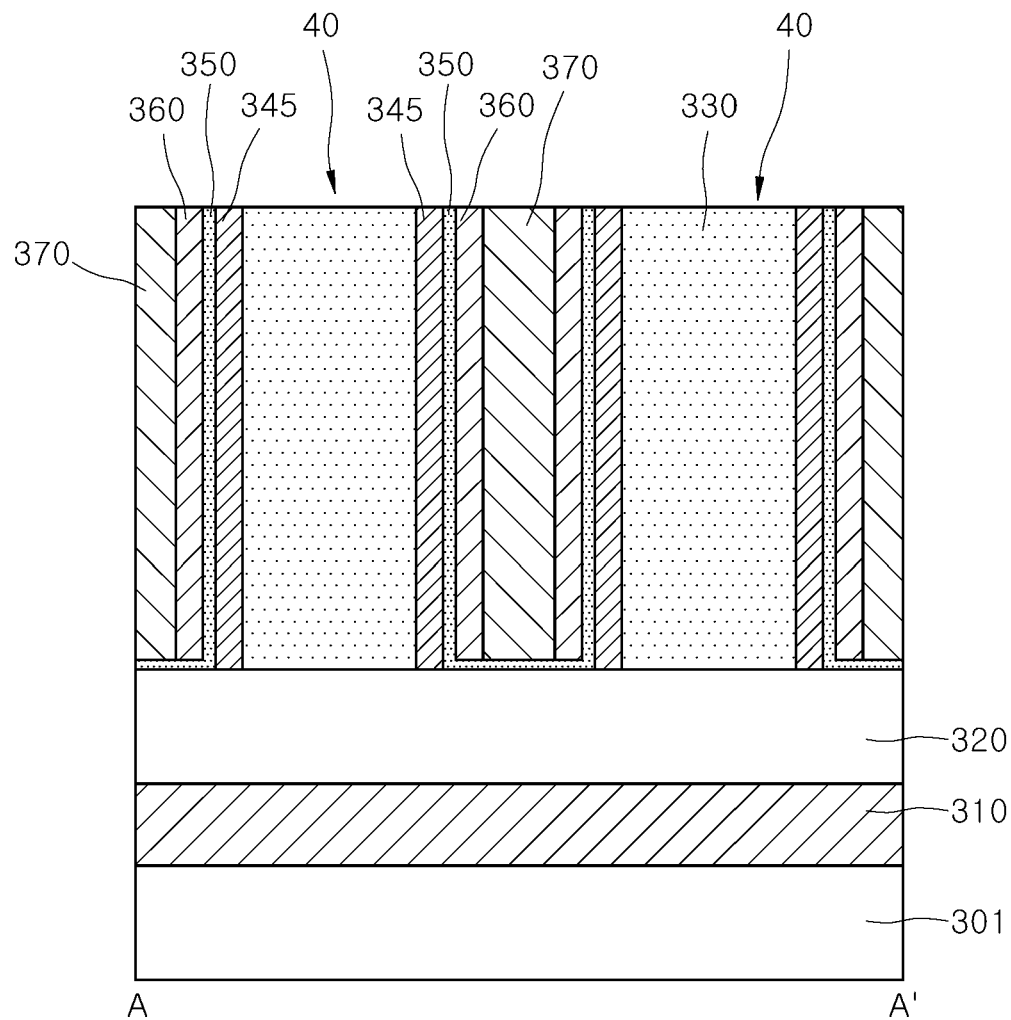

Referring to FIGS. 10A and 10B, the first gate conductive layer 360a may be selectively etched to form a plurality of first gate line pattern layers 360 respectively disposed to be common to both sides of each of the plurality of insulation line structures 40. The plurality of first gate line pattern layers 360 may each extend along the second lateral direction (i.e., y-direction).

Subsequently, a first filling insulation layer 370 may be formed to fill the spaces between the plurality of first gate line pattern layers 360. The first filling insulation layer 370 may be made of substantially the same material as the filling insulation layer 170 of the semiconductor device 1 described above with reference to FIGS. 1A and 1B.

Figure 11A:
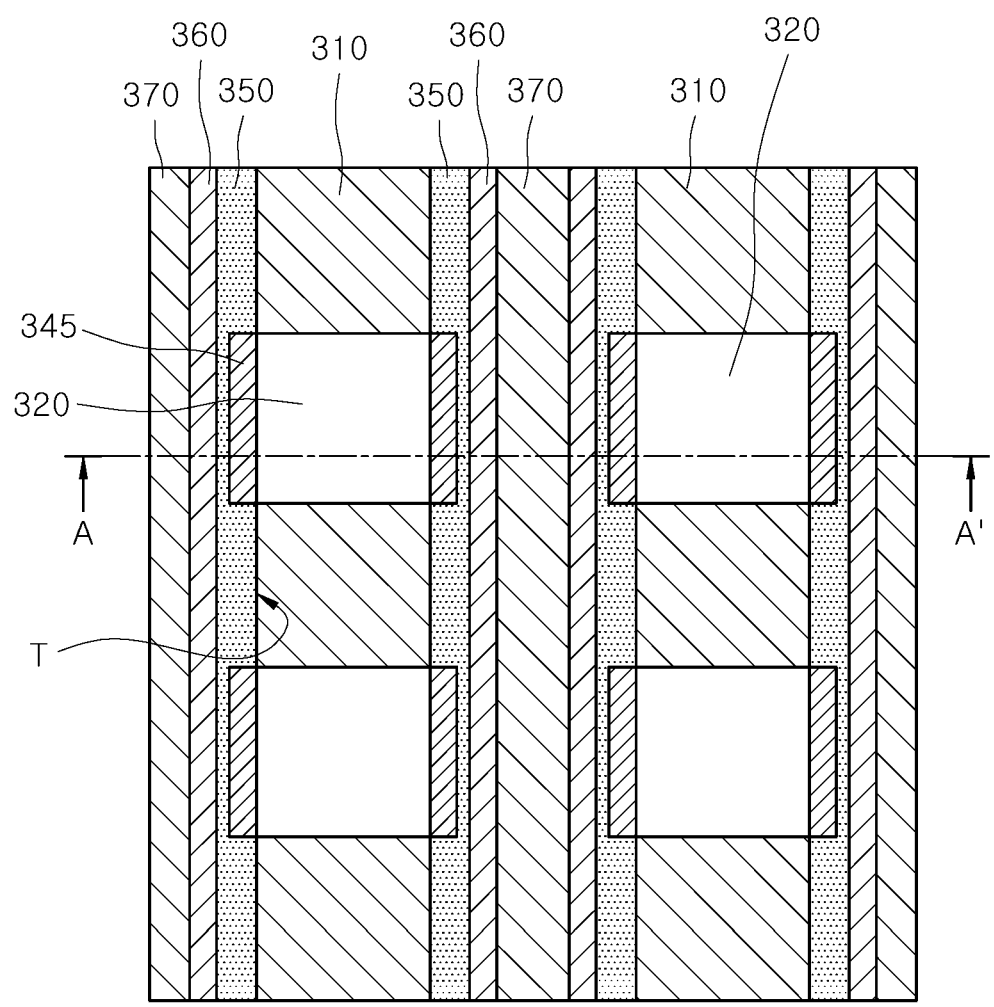
Figure 11B:
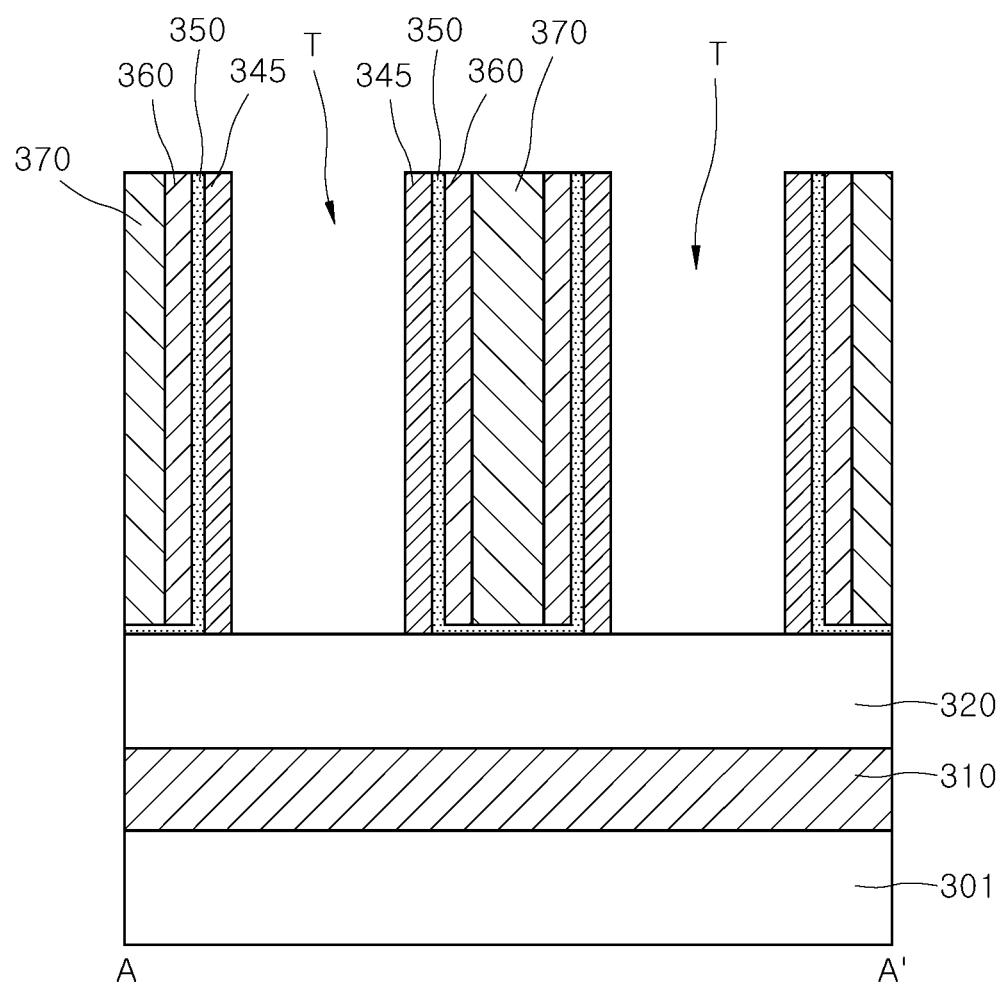

Referring to FIGS. 11A and 11B, the plurality of insulation line structures 40 may be removed over the base insulation layer 310 and the bit line pattern layer 320 to form trenches T. As a result, the plurality of channel structures 345 and the first dielectric material layer 350 may be selectively exposed to the sidewall surfaces of the trenches T, and the bit line pattern layer 320 and the base insulation layer 310 may be selectively exposed to the bottom surfaces of the trenches T.

Figure 12A:
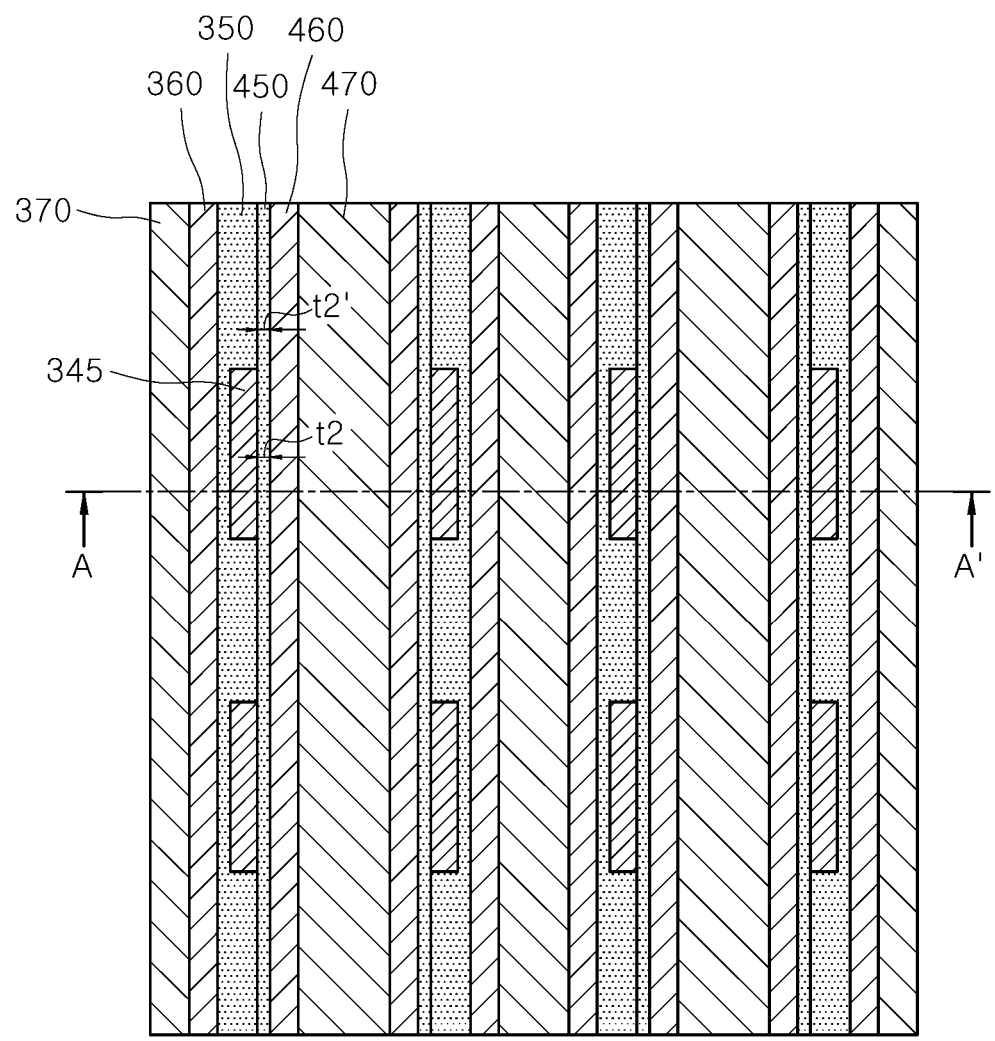
Figure 12B:
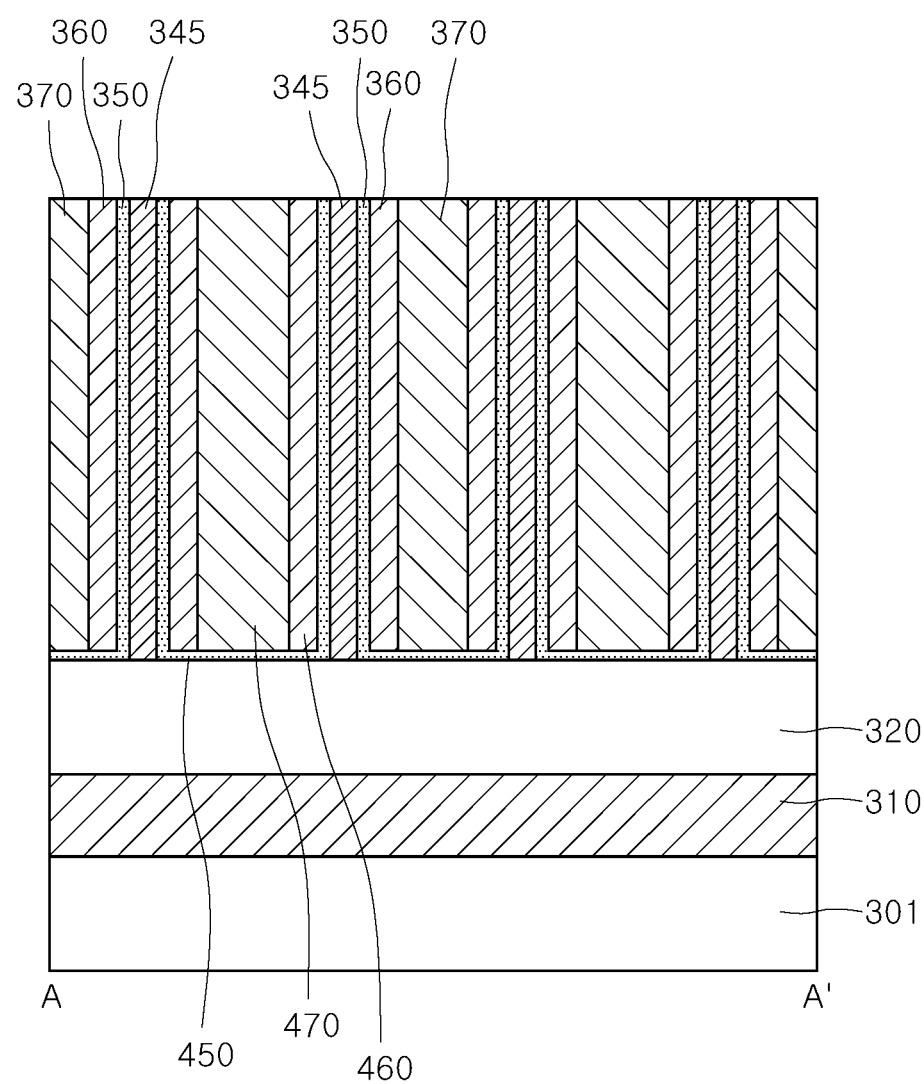

Referring to FIGS. 12A and 12B, a second dielectric material layer 450 may be formed to cover the exposed side surfaces of the plurality of channel structures 345 and the first dielectric material layer 350 over the bit line pattern layer 320 and the base insulation layer 310. A thickness t2 of a portion of the second dielectric material layer 450, formed on the side surface of each of the plurality of channel structures 345, may be substantially identical to a thickness t2' of a portion of the second dielectric material layer 450 formed on one surface of the first dielectric material layer 350. The second dielectric material layer 450 may be made of substantially the same material as the second portions 150a2 and 150b2 of the first and second gate dielectric layers 150a and 150b of the semiconductor device 1 described above with respect to FIGS. 1A and 1B.

Subsequently, a plurality of second gate line pattern layers 460 may be formed on the second dielectric material layer 450 to be adjacent to the side surfaces of the plurality of channel structures 345. The plurality of second gate line pattern layers 460 may be formed only on the second dielectric material layer 450 common to the sidewall surfaces of trenches T, and portions of the second dielectric material layer 450 over the bit line pattern layer 320 and the base insulation layer 310 may be exposed after forming the plurality of second gate line pattern layers 460. The plurality of second gate line pattern layers 460 may extend along the second lateral direction (i.e., y-direction). The plurality of second gate line pattern layers 460 may be made of substantially the same material as the first gate second line pattern 160a2 and the second gate second line pattern 160b2 of the semiconductor device 1 described above with respect to FIGS. 1A and 1B.

Referring to FIGS. 12A and 12B again, a second filling insulation layer 470 may be formed to fill spaces between the plurality of second gate line pattern layers 460. The second filling insulation layer 470 may be made of substantially the same material as the first filling insulation layer 370 described above with reference to FIGS. 10A and 10B. By performing the above-described processes, a semiconductor device including a plurality of channel structures according to an embodiment of the present disclosure can be fabricated. Subsequently, the processes of FIGS. 13A, 13B, 14A, and 14B may be additionally performed to form a capacitor device over the plurality of channel structures 345.

Figure 13A:
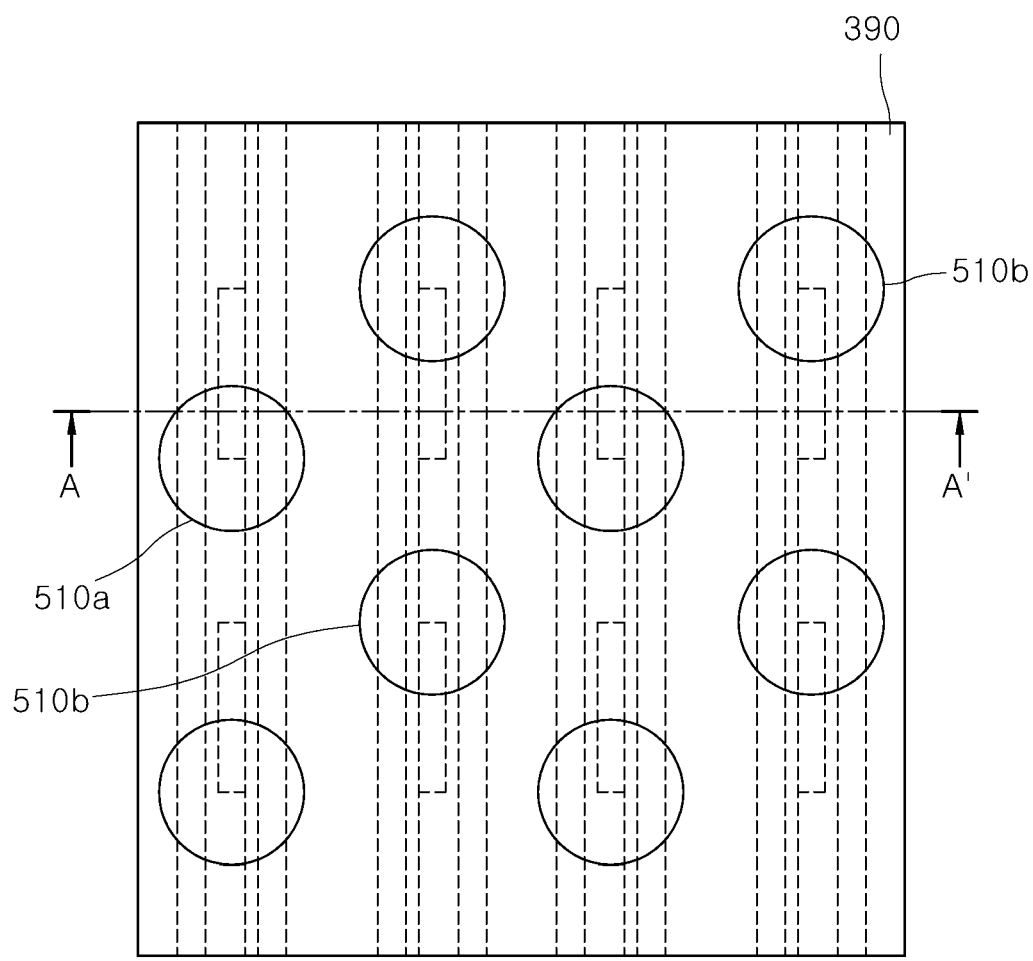
Figure 13B:
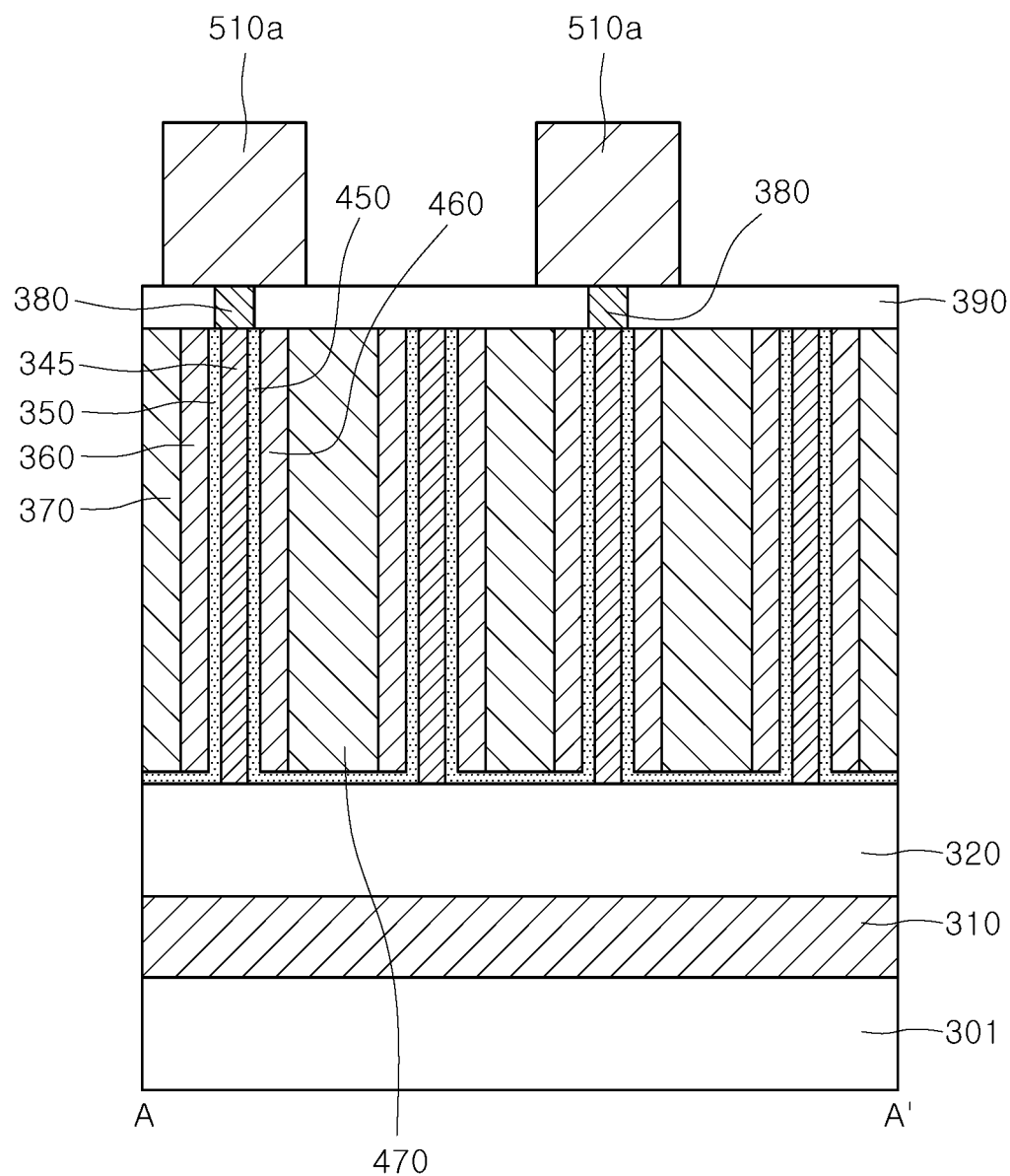

Referring to FIGS. 13A and 13B, contact plugs 380 may be formed on the plurality of channel structures 345. The contact plugs 380 may be electrically connected to the plurality of channel structures 345. The contact plugs 380 may be made of substantially the same material as the contact plugs 180 of the semiconductor device 2 described above with reference to FIGS. 3A and 3B. In addition, an interlayer insulation layer 390 may be formed in a lateral direction and cover a sidewall of the contact plugs 380. The interlayer insulation layer 390 may be made of or include, for example, oxide, nitride, oxynitride, or a combination of two or more thereof.

Subsequently, storage node electrode layers 510a and 510b may be formed on the contact plugs 380 and interlayer insulation layer 390. As illustrated in FIG. 13A, a first storage node electrode layer 510a and a second storage node electrode layer 510b may be respectively formed on a pair of channel structures 345 adjacent to each other in the first lateral direction (i.e., x-direction). The first storage node electrode layer 510a and the second storage node electrode layer 510b may be formed to be spaced apart from each other in a third lateral direction that is non-parallel, or at an angle, to the first lateral direction (i.e., x-direction) and the second lateral direction (i.e., y-direction). The first and second storage node electrode layers 510a and 510b may be made of substantially the same material as the first and second storage node electrode layers 210a and 210b of the semiconductor device 2 described above with reference to FIGS. 3A and 3B.

Figure 14A:
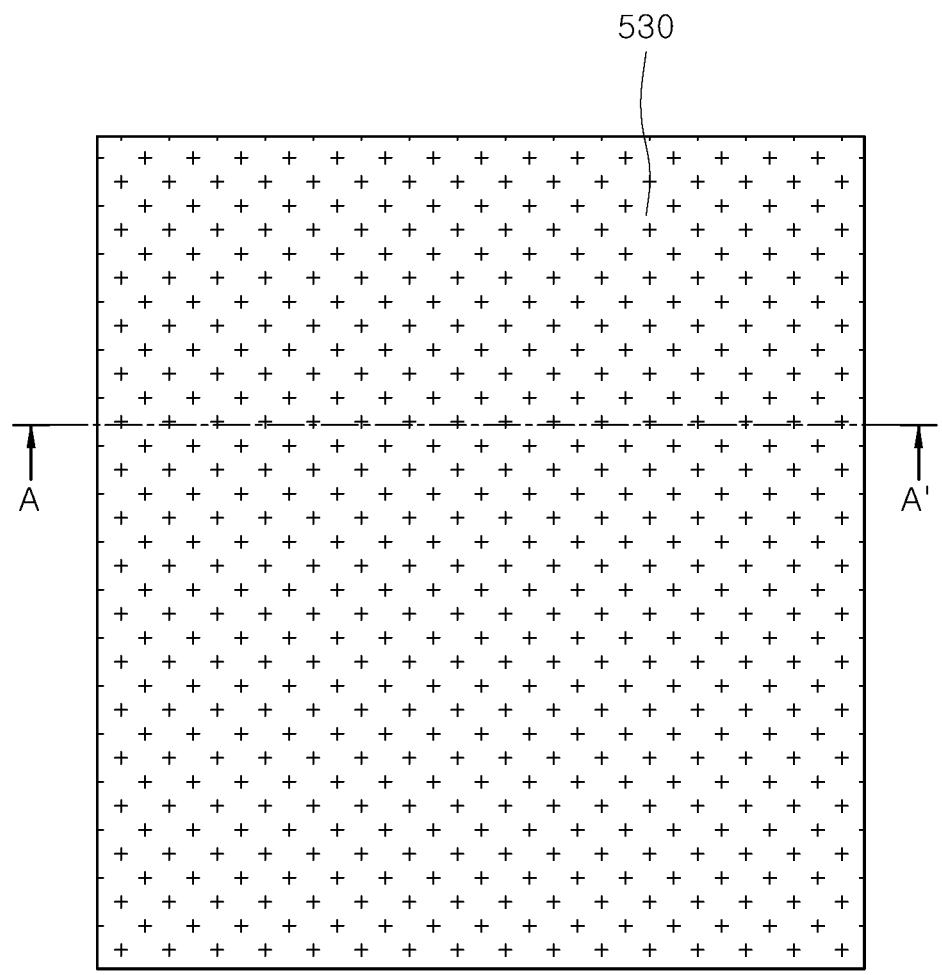
Figure 14B:
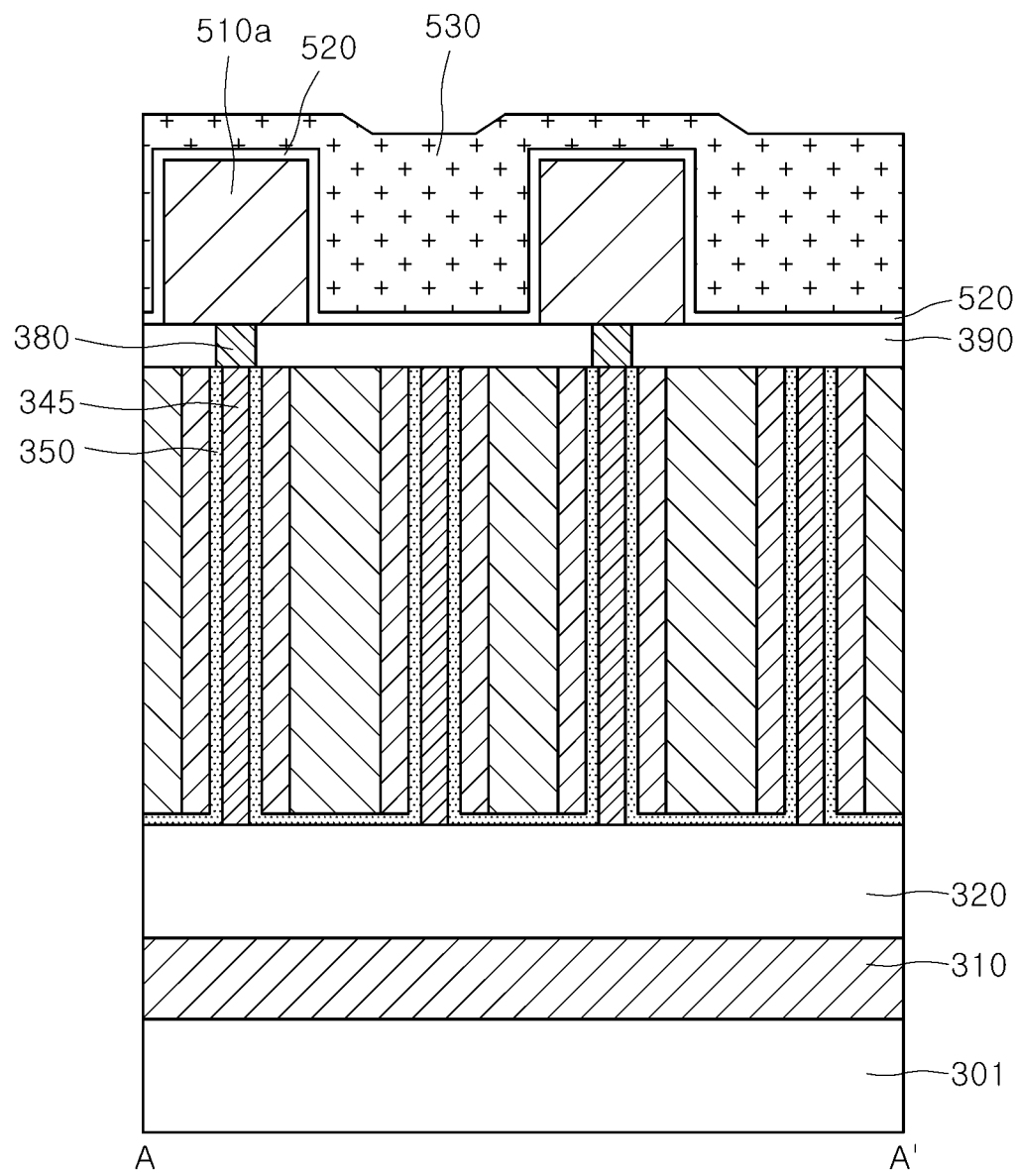

Referring to FIGS. 14A and 14B, a capacitor dielectric layer 520 may be formed on the first and second storage node electrode layers 510a and 510b. The capacitor dielectric layer 520 may be formed to cover the first and second storage node electrode layers 510a and 510b on the interlayer insulation layer 390. The capacitor dielectric layer 520 may be made of or include, for example, metal oxide such as aluminum oxide, hafnium oxide, zirconium oxide, and the like. Subsequently, a plate electrode layer 530 may be formed on the capacitor dielectric layer 520. The plate electrode layer 530 may be made of or include a conductive material.

Through the above-described processes, it is possible to fabricate a semiconductor device 2 having the plurality of channel structures and the capacitor devices illustrated in FIGS. 3A and 3B.

Figure 15A:
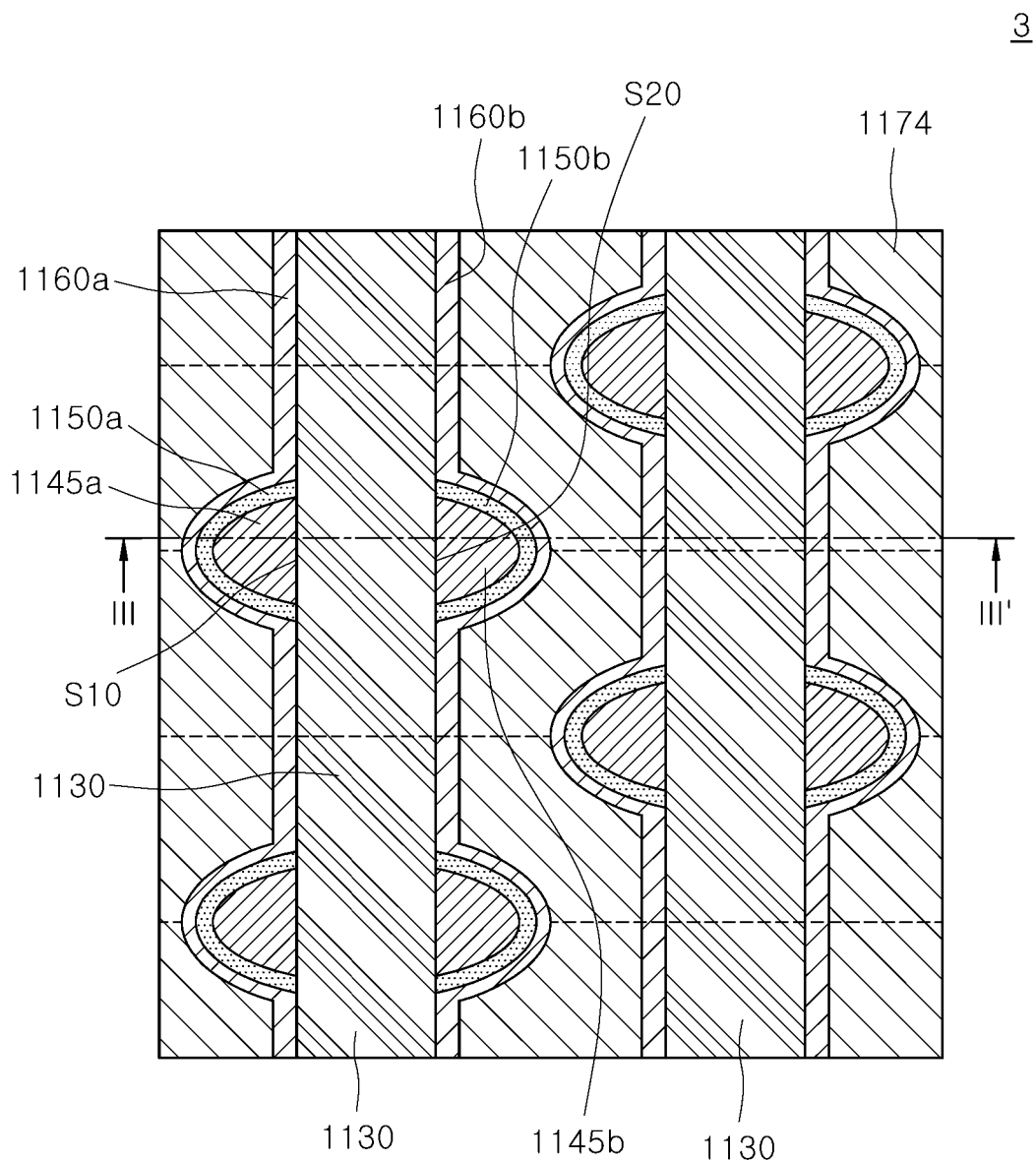
FIG. 15A is a plan view schematically illustrating a semiconductor device having a transistor device according to another embodiment of the present disclosure.
Figure 15B:
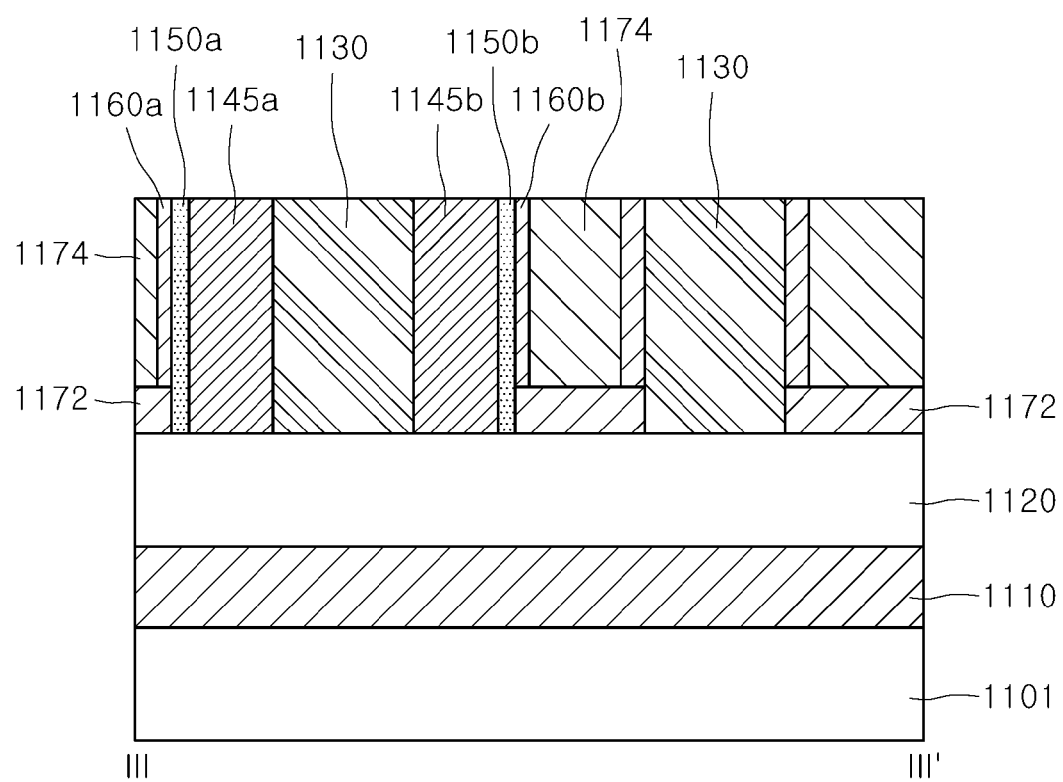
FIG. 15B is a cross-sectional view taken along a line III-III' of the semiconductor device of FIG. 15A.
Figure 16:
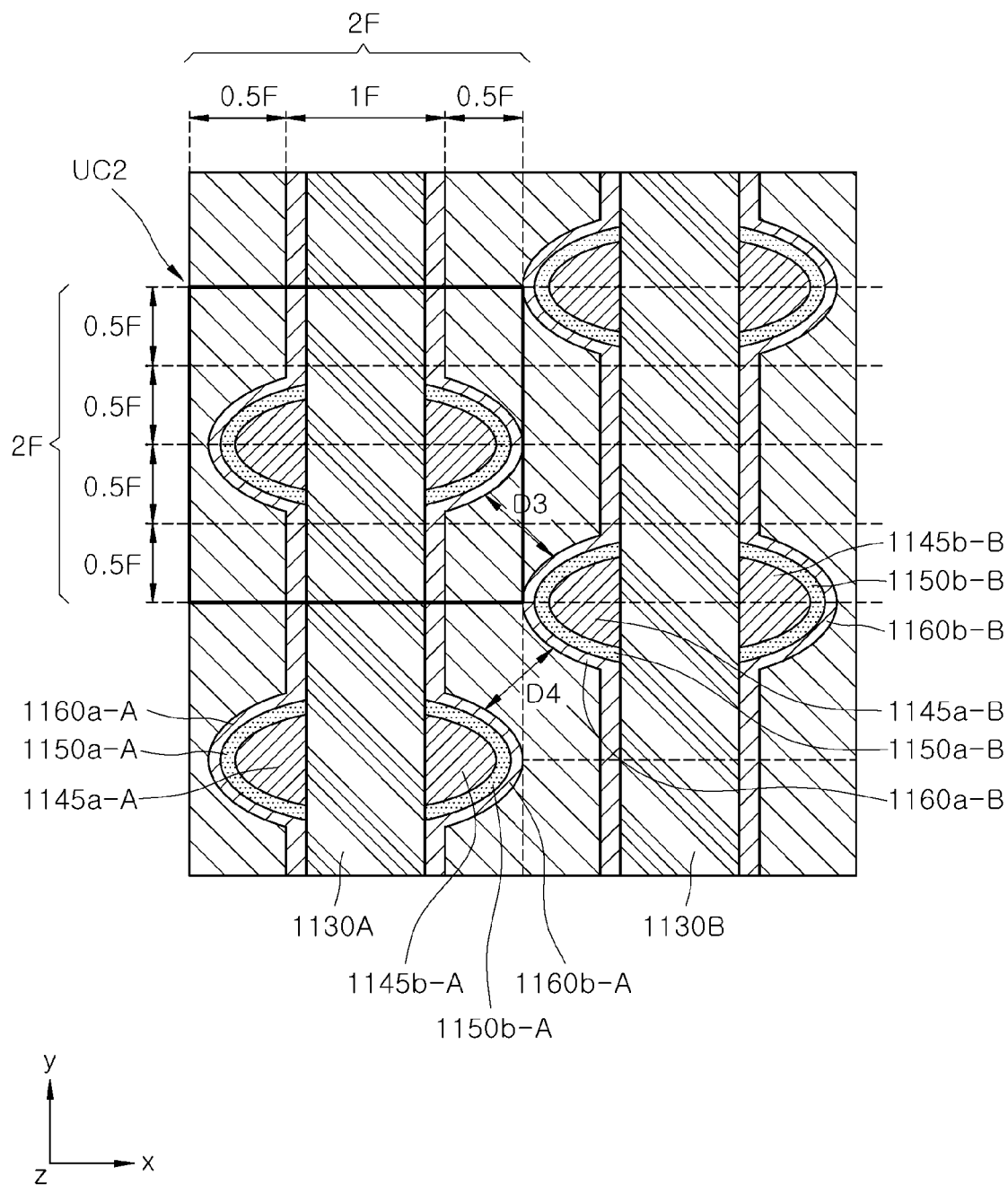
FIG. 16 is a schematic layout of the semiconductor device of FIG. 15A.

FIG. 15A is a plan view schematically illustrating a semiconductor device having a transistor device according to another embodiment of the present disclosure. FIG. 15B is a cross-sectional view taken along a line III-III' of the semiconductor device of FIG. 15A. FIG. 16 is a schematic layout of the semiconductor device of FIG. 15A.

Referring to FIGS. 15A and 15B, a semiconductor device 3 may include a bit line conductive layer 1120, an insulation line structure 1130, first and second channel structures 1145a and 1145b, first and second gate dielectric layers 1150a and 1150b, and first and second gate line conductive layers 1160a and 1160b. The first and second channel structures 1145a and 1145b may include conductive channels formed in inner regions adjacent to the first and second gate dielectric layers 1150a and 1150b, respectively. The formation of the conductive channels may be controlled by the first and second gate line conductive layers 1160a and 1160b. The conductive channels may be formed to extend in a direction (i.e., z-direction) perpendicular to a surface of a substrate 1101, so that when the semiconductor device 3 is operated, electric charges can be conducted in the z-direction from the bit line conductive layer 1120 through the conductive channels in first and second channel structures 1145a and 1145b.

The substrate 1101 may be made of or include a semiconductor material. The substrate 1101 may be substantially the same as the substrate 101 of the semiconductor device 1 described above with reference to FIGS. 1A and 1B. A base insulation layer 1110 may be disposed on the substrate 1101. The base insulation layer 1110 may be substantially the same as the base insulation layer 110 of the semiconductor device 1 described above with reference to FIGS. 1A and 1B.

Although not illustrated, an integrated circuit may be disposed between the substrate 1101 and the base insulation layer 1110. The integrated circuit may include, for example, an active device such as a transistor, a passive device such as a resistor and a capacitor, or a combination thereof. The integrated circuit may include at least one layer of circuit pattern layer and at least one insulation layer for insulating the circuit pattern layer.

The bit line conductive layer 1120 may be disposed on the base insulation layer 1110. The bit line conductive layer 1120 may extend in a first lateral direction (i.e., x-direction) substantially parallel to a surface of the base insulation layer 1110. The bit line conductive layer 1120 may be disposed in plurality by being spaced apart from each other in a second lateral direction (i.e., y-direction) perpendicular to the first lateral direction. The first and second lateral directions may be directions substantially parallel to the surface of the substrate 1101. The bit line conductive layer 1120 may be substantially the same as the bit line conductive layer 120 of the semiconductor device 1 described above with reference to FIGS. 1A and 1B.

An insulation line structure 1130 may be disposed over the base insulation layer 1110 to extend in the second lateral direction (i.e., y-direction). Some portions of the insulation line structure 1130 may be disposed directly over the base insulation layer 1110, and other portions of the insulation line structure 1130 may be disposed directly over the bit line conductive layer 1120. The insulation line structure 1130 may be disposed in plurality by being spaced apart from each other in the first lateral direction (i.e., x-direction). The insulation line structure 1130 may be made of or include an insulation material such as oxide, nitride, oxynitride, and the like.

Referring to FIG. 15A, the first and second channel structures 1145a and 1145b may be disposed to contact first and second side surfaces S10 and S20 of the insulation line structure 1130, respectively, over the base insulation layer 1110. Each of the first and second channel structures 1145a and 1145b may have a pillar-like shape extending in a vertical direction (i.e., z-direction) perpendicular to the first and second lateral directions and over the base insulation layer 1110. Some portions of each of the first and second channel structures 1145a and 1145b may be disposed directly over the base insulation layer 1110, and other portions of each of the first and second channel structures 1145a and 1145b may be disposed directly over the bit line conductive layer 1120. In other words, at least a portion of each of the first and second channel structures 1145a and 1145b may be disposed to overlap with the bit line conductive layer 1120 in the vertical direction. Accordingly, the first and second channel structures 1145a and 1145b may be electrically connected to the bit line conductive layer 1120.

Each of the first and second channel structures 1145a and 1145b may have a side surface having curvature. The first and second channel structures 1145a and 1145b may be disposed to protrude in opposite lateral directions away from the first and second side surfaces S10 and S20 of the insulation line structure 1130.

In an embodiment, at least a portion of the first channel structure 1145a and at least a portion of the second channel structure 1145b may be disposed to face each other in a first lateral direction (i.e., x-direction) with the insulation line structure 1130 therebetween. For example, in a plan view, the first and second channel structures 1145a and 1145b may be disposed symmetrically to each other, in the x-direction, with respect to the first insulation line structure 1130.

Referring to FIGS. 15A and 15B, first and second gate dielectric layers 1150a and 1150b may be disposed over the base insulation layer 1110 to surround side surfaces of the first and second channel structures 1145a and 1145b, respectively. The first and second gate dielectric layers 1150a and 1150b may be made of substantially the same material as the first and second gate dielectric layers 150a and 150b of the semiconductor device 1 described above with reference to FIGS. 1A and 1B.

First and second gate line conductive layers 1160a and 1160b respectively extending in the second lateral direction (i.e., y-direction) may be disposed over the base insulation layer 1110. The first and second gate line conductive layers 1160a and 1160b may be disposed to respectively cover at least a portion of the first and second gate dielectric layers 1150a and 1150b.

Referring to FIG. 15B, an interlayer insulation layer 1172 may be disposed between the first and second gate line conductive layers 1160a and 1160b and the bit line conductive layer 1120. The interlayer insulation layer 1172 may serve to prevent the first and second gate line conductive layers 1160a and 1160b and the bit line conductive layer 1120 from being electrically shorted to each other.

Referring to FIGS. 15A and 15B, a filling insulation layer 1174 may be disposed to fill spaces between the first and second gate line conductive layers 1160a and 1160b. The filling insulation layer 1174 may be made of or include an insulation material. The insulation material may include, for example, oxide, nitride, oxynitride, or a combination of two or more thereof.

FIG. 16 is a view schematically illustrating a layout of the semiconductor device of FIG. 15A. Referring to FIGS. 15A and 16 together, a unit cell UC2 of the semiconductor device 3 may have a $4F^2$ layout. In the unit cell UC2, a pair of channel structures and a pair of gate line conductive layers that are electrically separated from each other may be disposed. As a result, a pair of independently driven transistor devices may be implemented in the unit cell UC2.

Referring to FIG. 16, as an example of a pair of insulation line structures adjacent to each other, a first insulation line structure 1130A and a second insulation line structure 1130B are disclosed. A first insulation line first channel structure 1145a-A, a first insulation line first gate dielectric layer 1150a-A, and a first insulation line first gate line conductive layer 1160a-A may be disposed on one side surface of the first insulation line structure 1130A. A first insulation line second channel structure 1145b-A, a first insulation line second gate dielectric layer 1150b-A, and a first insulation line second gate line conductive layer 1160b-A may be disposed on another side surface of the first insulation line structure 1130A.

Likewise, a second insulation line first channel structure 1145a-B, a second insulation line first gate dielectric layer 1150a-B, and a second insulation line first gate line conductive layer 1160a-B may be disposed on one side surface of the second insulation line structure 1130B. A second insulation line second channel structure 1145b-B, a second insulation line second gate dielectric layer 1150b-B, and a second insulation line second gate line conductive layer 1160b-B may be disposed on another side surface of the second insulation line structure 1130B.

As illustrated in FIG. 16, the first insulation line second channel structure 1145b-A may be disposed to be spaced apart from the second insulation line first channel structure 1145a-B in a third lateral direction (D3 direction or D4 direction) that is non-parallel to the first and second lateral directions. Likewise, the first insulation line first channel structure 1145a-A may be disposed to be spaced apart from a second channel structure of another adjacent insulation line structure in the third lateral direction. The second insulation line second channel structure 1145b-B may be disposed to be spaced apart from a first channel structure of another adjacent insulation line structure in the third lateral direction.

Figure 17A:
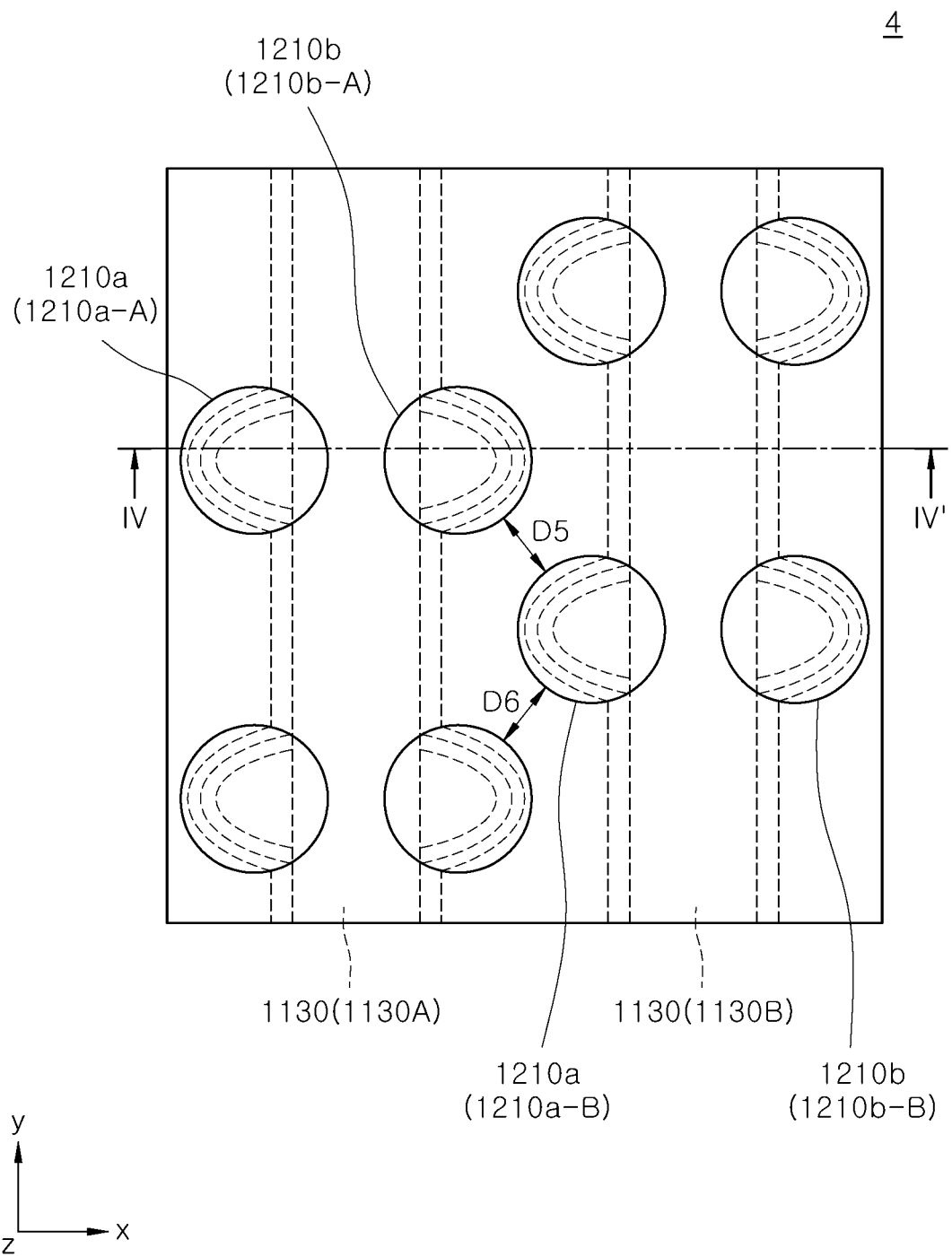
FIG. 17A is a plan view schematically illustrating a semiconductor device having a transistor device and a storage node electrode layer according to another embodiment of the present disclosure.
Figure 17B:
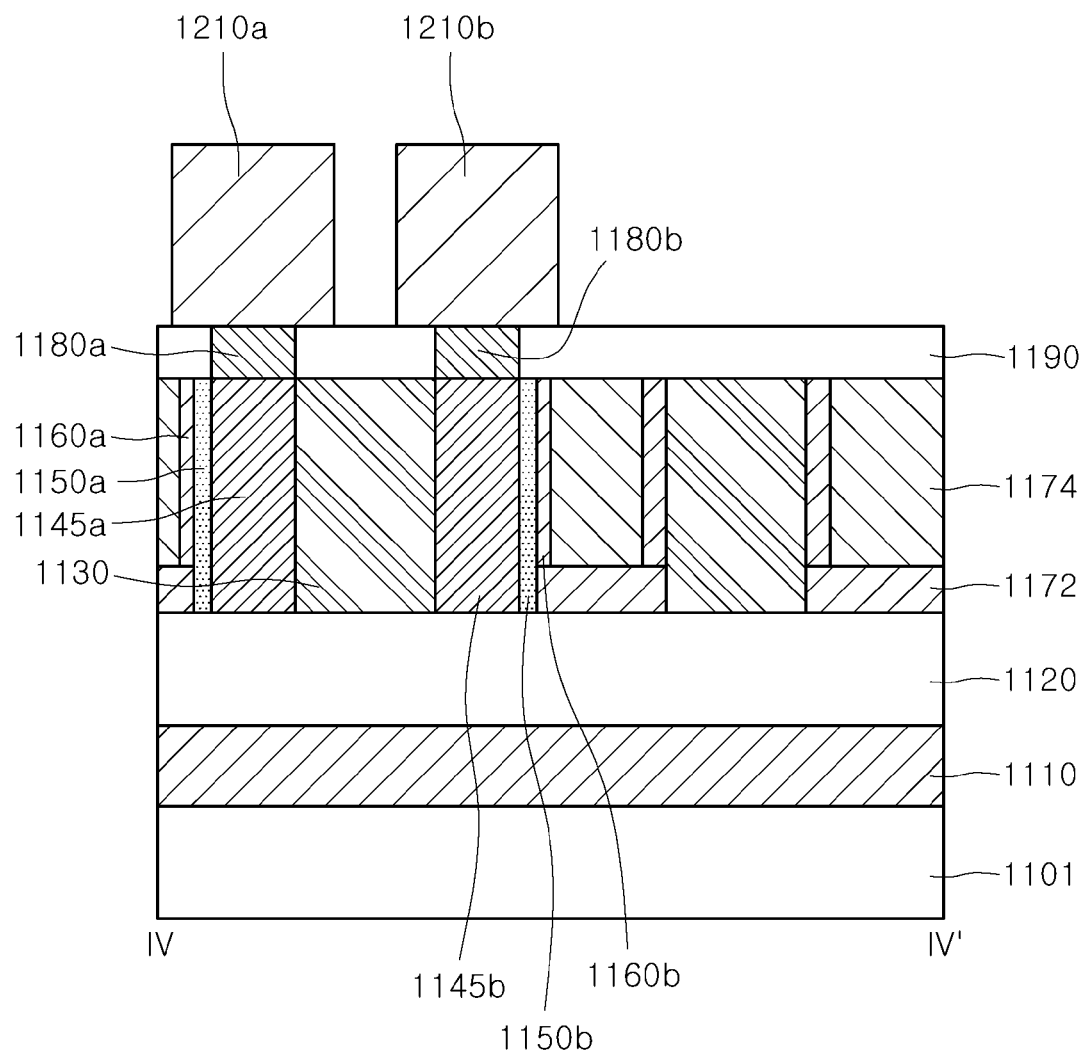
FIG. 17B is a cross-sectional view taken along a line IV-IV' of the semiconductor device of FIG. 17A.

FIG. 17A is a plan view schematically illustrating a semiconductor device having a transistor device and a storage node electrode layer according to another embodiment of the present disclosure. FIG. 17B is a cross-sectional view taken along a line IV-IV' of the semiconductor device of FIG. 17A. A semiconductor device 4 of FIGS. 17A and 17B may have a structure in which a storage node electrode layer is disposed over a semiconductor device 3 of FIGS. 15A, 15B, and 16.

Referring to FIGS. 17A and 17B, first and second storage node electrode layers 1210a and 1210b may be disposed over the first and second channel structures 1145a and 1145b, respectively. The first and second storage node electrode layers 1210a and 1210b may be electrically connected to the corresponding first and second channel structures 1145a and 1145b through contact plugs 1180a and 1180b, respectively. The contact plugs 1180a and 1180b and the storage node electrode layers 1210a and 1210b may each be made of or include a conductive material. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. An interlayer insulation layer 1190 may be disposed on the side surfaces of the contact plugs 1180a and 1180b.

Referring to FIGS. 16 and 17A together, a first storage node electrode layer 1210a-A disposed over the first insulation line first channel structure 1145a-A and a second storage node electrode layer 1210b-A disposed over the first insulation line second channel structure 1145b-A may be disposed to be spaced apart from each other in the first lateral direction (i.e., x-direction). Likewise, a first storage node electrode layer 1210a-B disposed over the second insulation line first channel structure 1145a-B and a second storage node electrode layer 1210b-B disposed over the second insulation line second channel structure 1145b-B may be disposed to be spaced apart from each other in the first lateral direction (i.e., x-direction).

In addition, the second storage node electrode layer 1210b-A disposed over the first insulation line second channel structure 1145b-A and the first storage node electrode layer 1210a-B disposed over the second insulation line first channel structure 1145a-B may be disposed to be spaced apart from each other in the third lateral direction (i.e., D5 direction or D6 direction) that is non-parallel to the first and second lateral directions. For example, in a plan view, the second storage node electrode layers 1210b-A and the first storage node electrode layers 1210a-B are disposed in a zig-zag pattern in the y-direction.

As described above, over the top of the channel structures disposed on the side surfaces of different insulation line structures, the first storage node electrode layers and the second storage node electrode layers disposed adjacent to each other may be disposed to be spaced apart from each other in the third lateral direction.

Although not illustrated in FIGS. 17A and 17B, the semiconductor device 4 may further include a capacitor dielectric layer disposed on the first and second storage node electrode layers 1210a and 1210b, and a plate electrode layer disposed on the capacitor dielectric layer. The capacitor dielectric layer may be disposed to cover the first and second storage node electrode layers 1210a and 1210b, respectively, and may have substantially the same structure as the structure of the cross-sectional view of FIG. 24B to be described later. The plate electrode layer may be disposed to cover the capacitor dielectric layer, and may function as a common electrode.

Meanwhile, the first storage node electrode layer 1210a, the capacitor dielectric layer, and the plate electrode layer that are electrically connected to the first channel structure 1145a may constitute a first capacitor device. The second storage node electrode layer 1210b, the capacitor dielectric layer, and the plate electrode layer that are electrically connected to the second channel structure 1145b may constitute a second capacitor device. The first capacitor device and the second capacitor device may independently store signal information.

As described above, embodiments of the present disclosure can provide semiconductor devices including transistor devices each having a pair of channel structures. In addition, embodiments of the present disclosure can provide semiconductor devices each having a pair of capacitor devices electrically connected to the pair of channel structures. The semiconductor devices may include a pair of transistor devices and a pair of capacitor devices that operate independently of each other in a $4F^2$ unit cell layout, thereby improving device integration.

FIGS. 18A to 24A are plan views schematically illustrating a method of fabricating a semiconductor device according to another embodiment of the present disclosure, and FIGS. 18B to 24B are cross-sectional views taken along a line B-B' of the semiconductor device of FIGS. 18A to 24A, respectively. In an embodiment, a method of fabricating the semiconductor device to be described in connection with FIGS. 18A to 24A and FIGS. 18B to 24B can be applied to a method of fabricating a semiconductor device 3 described above with reference to FIGS. 15A, 15B, and 16, and a method of fabricating a semiconductor device 4 described above with reference to FIGS. 17A and 17B.

Figure 18A:
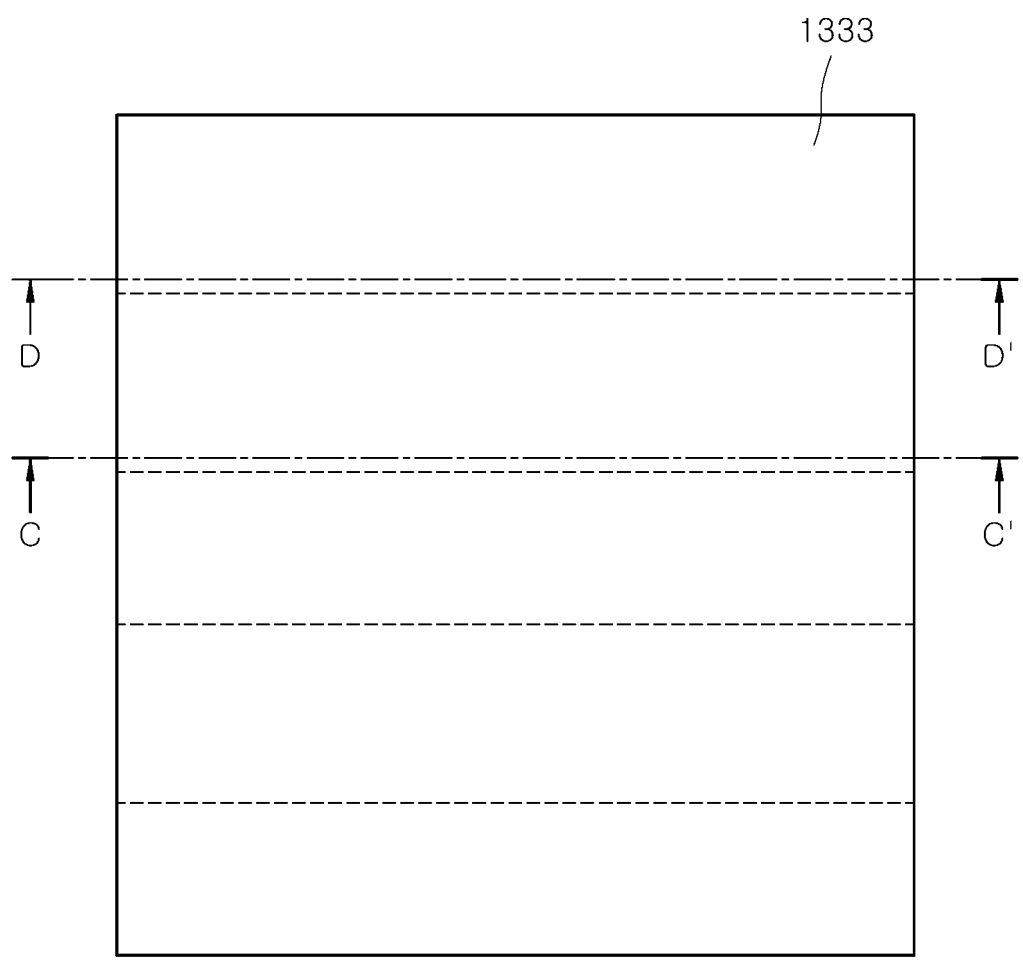
Figure 18B:
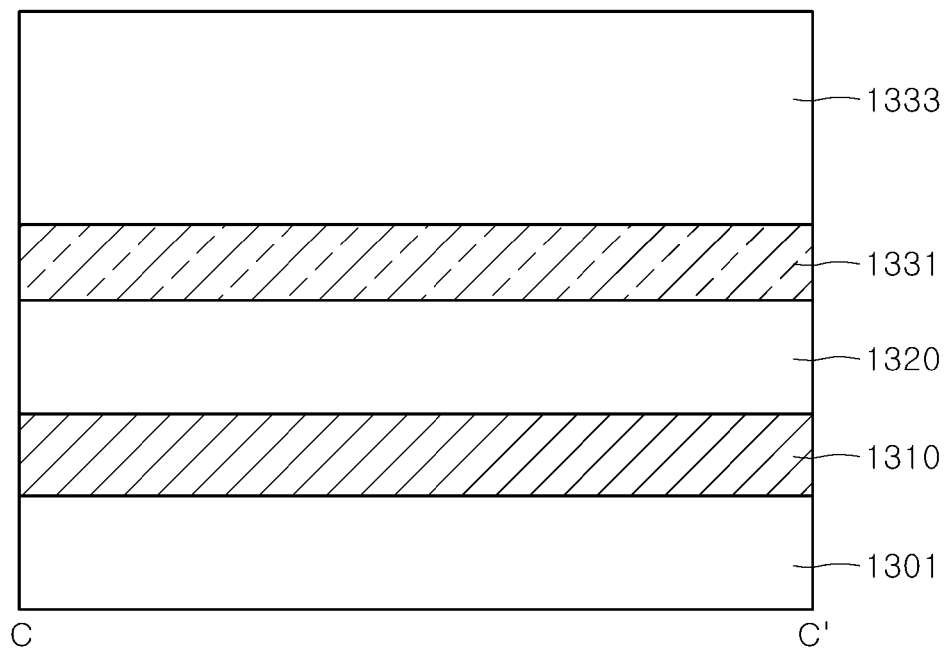
Figure 18C:
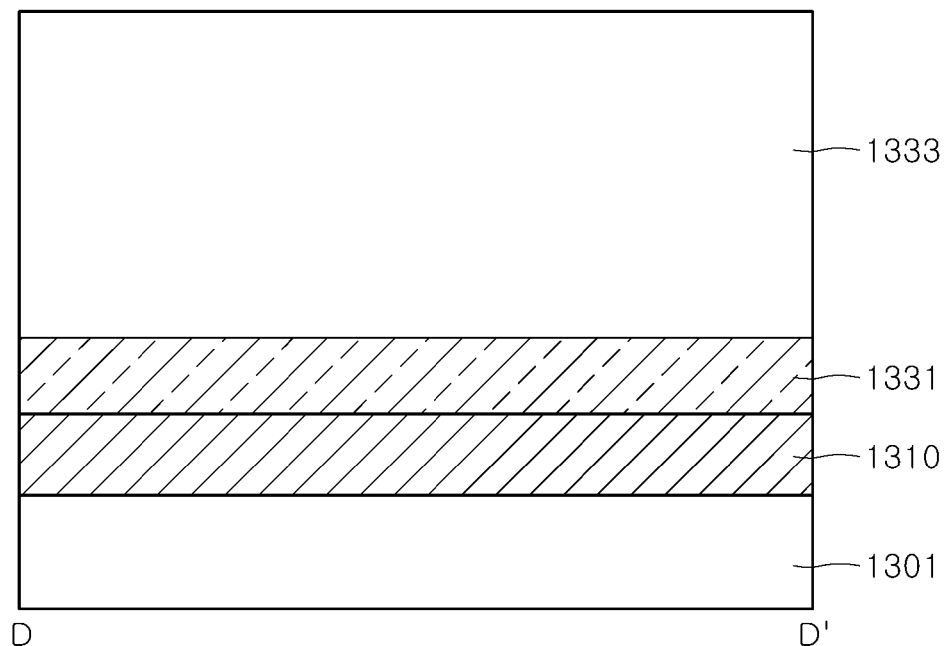

Referring to FIGS. 18A and 18B, a substrate 1301 may be provided. The substrate 1301 may be substantially the same as the substrate 1101 described above with reference to FIGS. 15A and 15B.

A base insulation layer 1310 may be formed on the substrate 1301. The base insulation layer 1310 may be made of or include an insulation material. The insulation material may include, for example, oxide, nitride, oxynitride, or a combination of two or more thereof.

Although not illustrated, an integrated circuit may be disposed between the substrate 1301 and the base insulation layer 1310. The integrated circuit may include, for example, an active device such as a transistor, a passive device such as a resistor and a capacitor, or a combination thereof. The integrated circuit may include at least one circuit pattern layer, and at least one insulation layer for insulating the at least one circuit pattern layer.

Next, a conductive material layer may be formed on the base insulation layer 1310, and the conductive material layer may be patterned to form a plurality of bit line conductive layers 1320. The plurality of bit line conductive layers 1320 may extend in a first lateral direction (i.e., x-direction) that is substantially parallel to a surface of the base insulation layer 1310, and may be disposed to be spaced apart from each other in a second lateral direction (i.e., y-direction) perpendicular to the first lateral direction. The first and second lateral directions may be directions substantially parallel to a surface of the substrate 1301.

Subsequently, a first insulation layer 1331 covering the plurality of bit line conductive layers 1320 may be formed over the base insulation layer 1310, and a second insulation layer 1333 may be formed on the first insulation layer 1331. The first insulation layer 1331 and the second insulation layer 1333 may have an etching selectivity to each other.

The plurality of bit line conductive layers 1320 may be made of substantially the same material as the bit line conductive layer 1120 of the semiconductor device 3 described above with reference to FIGS. 15A and 15B.

Figure 19A:
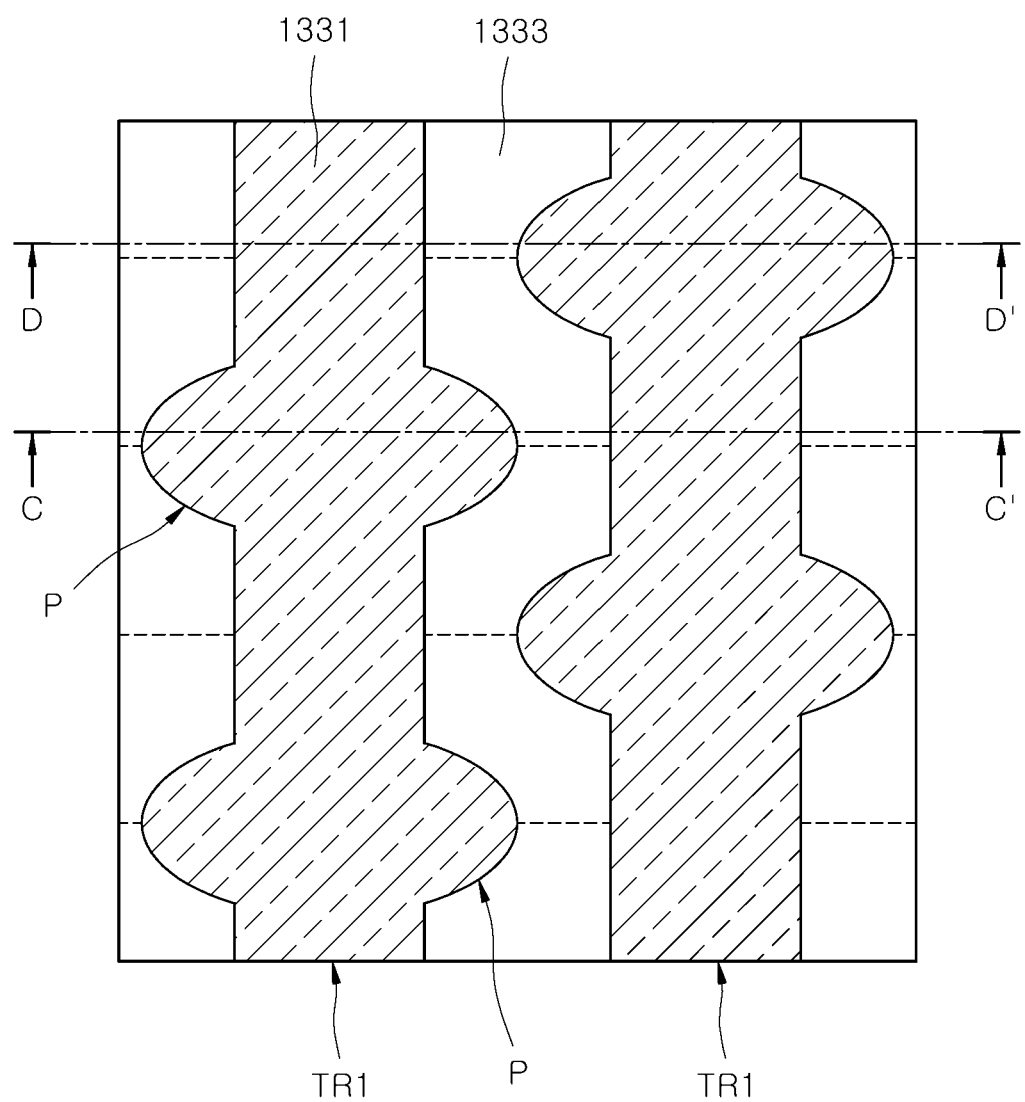
Figure 19B:
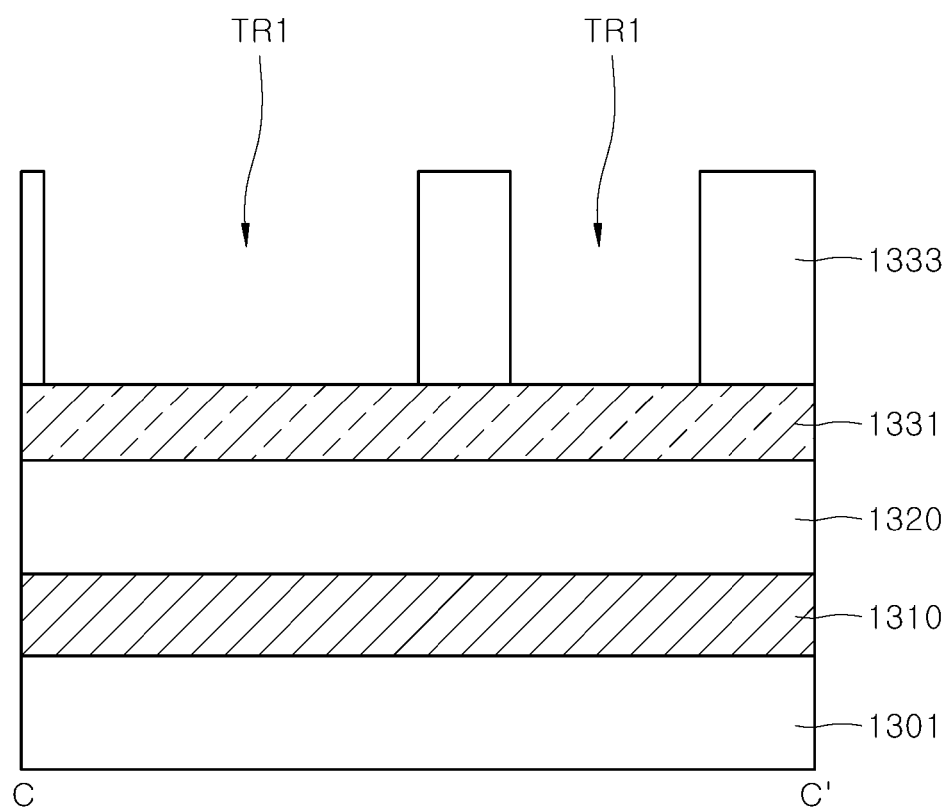
Figure 19C:
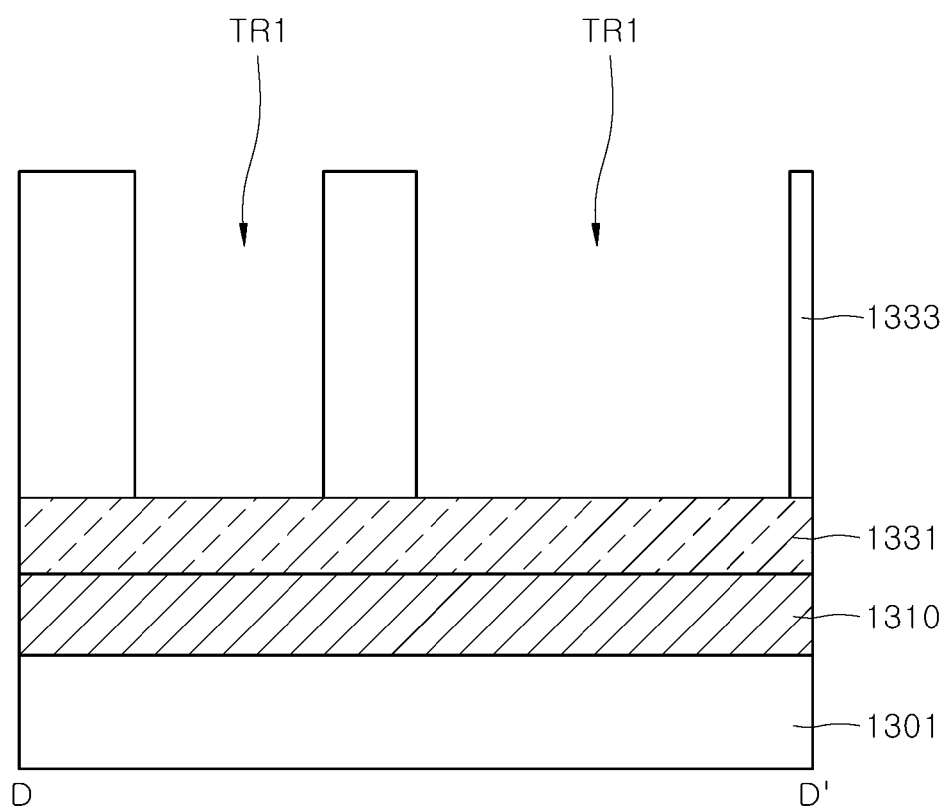

Referring to FIGS. 19A and 19B, the second insulation layer 1333 may be selectively etched over the base insulation layer 1310 to form a plurality of first trench line patterns TR1 extending along the second lateral direction (i.e., y-direction) and spaced apart from each other in the first lateral direction (i.e., x-direction). As a process for selectively etching the second insulation layer 1333, an etching method using an etching selectivity with the first insulation layer 1331 may be applied. Each of the plurality of first trench line patterns TR1 may have a protruding pattern portion P extending in a direction (e.g., x-direction) that is non-parallel to the second lateral direction (i.e., y-direction). As an example, as illustrated in FIG. 19A, the protruding pattern portion P may protrude in the first lateral direction (i.e., x-direction). In addition, the protruding pattern portion P of one first trench line pattern from among the plurality of first trench line patterns TR1 may be spaced apart from the protruding pattern portion P of another neighboring first trench line pattern in a direction non-parallel to the first and second lateral directions.

Figure 20A:
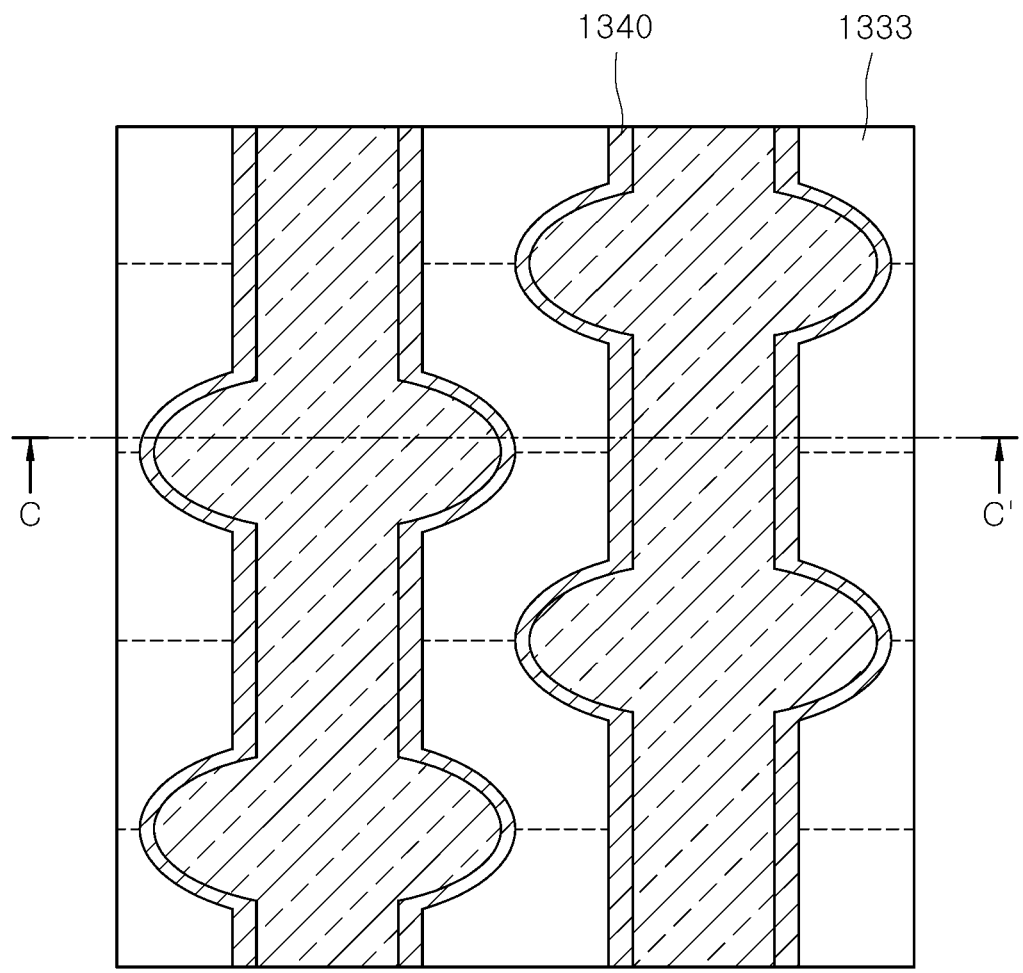
Figure 20B:
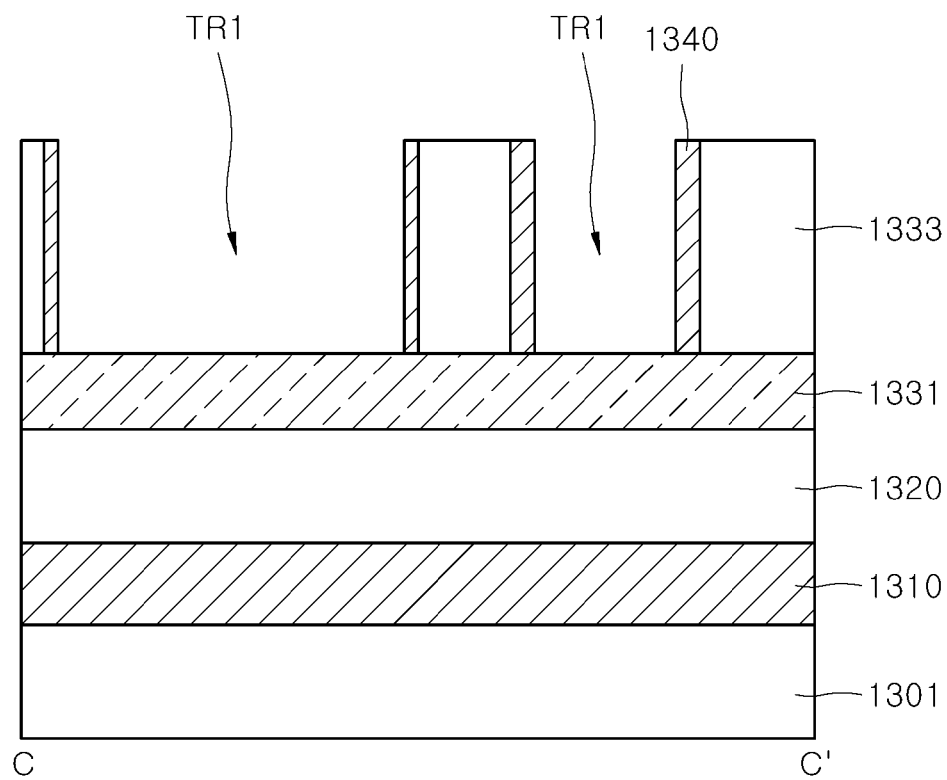

Referring to FIGS. 20A and 20B, a gate line conductive layer 1340 may be formed on side surfaces of the first trench line patterns TR1. The gate line conductive layers 1340 may be made of substantially the same material as the first and second gate line conductive layers 1160*a* and 1160*b* of the semiconductor device 3 described above in connection with FIGS. 15A and 15B.

Figure 21A:
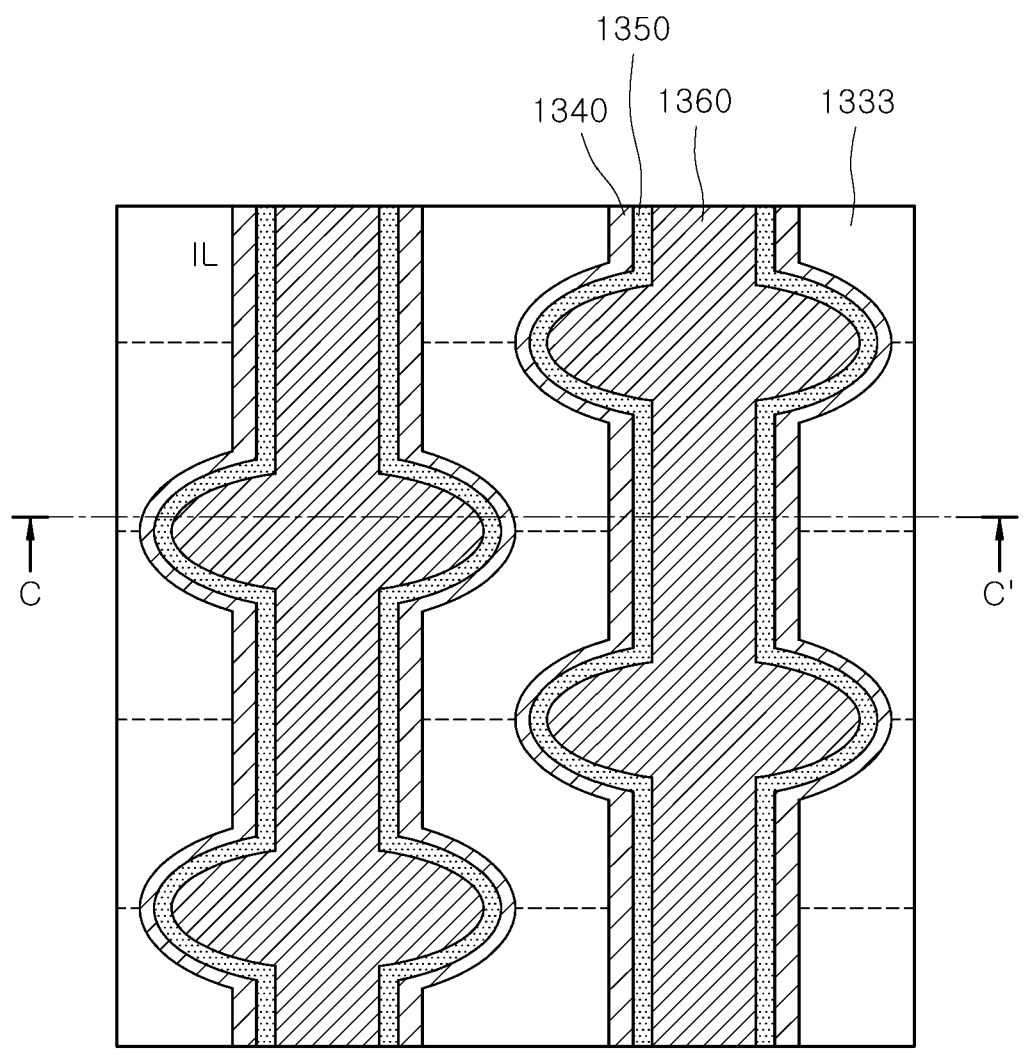
Figure 21B:
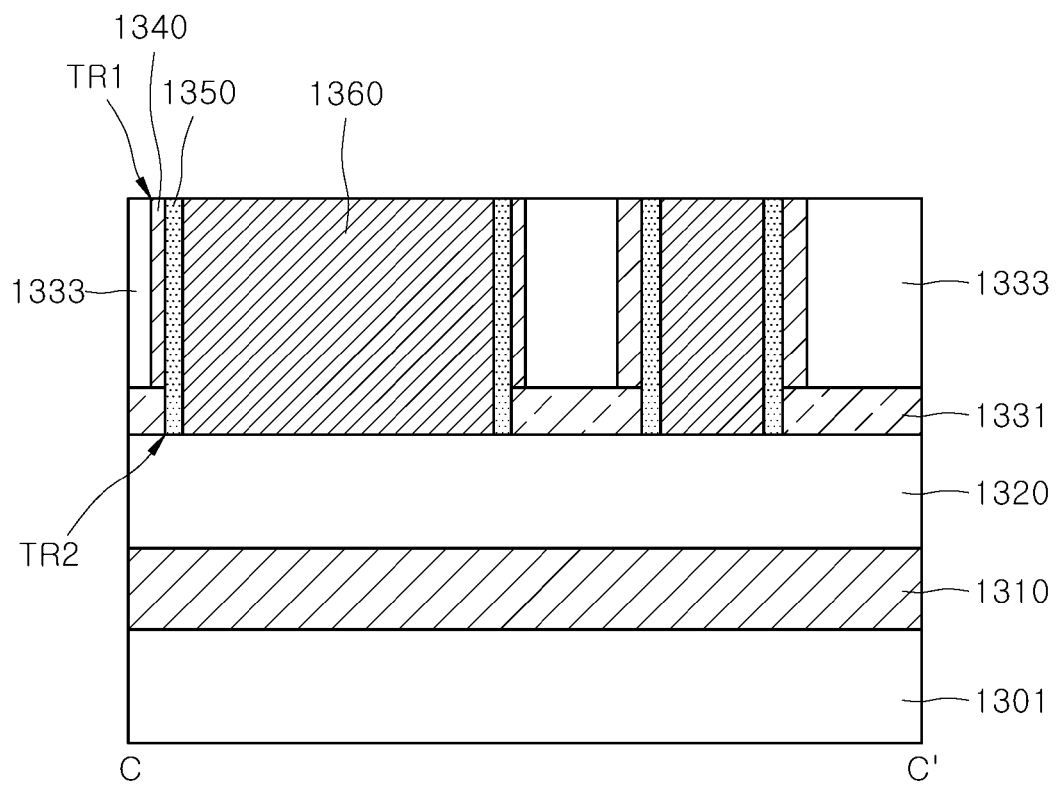

Referring to FIGS. 21A and 21B, the first insulation layer 1331 inside the plurality of first trench line patterns TR1 may be etched over the base insulation layer 1310 to form a plurality of second trench line patterns TR2. The plurality of second trench line patterns TR2 may selectively expose the bit line conductive layers 1320 and the base insulation layer 1310.

Subsequently, a dielectric material layer 1350 may be formed on side surfaces of the gate line conductive layers 1340 and side surfaces of the first insulation layer 1331, which are side surfaces of the plurality of second trench line patterns TR2. The dielectric material layer 1350 may be made of substantially the same material as the first and second gate dielectric layers 1150*a* and 1150*b* of the semiconductor device 3 described above in connection with FIGS. 15A and 15B. Next, the insides of the plurality of first and second trench line patterns TR1 and TR2 may be filled with a channel material to form a channel material layer 1360. The channel material layer 1360 may be made of substantially the same material as the first and second channel structures 1145*a* and 1145*b* of the semiconductor device 3 described above with reference to FIGS. 15A and 15B.

Figure 22A:
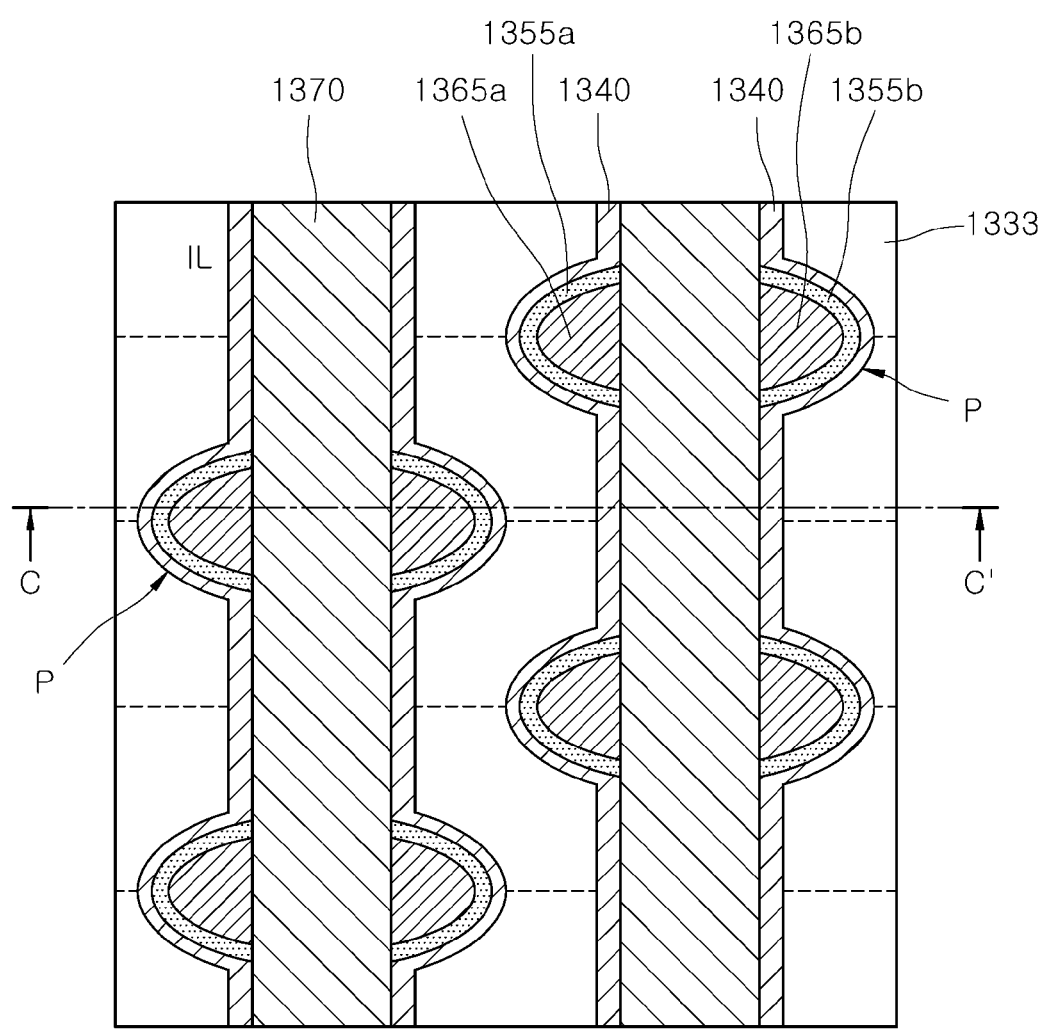
Figure 22B:
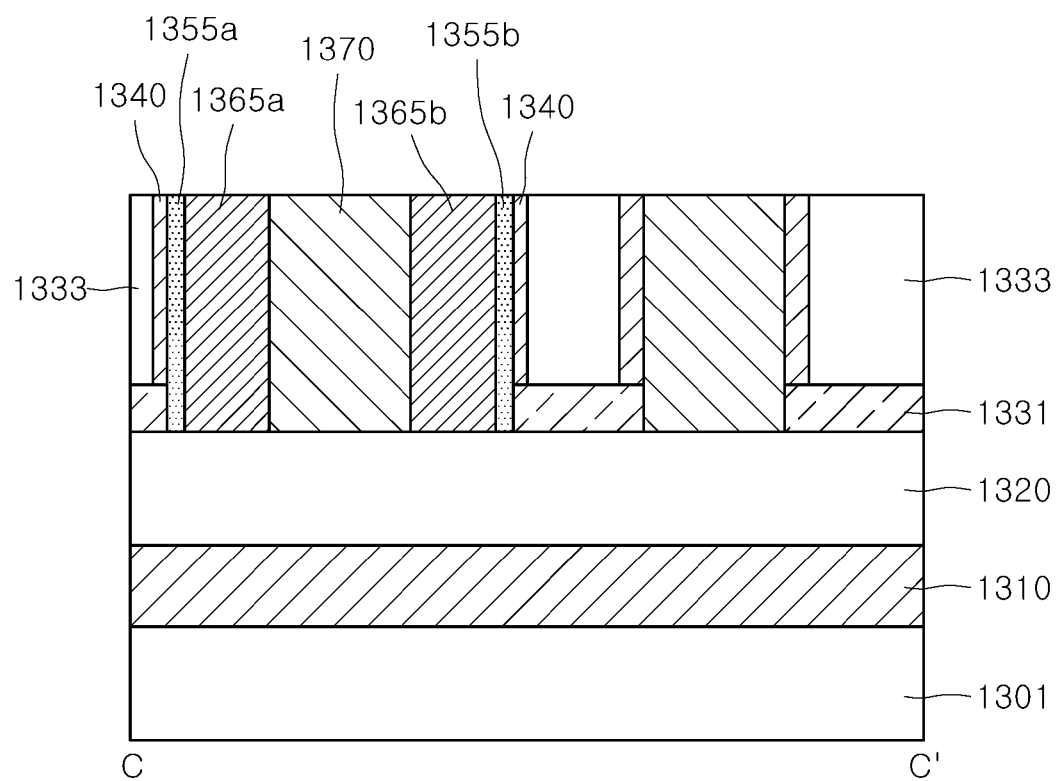

Referring to FIGS. 22A and 22B, the dielectric material layer 1350 and the channel material layer 1360 in the plurality of first and second trench line patterns TR1 and TR2 may be selectively removed so that only portions inside the protruding portions P remain. The remaining portions form first and second gate dielectric layers 1355*a* and 1355*b*, and first and second channel structures 1365*a* and 1365*b* inside the protruding portions P. As a result, each of the first and second gate dielectric layers 1355*a* and 1355*b*, and each of the first and second channel structures 1365*a* and 1365*b* may be disposed discontinuously over the base insulation layer 1310 along the second lateral direction (i.e., y-direction). A portion of each of the first and second gate dielectric layers 1355*a* and 1355*b*, and a portion of each of the first and second channel structures 1365*a* and 1365*b* may be formed to contact the bit line conductive layers 1320. Subsequently, an insulation material disposed in the space from which the dielectric material layer 1350 and the channel material layer 1360 are removed may form insulation line structures 1370.

By performing the above-described processes, it is possible to fabricate a semiconductor device including a plurality of channel structures according to embodiments of the present disclosure. Next, a capacitor device may be formed over the plurality of channel structures by additionally performing processes illustrated in FIGS. 23A, 23B, 24A, and 24B.

Figure 23A:
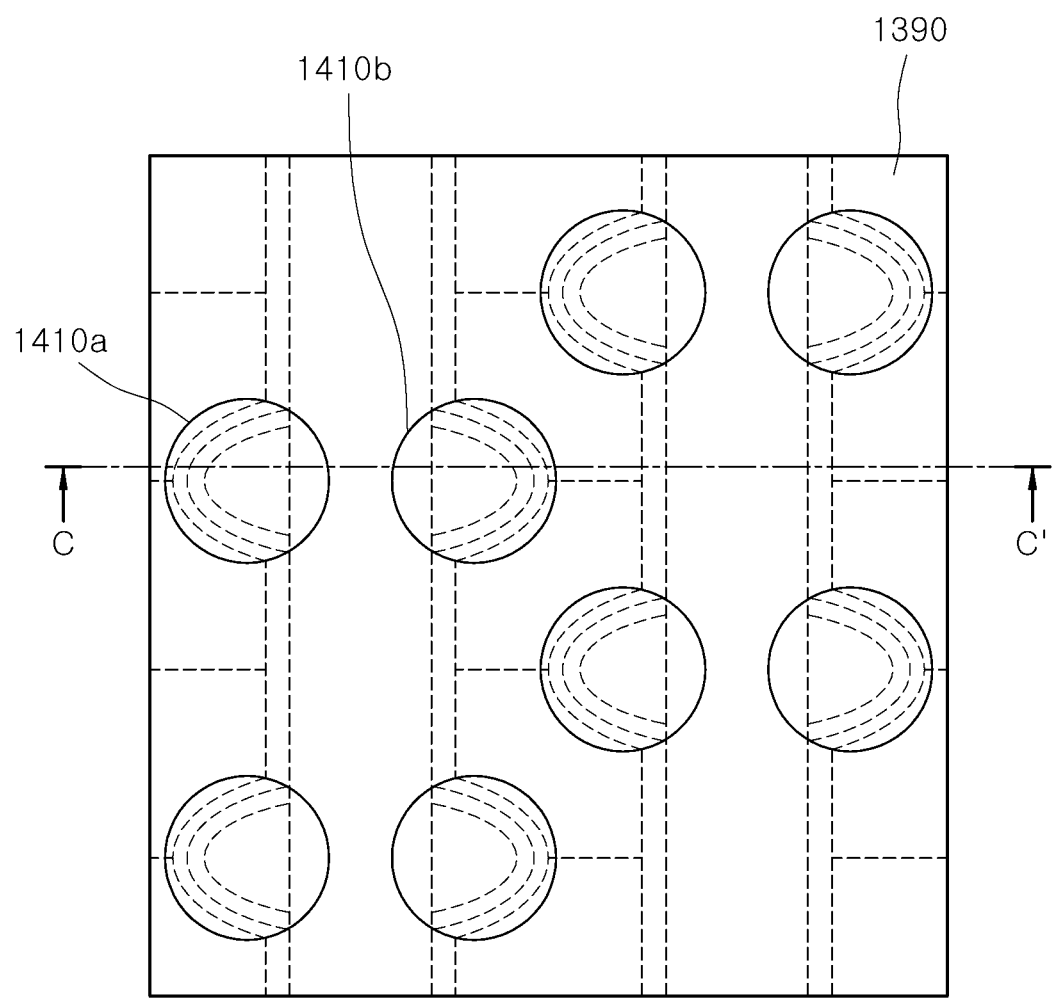
Figure 23B:
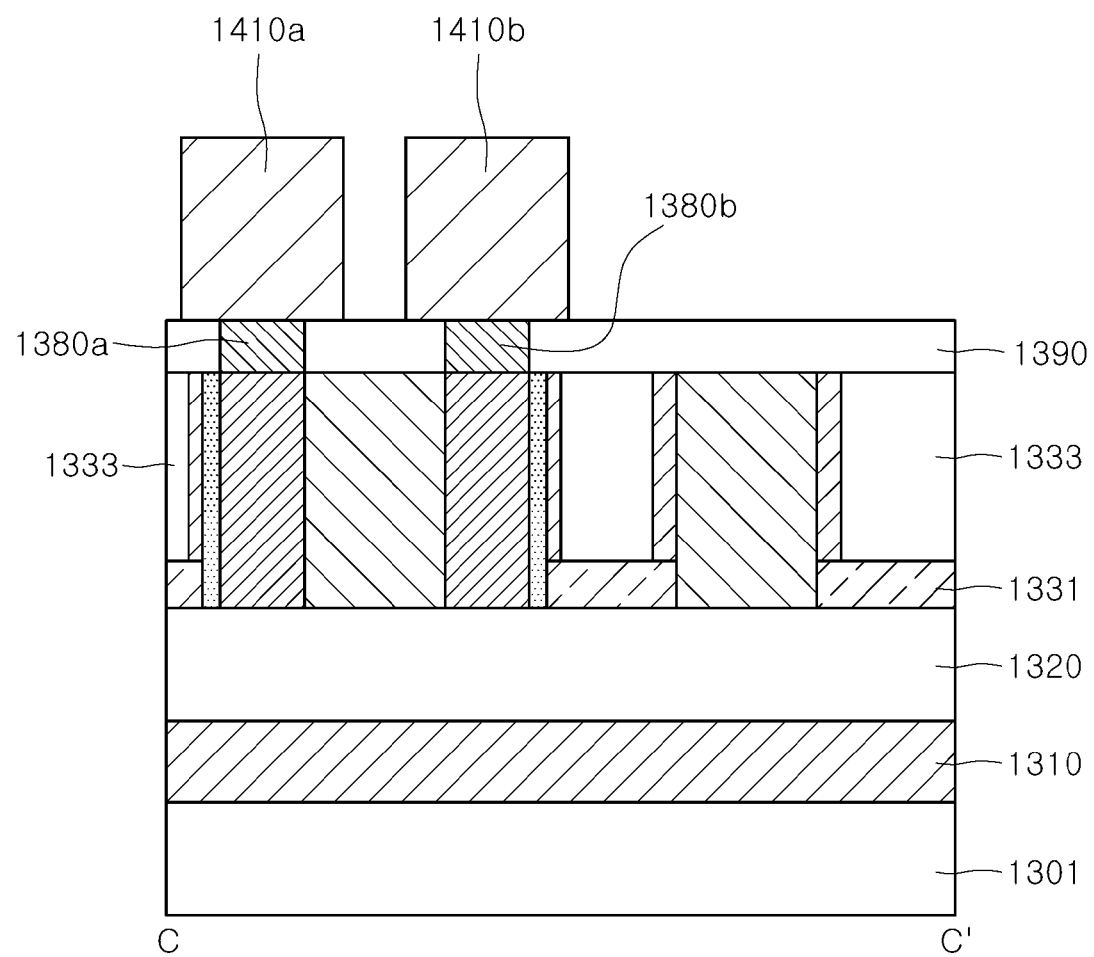

Referring to FIGS. 23A and 23B, first and second contact plugs 1380*a* and 1380*b* may be formed on the first and second channel structures 1365*a* and 1365*b*. The first and second contact plugs 1380*a* and 1380*b* may be electrically connected to the first and second channel structures 1365*a* and 1365*b*, respectively. The first and second contact plugs 1380*a* and 1380*b* may be made of substantially the same material as the first and second contact plugs 1180*a* and 1180*b* of the semiconductor device 4 described above in connection with FIGS. 17A and 17B. In addition, an insulation layer 1390 may be formed in a lateral direction of the first and second contact plugs 1380*a* and 1380*b*. The insulation layer 1390 may be made of or include, for example, oxide, nitride, oxynitride, or a combination of two or more thereof.

Next, first and second storage node electrode layers 1410a and 1410b may be formed on the first and second contact plugs 1380a and 1380b, respectively. The first and second storage node electrode layers 1410a and 1410b may be made of substantially the same material as the first and second storage node electrode layers 1210a and 1210b of the semiconductor device 4 described above in connection with FIGS. 17A and 17B.

Figure 24A:
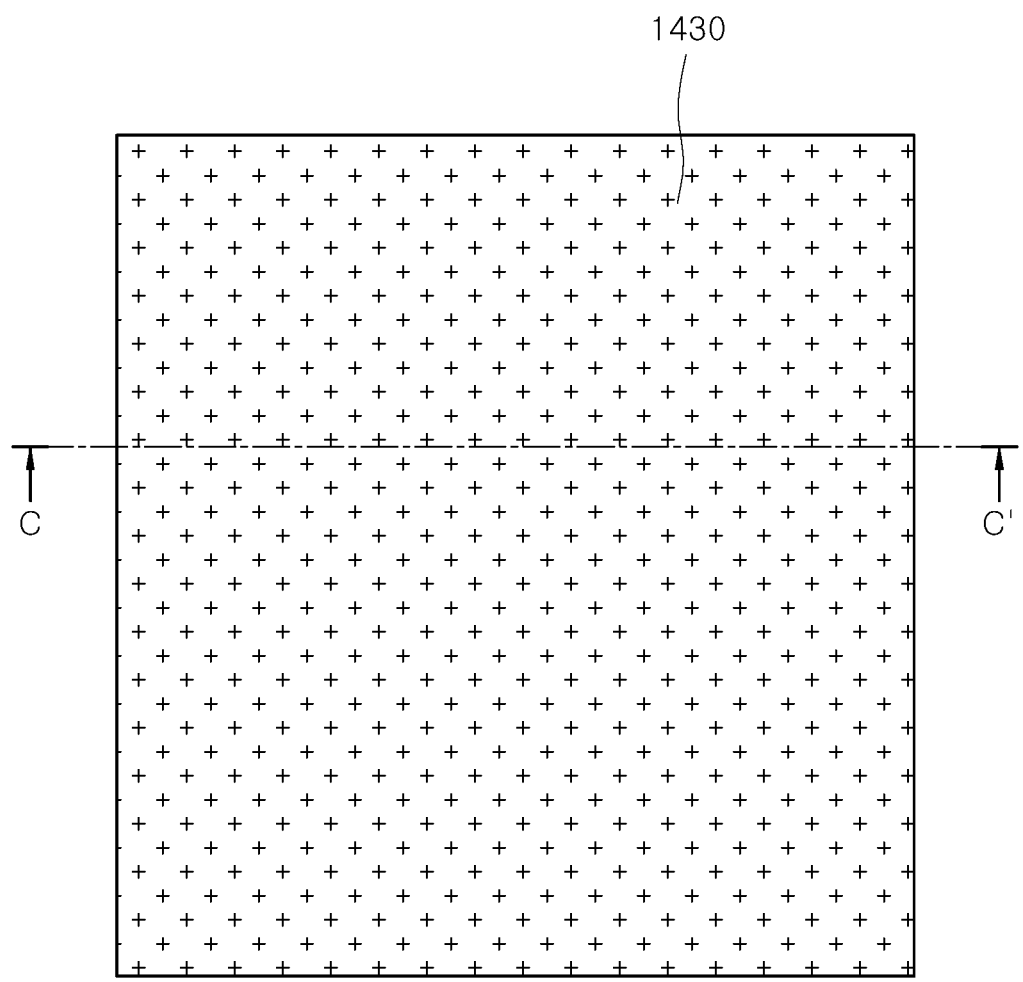
Figure 24B:
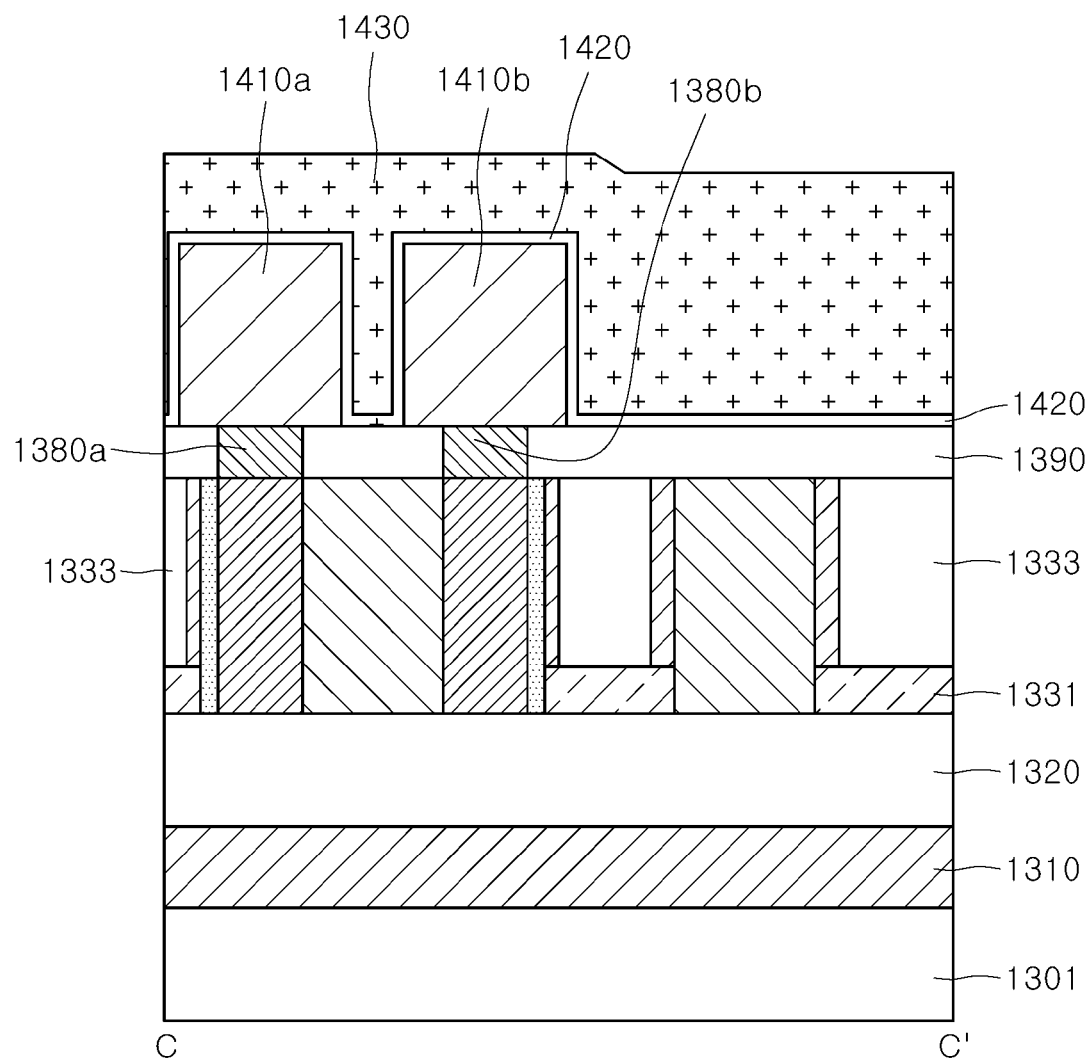

Referring to FIGS. 24A and 24B, a capacitor dielectric layer 1420 may be formed on the first and second storage node electrode layers 1410a and 1410b. The capacitor dielectric layer 1420 may be formed to cover the first and second storage node electrode layers 1410a and 1410b on the insulation layer 1390. The capacitor dielectric layer 1420 may be made of or include, for example, metal oxide such as aluminum oxide, hafnium oxide, zirconium oxide, and the like. Subsequently, a plate electrode layer 1430 may be formed on the capacitor dielectric layer 1420. The plate electrode layer 1430 may be made of or include a conductive material. Through the above-described processes, a semiconductor device 4 including a channel structure and a capacitor device illustrated in FIGS. 17A and 17B can be fabricated.

Figure 25A:
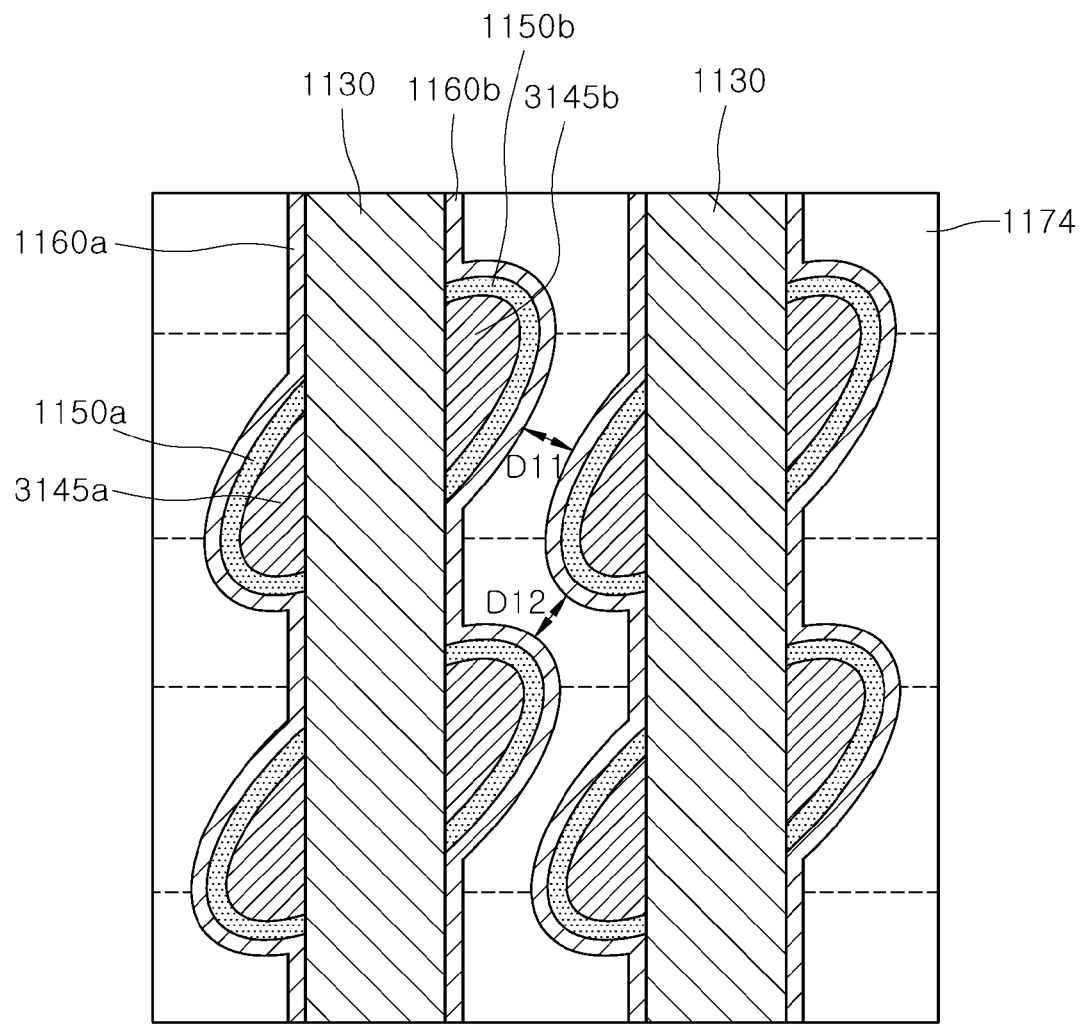
FIGS. 25A and 25B are plan views schematically illustrating semiconductor devices according to further embodiments of the present disclosure.
Figure 25B:
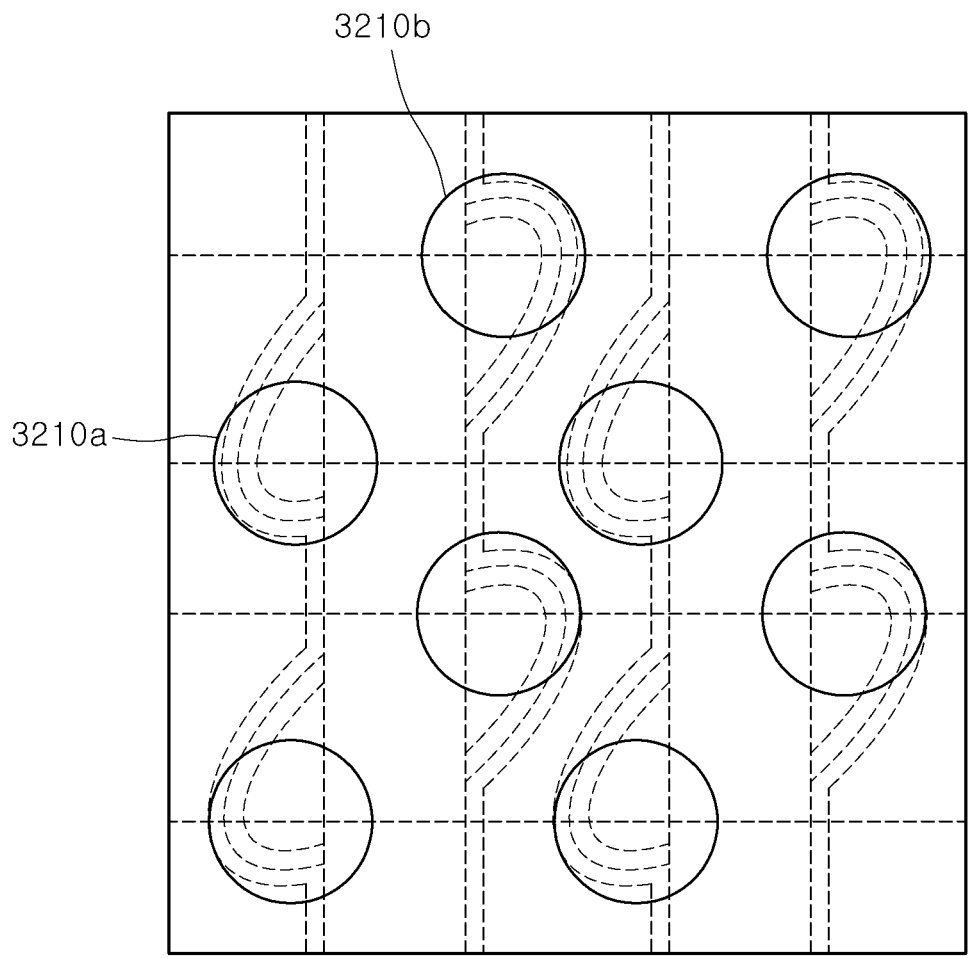

FIGS. 25A and 25B are plan views schematically illustrating semiconductor devices according to further embodiments of the present disclosure. FIG. 25A illustrates a semiconductor device 5 including a channel structure, and FIG. 25B illustrates a semiconductor device 6 including a channel structure and a capacitor device. As an example, the semiconductor device 6 of FIG. 25B may further include a capacitor device disposed over the channel structure of FIG. 25A.

The semiconductor device 5 of FIG. 25A is different from a semiconductor device 3 of FIGS. 15A and 15B with respect to the shape of first and second channel structures 3145a and 3145b. While the first and second channel structures 1145a and 1145b of the semiconductor device 3 illustrated in FIG. 15A are disposed in symmetry to each other with respect to the insulation line structure 1130, in FIG. 25A, the first and second channel structures 3145a and 3145b of the semiconductor device 5 illustrated in FIG. 25A may be disposed asymmetrically with respect to the insulation line structure 1130. Portions of the first and second channel structures 3145a and 3145b may be disposed to face each other with the insulation line structure 1130 therebetween. In addition, however, the first and second channel structures 3145a and 3145b may be disposed in a zigzag pattern on both sides of the insulation line structure 1130 along the second lateral direction (i.e., y-direction). For example, the first and second channel structures 3145a and 3145b may have an elliptical shape divided by the insulation line structure 1130, in which the major axis of the elliptical shape is non-parallel to the first lateral direction (i.e., x-direction) and the second lateral direction (i.e., y-direction).

In addition, the first and second channel structures 3145a and 3145b facing each other on sides of the neighboring different insulation line structures 1130 may be disposed to be spaced apart from each other in a third lateral direction (i.e., D11 direction or D12 direction) that is non-parallel to the first lateral direction (i.e., x-direction) and the second lateral direction (i.e., y-direction).

The method of fabricating the semiconductor device 5 of FIG. 25A may be substantially the same as the method of fabricating the semiconductor device described above in connection with FIGS. 18A to 22A, and FIGS. 18B to 22B.

The semiconductor device 6 of FIG. 25B is different from a semiconductor device 4 of FIGS. 17A and 17B with respect to the shape or arrangement of first and second storage node electrode layers 3210a and 3210b. In the semiconductor device 4 of FIG. 17A, the first and second storage node electrode layers 1210a and 1210b are disposed to be spaced apart from each other in the first lateral direction (i.e., x-direction), whereas in the semiconductor device 6 of FIG. 25B, the first and second storage node electrode layers 3210a and 3210b may be disposed to be spaced apart from each other in the third lateral direction non-parallel to the first lateral direction (i.e., x-direction) and the second lateral direction (i.e., y-direction). Although not illustrated in FIG. 25B, a capacitor dielectric layer and a plate electrode layer may be sequentially disposed on the first and second storage node electrode layers 3210a and 3210b, thereby configuring a capacitor device.

The method of fabricating the semiconductor device 6 of FIG. 25B may be substantially the same as the method of fabricating the semiconductor device described above in connection with FIGS. 18A to 24A, and FIGS. 18B to 24B.

Figure 26A:
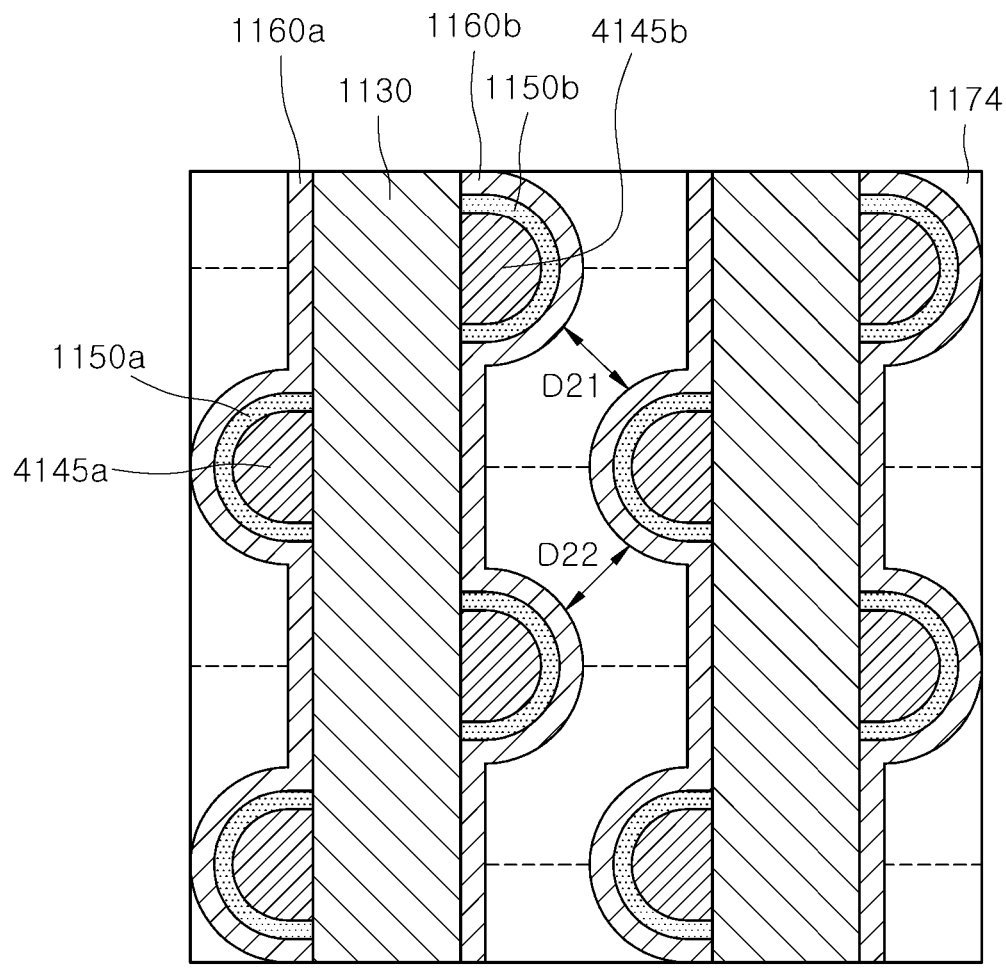
FIGS. 26A and 26B are plan views schematically illustrating semiconductor devices according to yet other embodiments of the present disclosure.
Figure 26B:
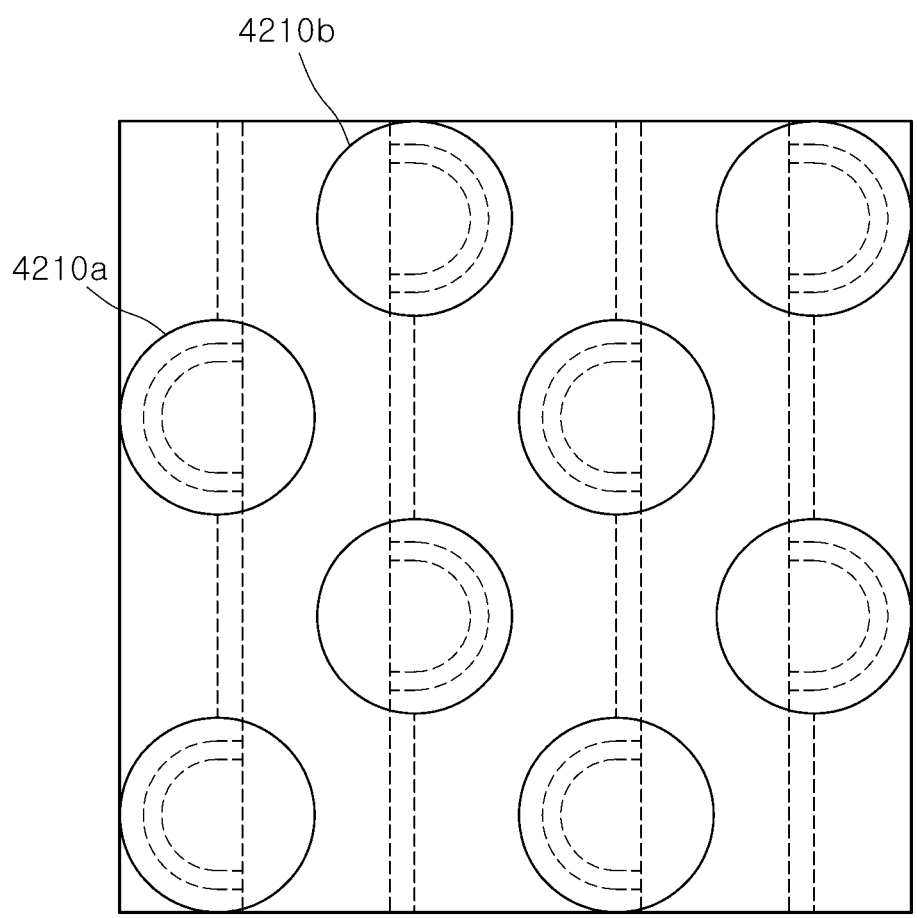

FIGS. 26A and 26B are plan views schematically illustrating semiconductor devices according to yet other embodiments of the present disclosure. FIG. 26A illustrates a semiconductor device 7 including a channel structure, and FIG. 26B illustrates a semiconductor device 8 including a channel structure and a capacitor device according to an embodiment. As an example, the semiconductor device 8 of FIG. 26B may further include a capacitor device disposed over the channel structure of FIG. 26A.

The semiconductor device 7 of FIG. 26B is different from a semiconductor device 3 of FIGS. 15A and 15B with respect to the shape of first and second channel structures 4145a and 4145b. The first and second channel structures 1145a and 1145b of the semiconductor device 3 illustrated in FIG. 15A are disposed symmetrically with respect to the insulation line structure 1130, whereas the first and second channel structures 4145a and 4145b of the semiconductor device 7 illustrated in FIG. 26A may be disposed asymmetrically with respect to the insulation line structure 1130. The first and second channel structures 4145a and 4145b may be disposed so as not to face each other across the insulation line structure 1130. In addition, the first and second channel structures 4145a and 4145b may be arranged in a zigzag shape or pattern, alternating on both sides of the insulation line structure 1130 along the second lateral direction (i.e., y-direction).

In addition, the first and second channel structures 4145a and 4145b facing each other on the sides of the neighboring different insulation line structures 1130 may be spaced apart from each other in a third lateral direction (i.e., D21 direction or D22 direction) that is non-parallel to the first lateral direction (i.e., x-direction) and the second lateral direction (i.e., y-direction).

The method of fabricating the semiconductor device 7 of FIG. 26A may be substantially the same as the method of fabricating the semiconductor device described above in connection with FIGS. 18A to 22A, and FIGS. 18B to 22B.

The semiconductor device 8 of FIG. 26B is different from the semiconductor device 4 of FIGS. 17A and 17B with respect to the shape or arrangement of first and second storage node electrode layers 4210a and 4210b. The first and second storage node electrode layers 1210a and 1210b in the semiconductor device 4 of FIGS. 17A and 17B are disposed to be spaced apart from each other in the first lateral direction (i.e., x-direction), whereas the first and second storage node electrode layers 4210a and 4210b in the semiconductor device 8 of FIG. 26B may be disposed to be spaced apart from each other in the third lateral direction that is non-parallel to the first lateral direction (i.e., x-direction) and the second lateral direction (i.e., y-direction).

The method of fabricating the semiconductor device 8 of FIG. 26B may be substantially the same as the method of fabricating the semiconductor device described above in connection with FIGS. 18A to 24A, and FIGS. 18B to 24B.

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor device comprising:
   a substrate;
   a plurality of bit line conductive layers disposed over the substrate and extending in a first lateral direction substantially parallel to a surface of the substrate, the plurality of bit line conductive layers arranged in a second lateral direction substantially perpendicular to the first lateral direction and that is substantially parallel to the surface of the substrate;
   a first channel structure and a second channel structure disposed on a first bit line conductive layer of the plurality of bit line conductive layers to be spaced apart from each other in the first lateral direction;
   a first gate dielectric layer and a second gate dielectric layer disposed on side surfaces of the first channel structure and the second channel structure over the substrate, respectively;
   a first gate line conductive layer and a second gate line conductive layer disposed on the first gate dielectric layer and the second gate dielectric layer, respectively, the first gate line conductive layer and the second gate line conductive layer extending in the second lateral direction; and
   a first storage node electrode layer and a second storage node electrode layer disposed over the first channel structure and the second channel structure, respectively,
   wherein the first storage node electrode layer and the second storage node electrode layer are disposed to be spaced apart from each other in a third lateral direction that is not parallel to each of the first and second lateral directions and that is substantially parallel to the surface of the substrate,
   wherein the semiconductor device further comprises:
   a third channel structure and a fourth channel structure disposed on a second bit line conductive layer next to the first bit line conductive layer of the plurality of bit line conductive layers, the third channel structure spaced apart from the first channel structure in the second lateral direction and the fourth channel structure spaced apart from the second channel structure in the second lateral direction; and
   a third storage node electrode layer and a fourth storage node electrode layer disposed over the third channel structure and the fourth channel structure, respectively, wherein the first gate dielectric layer continuously extends in the second lateral direction to cover both the first channel structure and the third channel structure, and the second gate dielectric layer continuously extends in the second lateral direction to cover both the second channel structure and the fourth channel structure.

2. The semiconductor device of claim 1, wherein each of the first channel structure and the second channel structure has a pillar shape extending over the substrate in a direction perpendicular to the first and second lateral directions.

3. The semiconductor device of claim 1, wherein the first channel structure has a first channel first side and a first channel second side that are parallel to the second lateral direction,
   wherein the first gate line conductive layer has a first gate first line pattern common to the first channel first side, and a first gate second line pattern common to the first channel second side, and
   wherein the first gate first line pattern and the first gate second line pattern are configured to have the same electric potential.

4. The semiconductor device of claim 3, wherein the first gate dielectric layer has a first thickness in the first lateral direction between the first gate first line pattern and the first channel first side,
   wherein the first gate dielectric layer has a second thickness in the first lateral direction between the first gate second line pattern and the first channel second side, and
   wherein the first thickness and the second thickness are the same.

5. The semiconductor device of claim 1, wherein the second channel structure has a second channel first side and a second channel second side that are parallel to the second lateral direction,
   wherein the second gate line conductive layer has a second gate first line pattern common to the second channel first side, and a second gate second line pattern common to the second channel second side, and
   wherein the second gate first line pattern and the second gate second line pattern are configured to have the same electric potential.

6. The semiconductor device of claim 5, wherein the second gate dielectric layer has a third thickness in the first lateral direction between the second gate first line pattern and the second channel first side,
   wherein the second gate dielectric layer has a fourth thickness in the first lateral direction between the second gate second line pattern and the second channel second side, and
   wherein the third thickness and the fourth thickness are the same.

7. The semiconductor device of claim 1, further comprising:
   capacitor dielectric layers disposed on the first storage node electrode layer and the second storage node electrode layer; and
   plate electrode layers disposed on the capacitor dielectric layers.

* * * * *